US009263113B2

(12) United States Patent
Matsuda et al.

(10) Patent No.: US 9,263,113 B2
(45) Date of Patent: Feb. 16, 2016

(54) SEMICONDUCTOR MEMORY DEVICE WITH MEMORY ARRAY AND DUMMY MEMORY ARRAY

(71) Applicant: RENESAS ELECTRONICS CORPORATION, Kawasaki-shi, Kanagawa (JP)

(72) Inventors: Ryoji Matsuda, Kanagawa (JP); Motoi Ashida, Kanagawa (JP); Yasumitsu Murai, Itami (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 238 days.

(21) Appl. No.: 13/913,363

(22) Filed: Jun. 7, 2013

(65) Prior Publication Data

US 2013/0343113 A1  Dec. 26, 2013

(30) Foreign Application Priority Data

Jun. 7, 2012  (JP) .................................. 2012-129919

(51) Int. Cl.
*G11C 11/16* (2006.01)
(52) U.S. Cl.
CPC .......... *G11C 11/161* (2013.01); *G11C 11/1675* (2013.01)
(58) Field of Classification Search
None
See application file for complete search history.

(56) References Cited

U.S. PATENT DOCUMENTS

| 5,894,447 | A * | 4/1999 | Takashima .................... 365/158 |
| 6,466,475 | B1 * | 10/2002 | Nickel ........................ 365/158 |
| 6,788,569 | B2 * | 9/2004 | Tanizaki et al. ................ 365/171 |
| 7,264,985 | B2 * | 9/2007 | Chung et al. .................... 438/48 |
| 7,596,014 | B2 * | 9/2009 | Kawahara et al. ............ 365/158 |
| 2010/0320521 | A1 | 12/2010 | Izumi |
| 2011/0228587 | A1 * | 9/2011 | Ito ................................ 365/148 |

FOREIGN PATENT DOCUMENTS

| JP | 2005-303156 A | 10/2005 |
| JP | 2011-003768 A | 1/2011 |

* cited by examiner

*Primary Examiner* — Harry W Byrne
*Assistant Examiner* — Lance Reidlinger
(74) *Attorney, Agent, or Firm* — McDermott Will & Emery LLP

(57) ABSTRACT

A semiconductor device in which noise is reduced without an increase in chip area. The device is used as an MRAM in which a memory mat is formed on a silicon substrate surface and the central area of the memory mat is used as a memory array and the area around the memory array is used as a dummy memory array. In the dummy memory array, a capacitor is formed between each bit line, each digit line and a supply voltage line, and a grounding voltage line. Therefore the peak value of a current flowing in each of the bit lines, digit lines and supply voltage line is decreased.

17 Claims, 47 Drawing Sheets

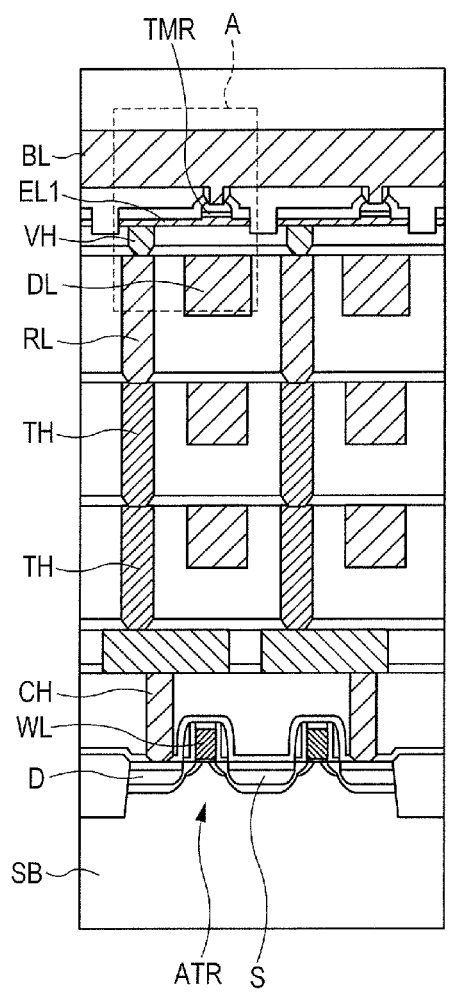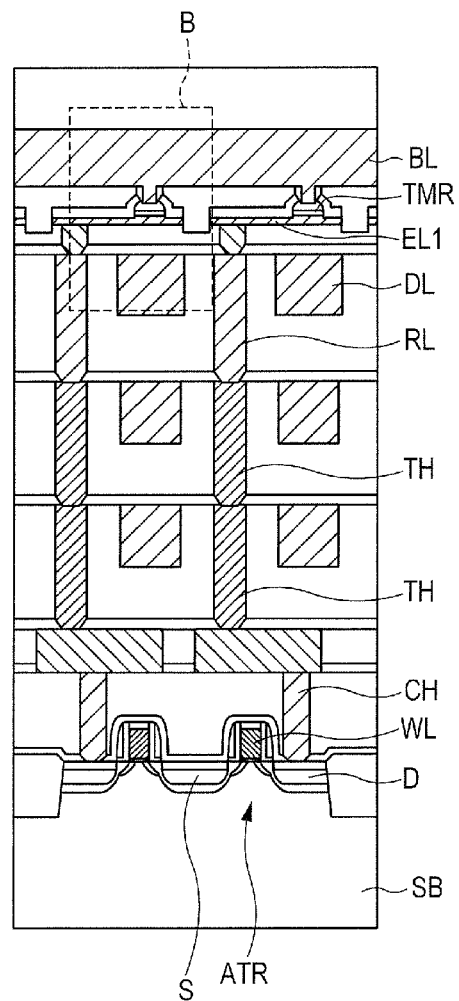
FIG. 11A  MEMORY ARRAY
FIG. 11B  DUMMY MEMORY ARRAY

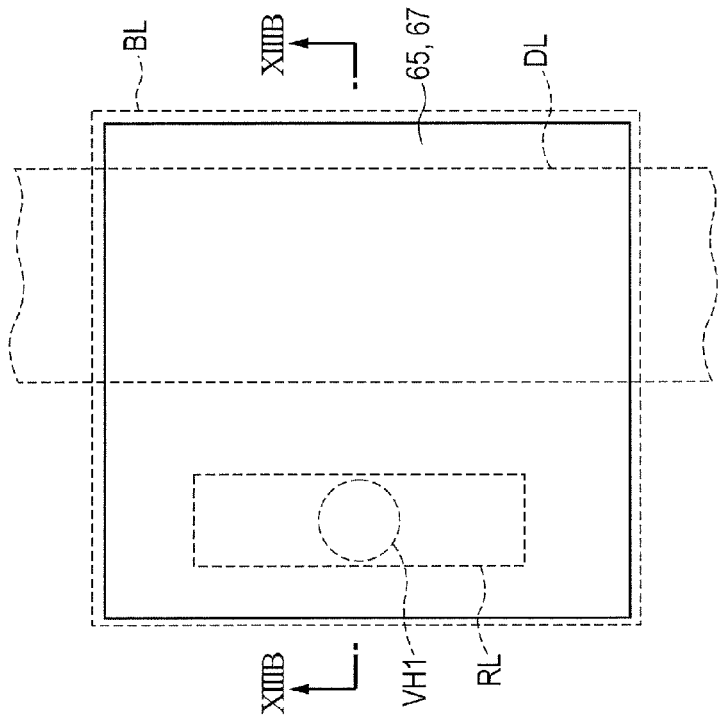
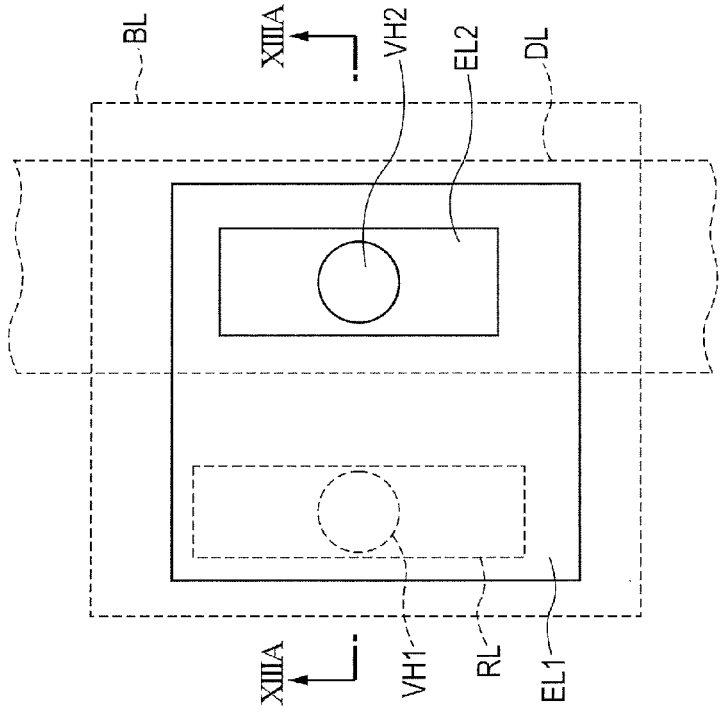

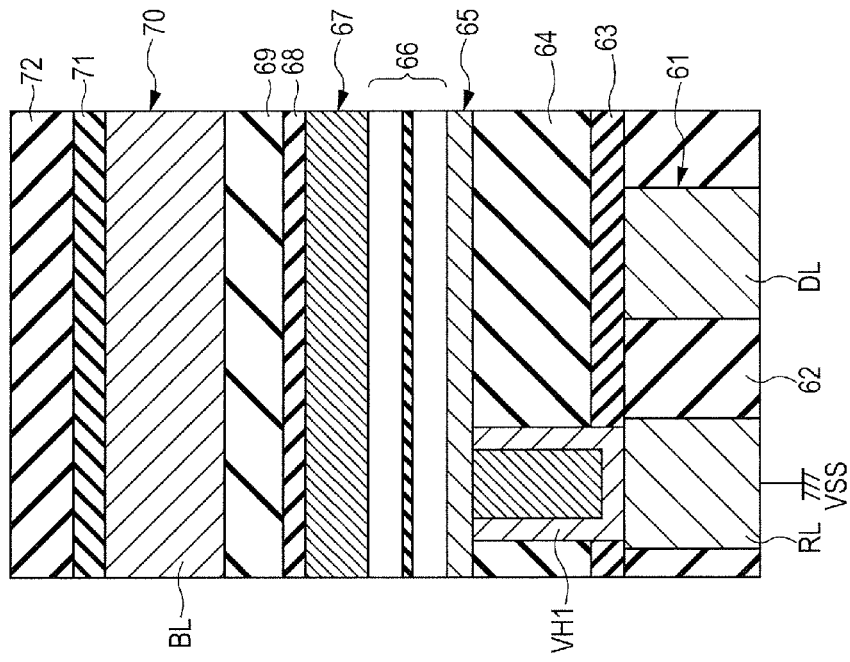
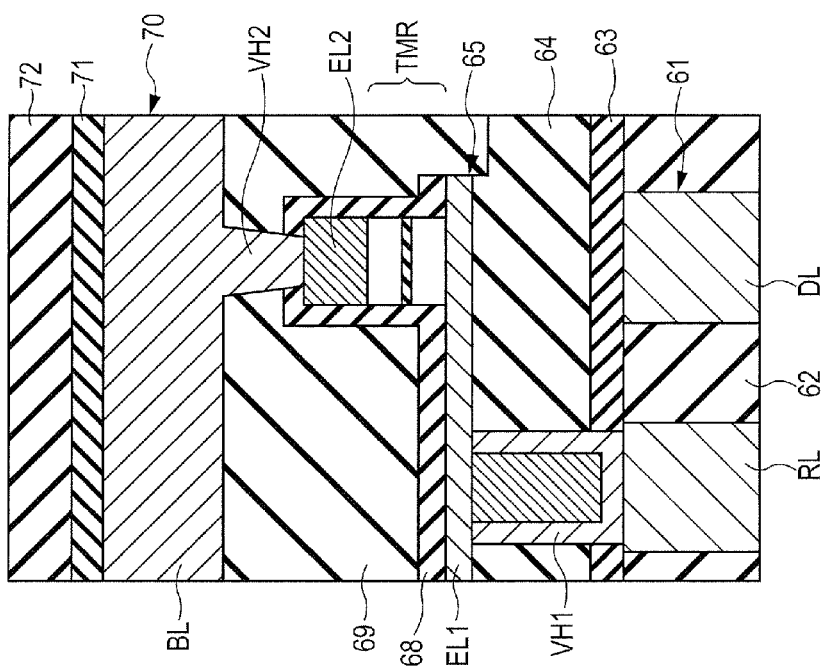

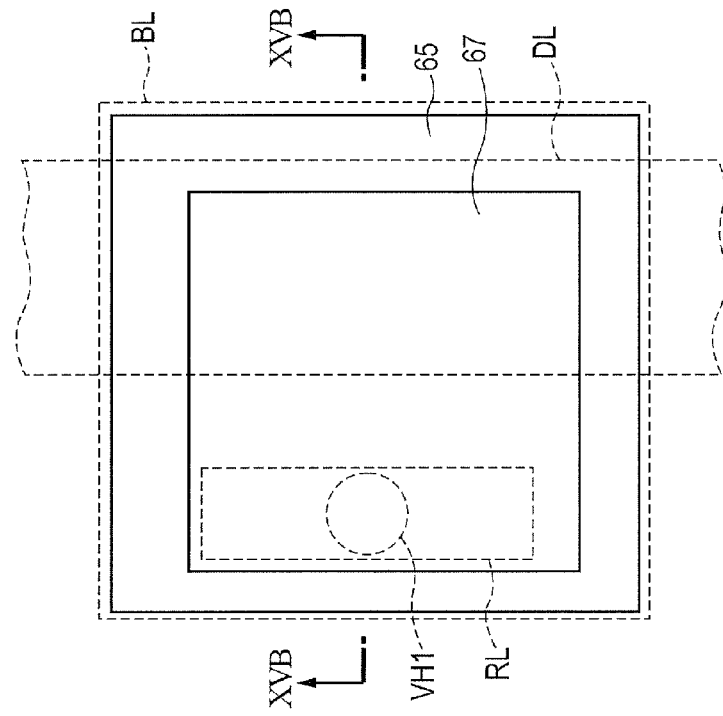
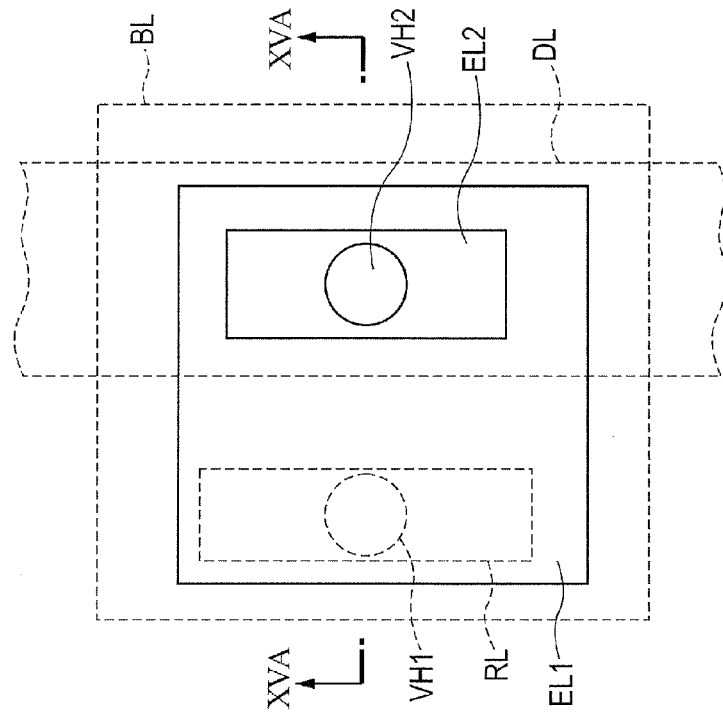

DUMMY MEMORY ARRAY

MEMORY ARRAY

DUMMY MEMORY ARRAY

MEMORY ARRAY

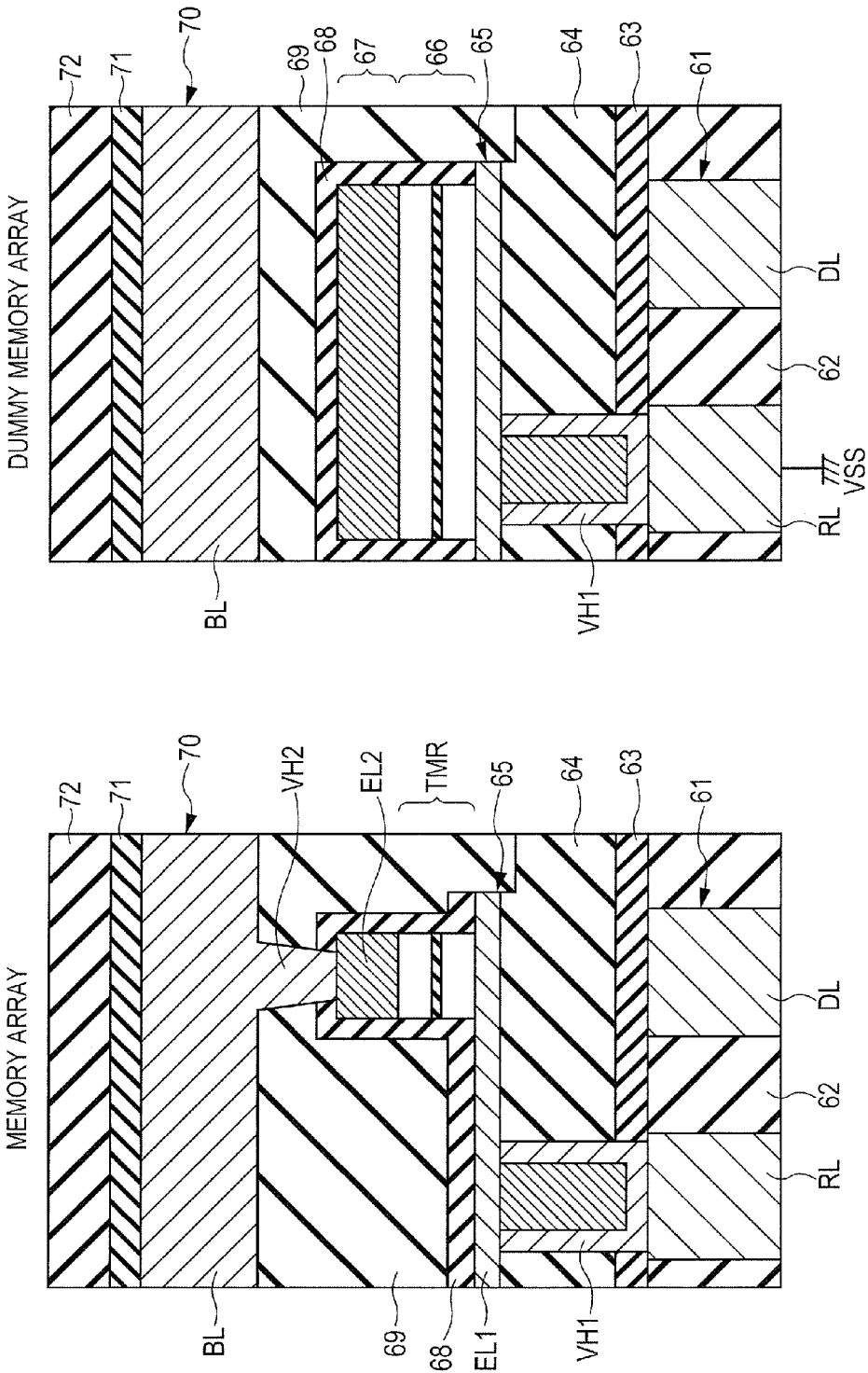

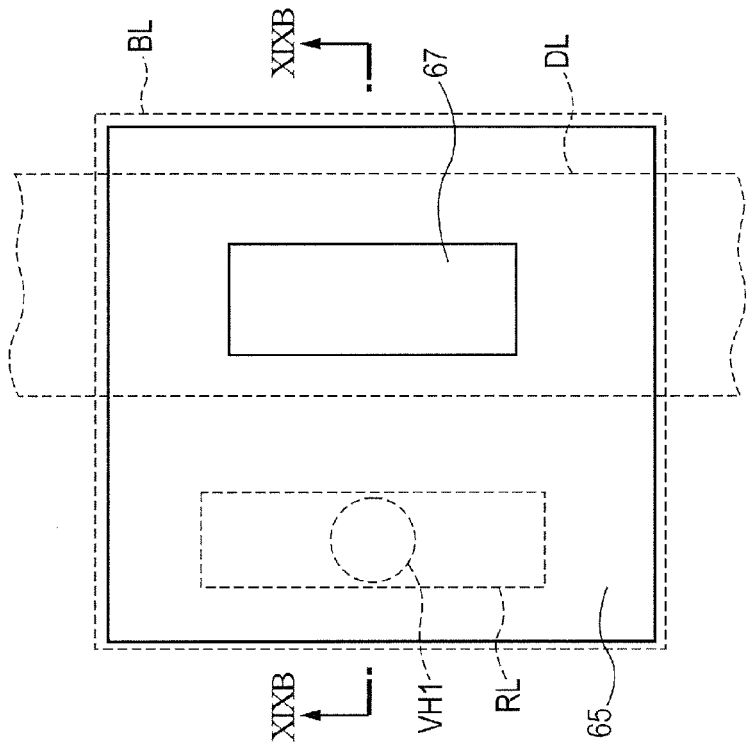
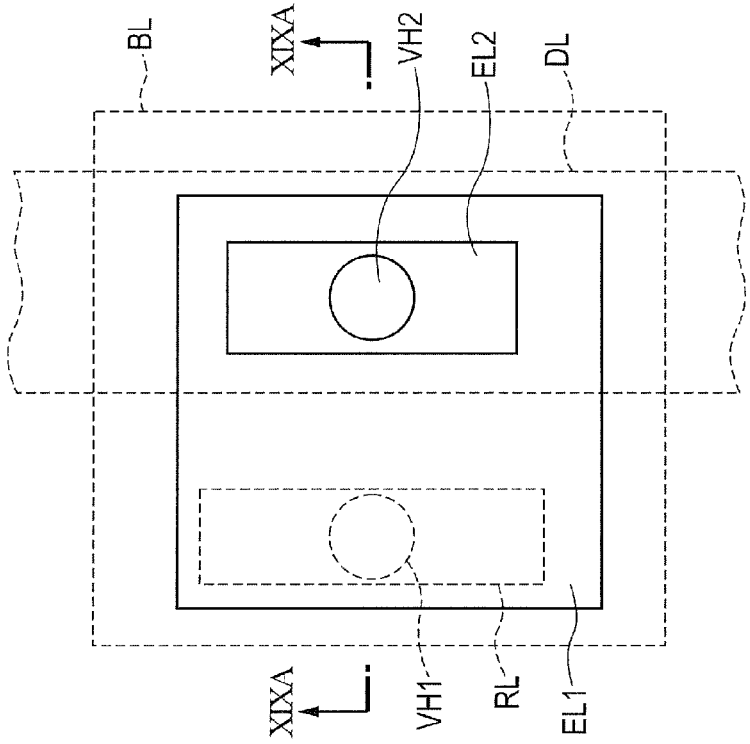

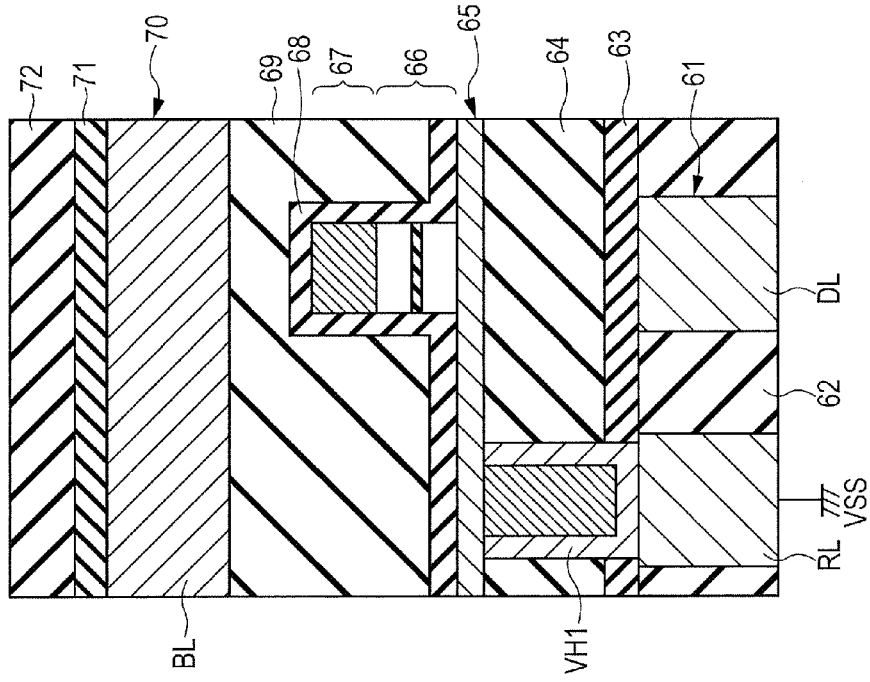
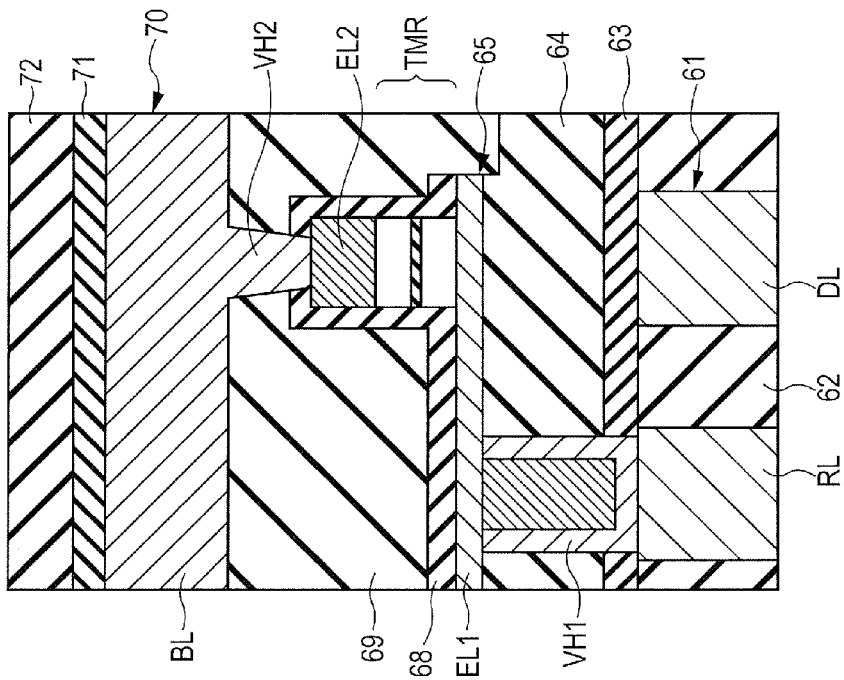

DUMMY MEMORY ARRAY

MEMORY ARRAY

MEMORY ARRAY

DUMMY MEMORY ARRAY

DUMMY MEMORY ARRAY

MEMORY ARRAY

DUMMY MEMORY ARRAY

MEMORY ARRAY

MEMORY ARRAY

DUMMY MEMORY ARRAY

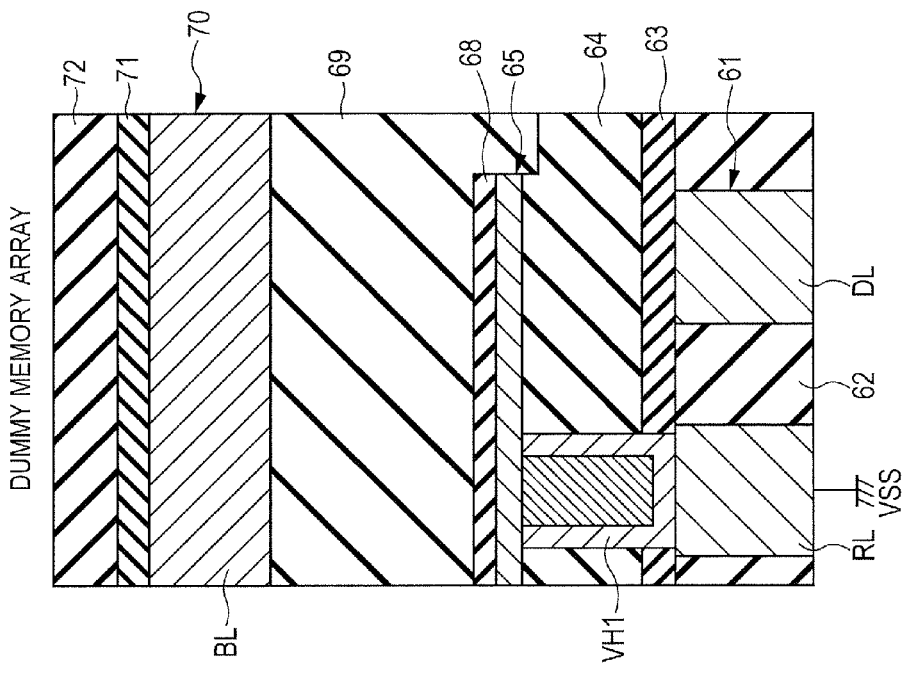
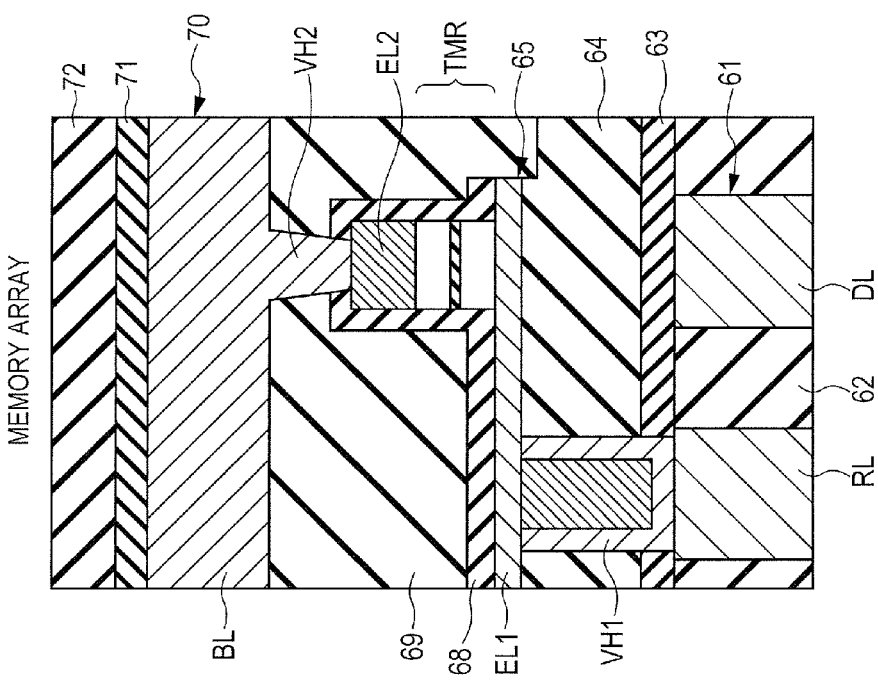

DUMMY MEMORY ARRAY

MEMORY ARRAY

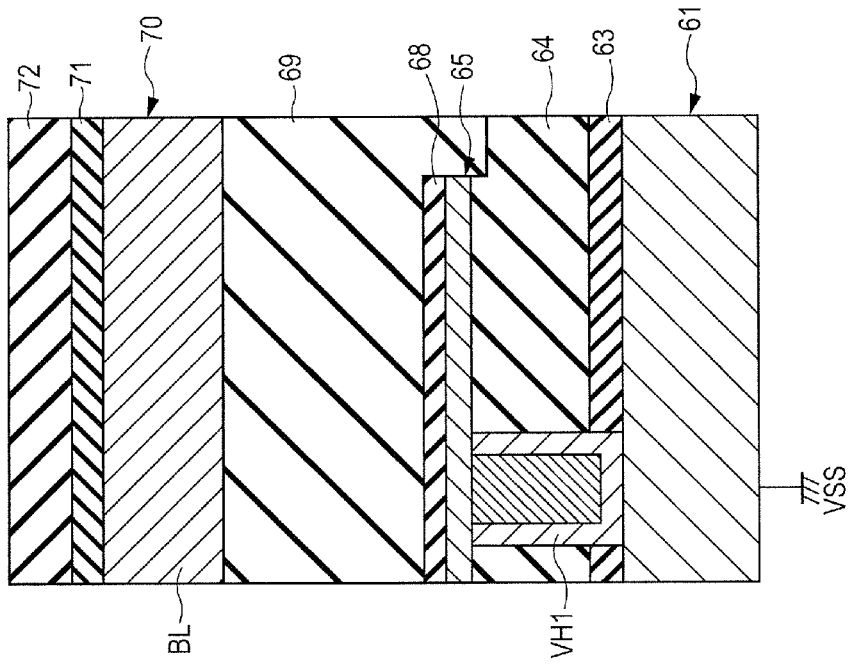
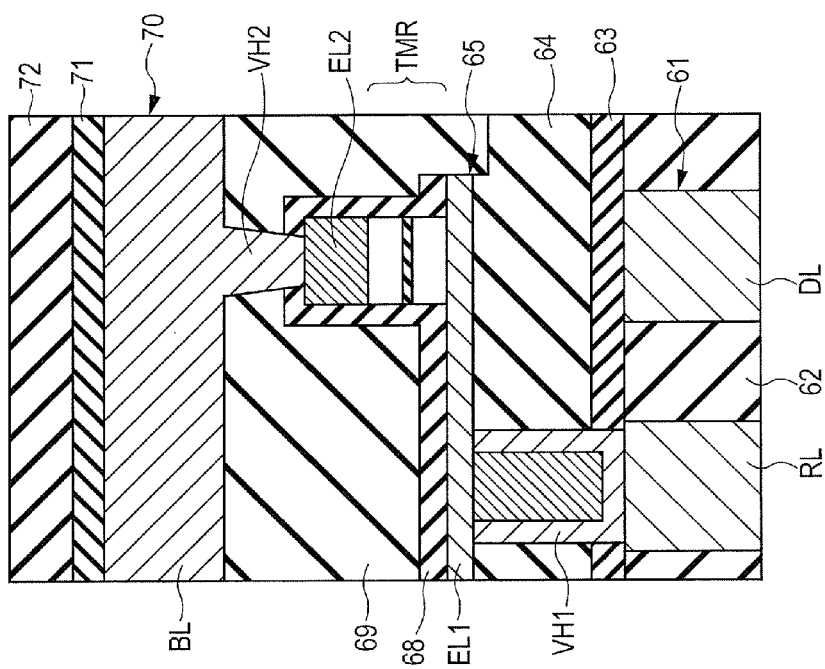

DUMMY MEMORY ARRAY

MEMORY ARRAY

DUMMY MEMORY ARRAY

MEMORY ARRAY

MEMORY ARRAY

DUMMY MEMORY ARRAY

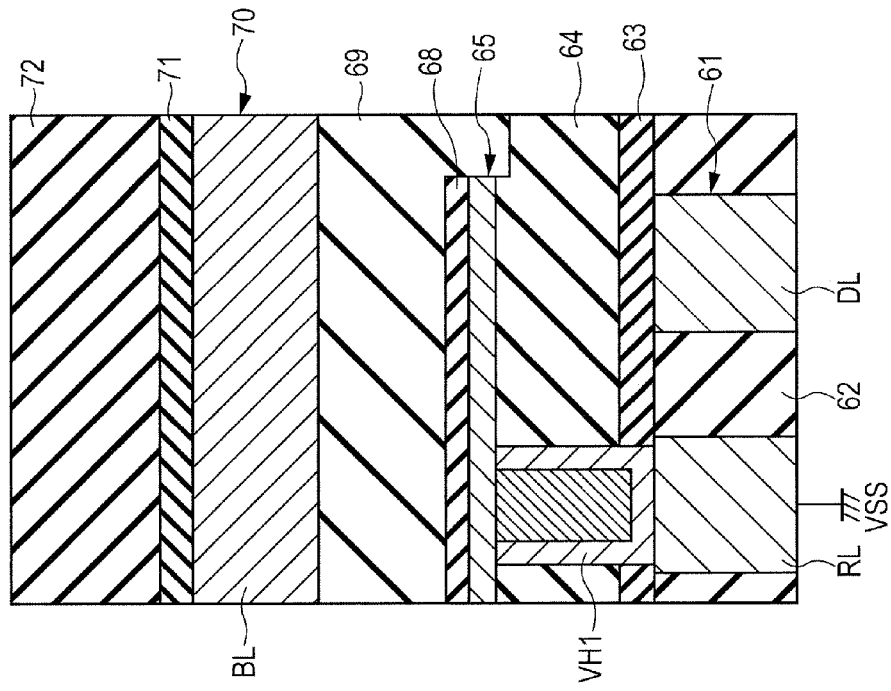
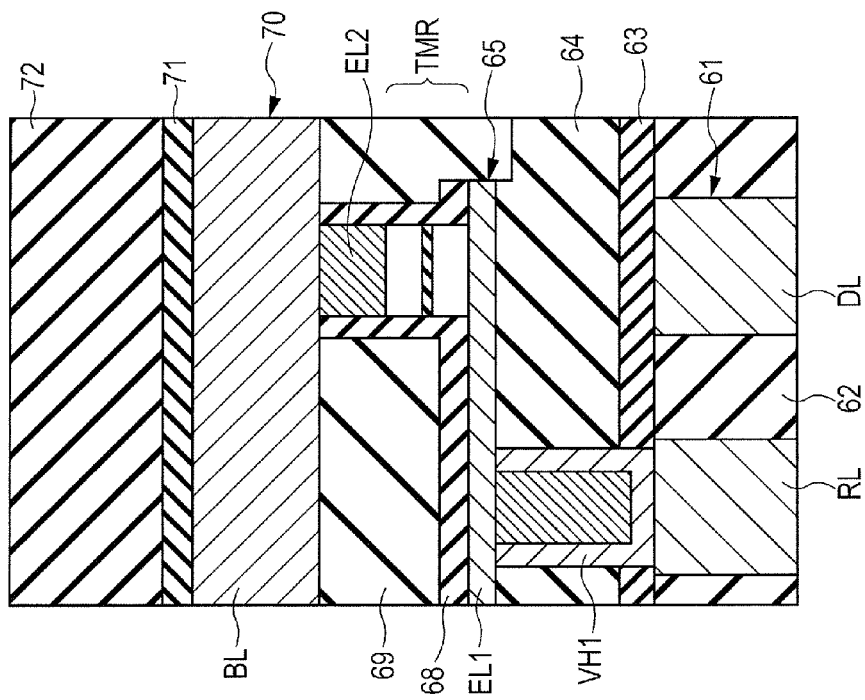

DUMMY MEMORY ARRAY

MEMORY ARRAY

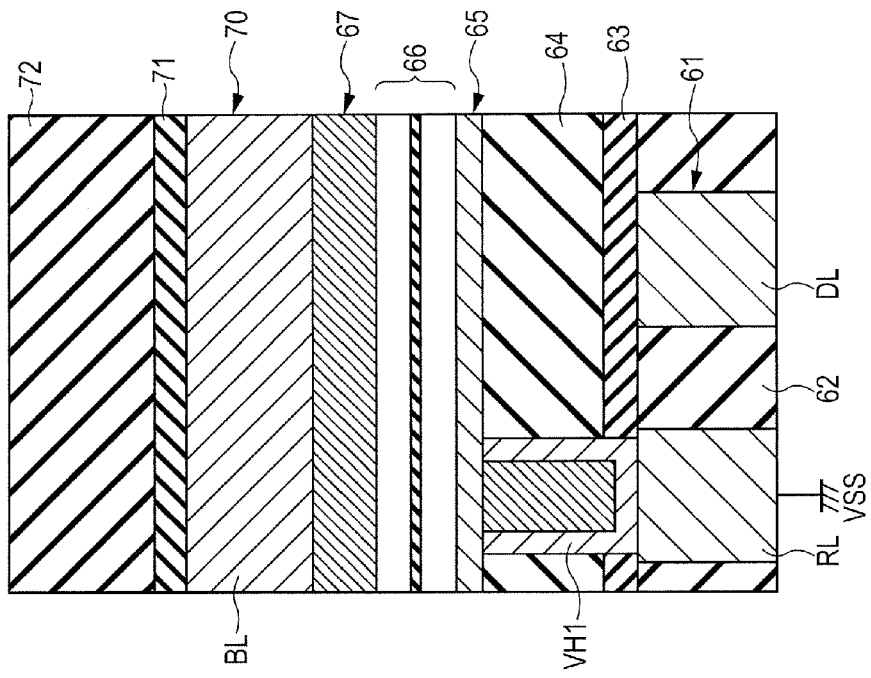
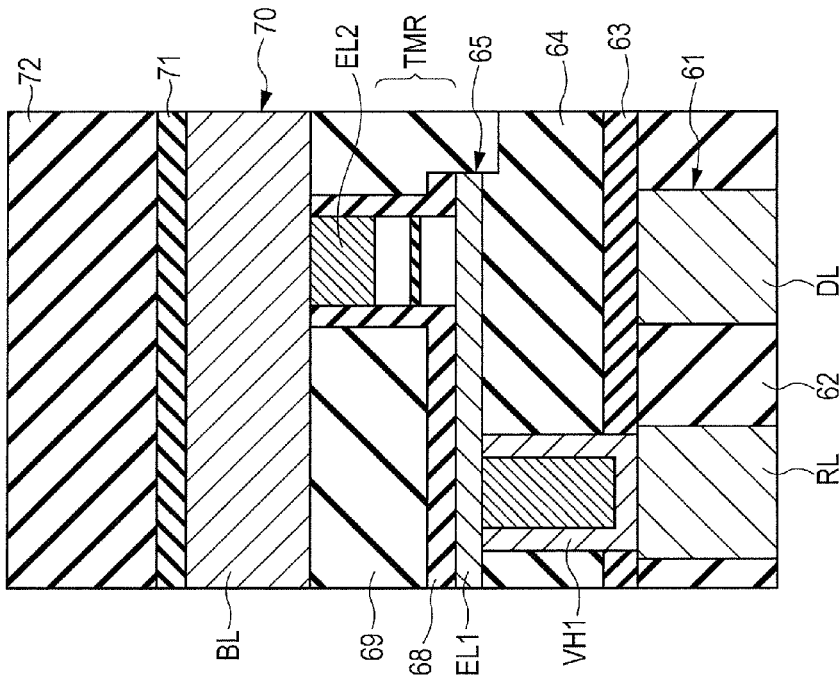

MEMORY ARRAY

DUMMY MEMORY ARRAY

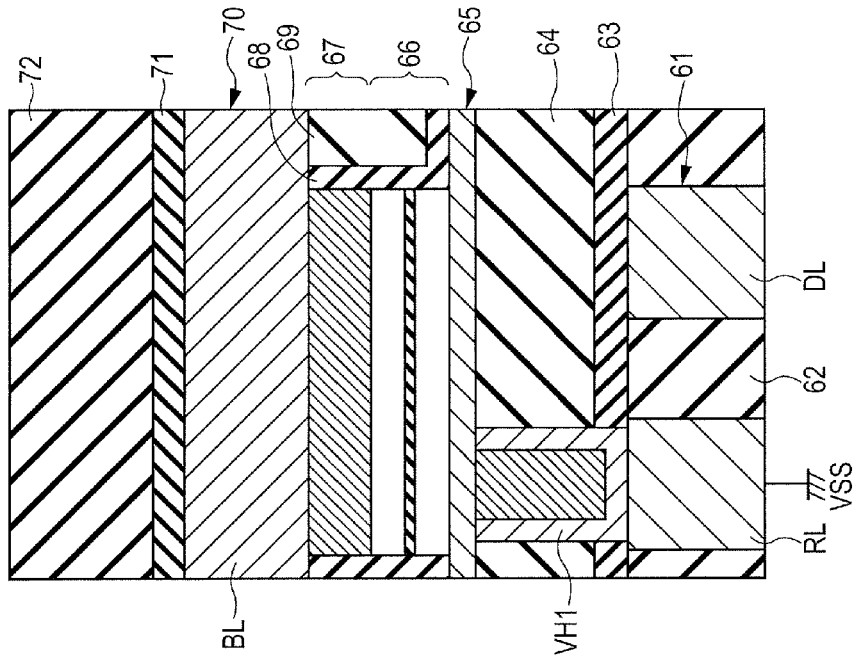
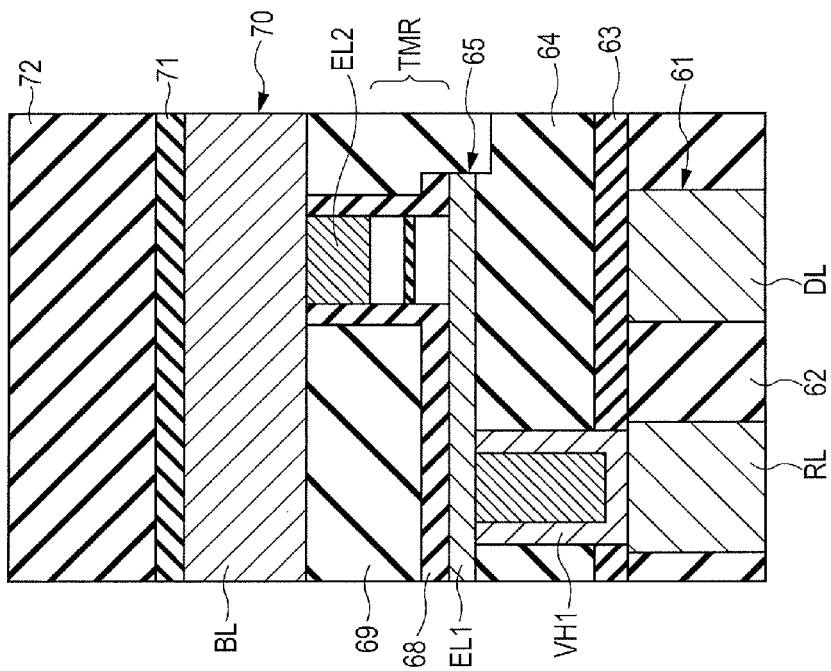

MEMORY ARRAY

DUMMY MEMORY ARRAY

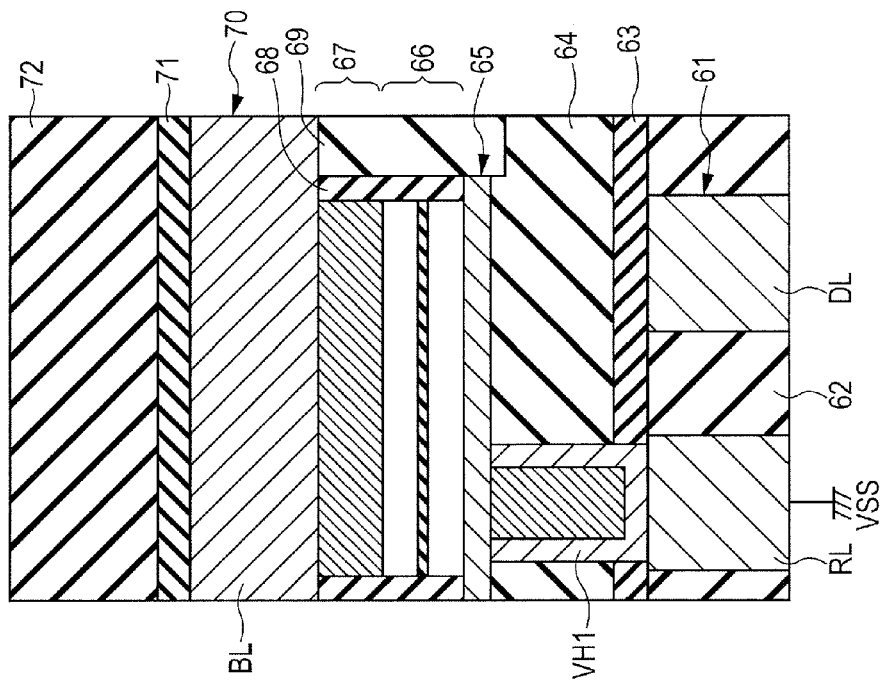
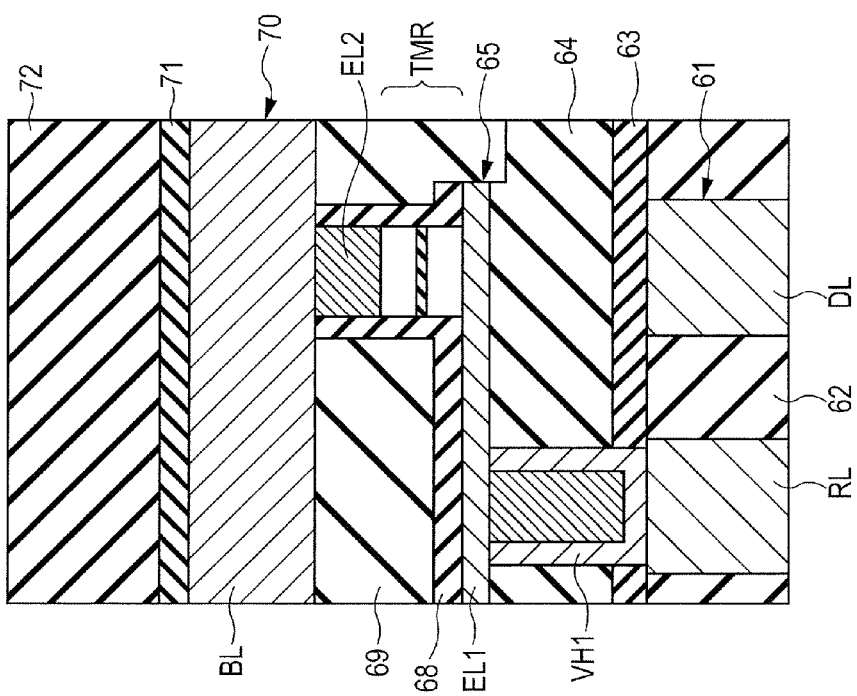

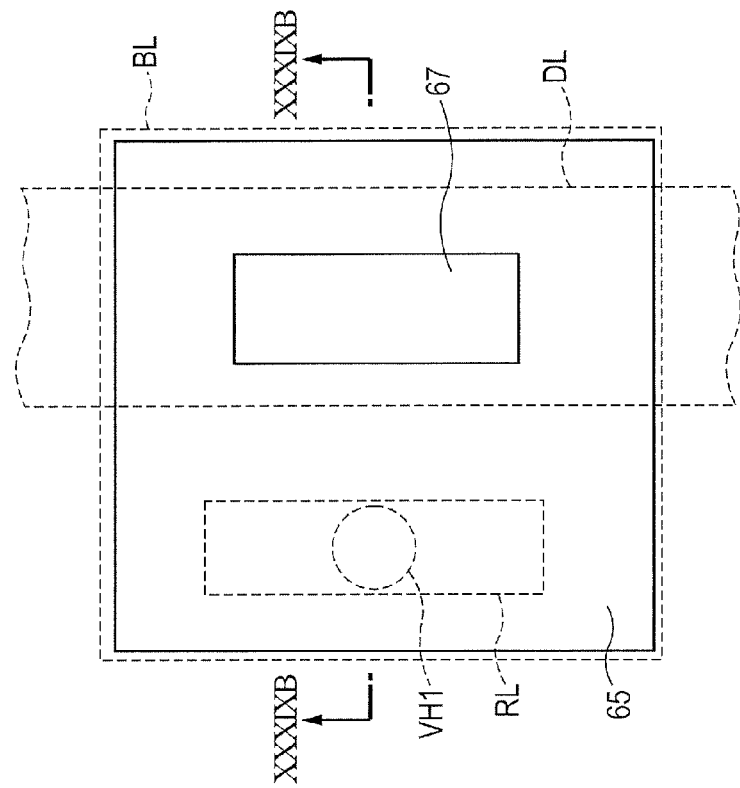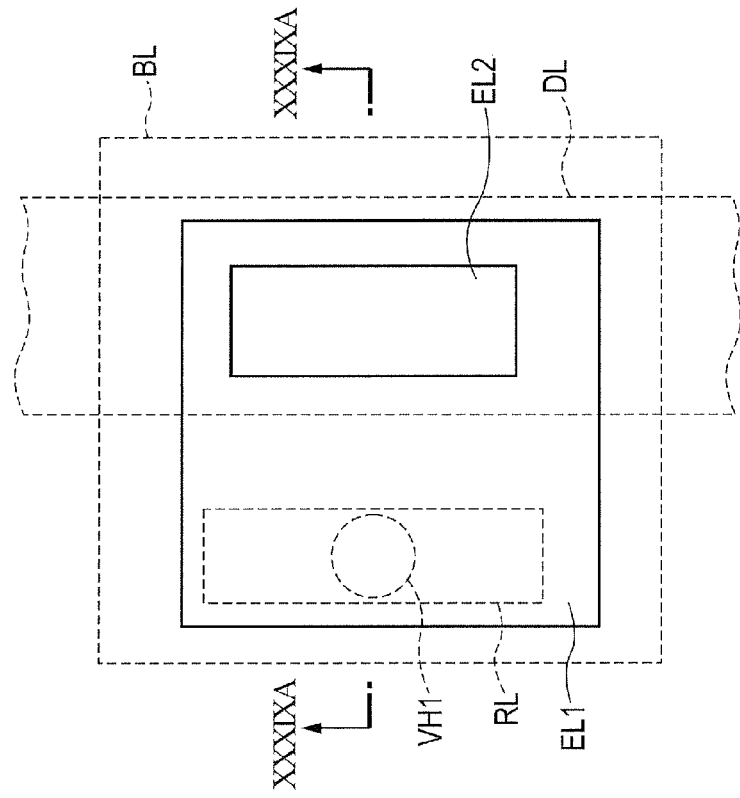

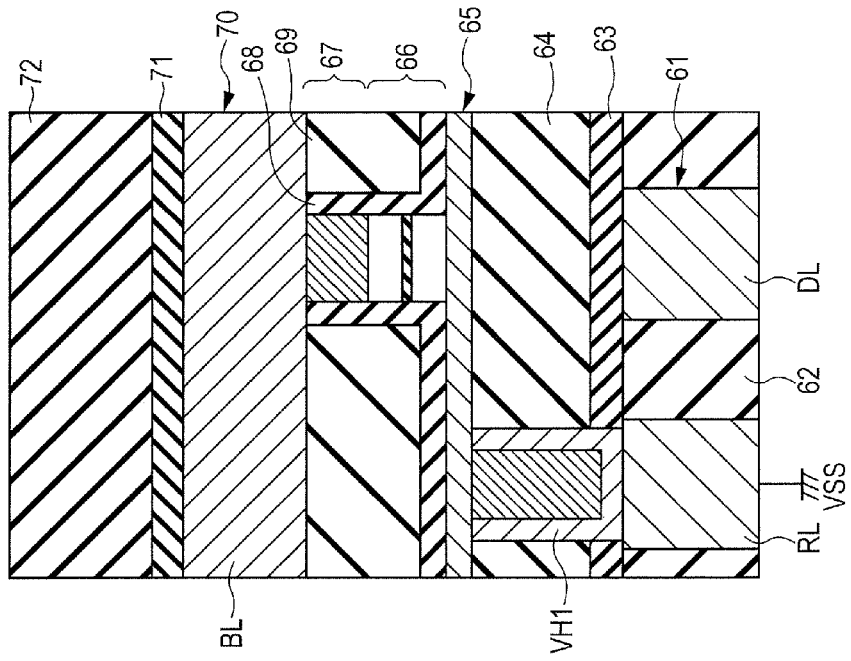
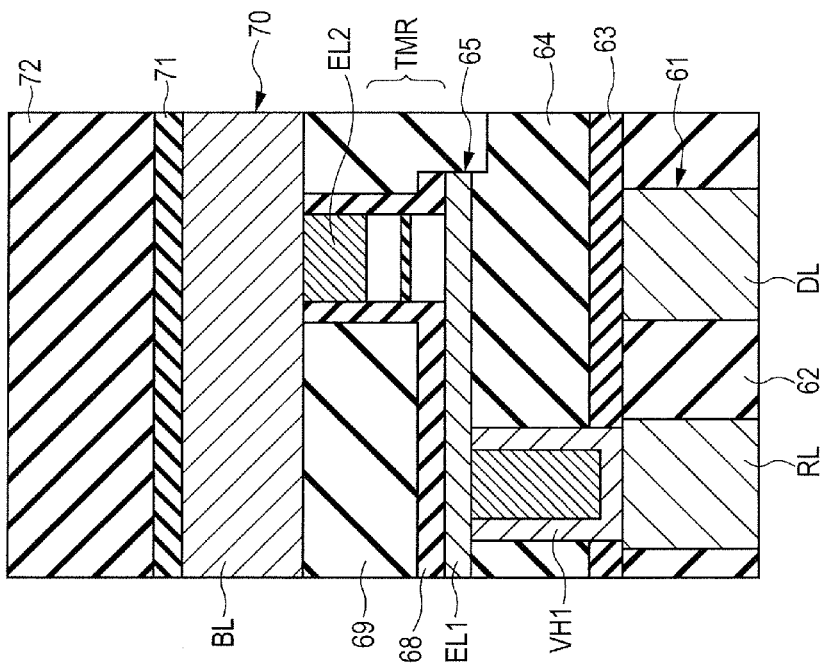

MEMORY ARRAY

DUMMY MEMORY ARRAY

MEMORY ARRAY

DUMMY MEMORY ARRAY

FIG. 50A

50MHz (20ns)

| C [nF] | R [Ω] | PEAK CURRENT [mA] | intVCC [V] | PEAK REDUCTION RATIO [%] |
|---|---|---|---|---|
| 1 | 3.5 | 85.7 | 3 | 33.0 |
| (0.444mm$^2$) | 5 | 71.03 | 2.945 | 44.5 |
| | 10 | 49.71 | 2.803 | 61.2 |
| 1.5 | 3.5 | 70.19 | 3.054 | 45.2 |
| (0.666mm$^2$) | 5 | 57.99 | 3.01 | 54.7 |
| | 10 | 42.92 | 2.871 | 66.5 |
| 2 | 3.5 | 60.59 | 3.088 | 52.7 |
| (0.888mm$^2$) | 5 | 50.91 | 3.046 | 60.2 |
| | 10 | 39.36 | 2.906 | 69.3 |

FIG. 50B

80MHz (12.5ns)

| C [nF] | R [Ω] | PEAK CURRENT [mA] | intVCC [V] | PEAK REDUCTION RATIO [%] |
|---|---|---|---|---|
| 1 | 3.5 | 88.57 | 2.99 | 30.8 |
| (0.444mm$^2$) | 5 | 77.05 | 2.915 | 39.8 |
| | 10 | 61.67 | 2.683 | 51.8 |
| 1.5 | 3.5 | 76.52 | 3.032 | 40.2 |
| (0.666mm$^2$) | 5 | 67.5 | 2.963 | 47.3 |
| | 10 | 56.38 | 2.736 | 56.0 |
| 2 | 3.5 | 69.45 | 3.057 | 45.7 |
| (0.888mm$^2$) | 5 | 62.26 | 2.989 | 51.4 |
| | 10 | 53.7 | 2.763 | 58.0 |

FIG. 50C

100MHz (10ns)

| C [nF] | R [Ω] | PEAK CURRENT [mA] | intVCC [V] | PEAK REDUCTION RATIO [%] |
|---|---|---|---|---|
| 1 | 3.5 | 92.15 | 2.978 | 28.0 |
| (0.444mm$^2$) | 5 | 82.59 | 2.887 | 35.5 |
| | 10 | 70.2 | 2.598 | 45.2 |
| 1.5 | 3.5 | 82.14 | 3.013 | 35.8 |
| (0.666mm$^2$) | 5 | 74.8 | 2.926 | 41.6 |
| | 10 | 65.96 | 2.64 | 48.5 |
| 2 | 3.5 | 76.35 | 3.033 | 40.4 |
| (0.888mm$^2$) | 5 | 70.5 | 2.948 | 44.9 |
| | 10 | 63.75 | 2.663 | 50.2 |

SEMICONDUCTOR MEMORY DEVICE WITH MEMORY ARRAY AND DUMMY MEMORY ARRAY

CROSS-REFERENCE TO RELATED APPLICATIONS

The disclosure of Japanese Patent Application No. 2012-129919 filed on Jun. 7, 2012 including the specification, drawings and abstract is incorporated herein by reference in its entirety.

BACKGROUND

The present invention relates to a semiconductor device which is suitable, for example, for an MRAM (Magnetic Random Access Memory).

In recent years, MRAMs have been attracting attention as semiconductor devices which can store nonvolatile data at low power consumption. An MRAM includes a plurality of memory cells MC disposed in a plurality of rows and a plurality of columns, a plurality of digit lines DL located in a way to correspond to the rows respectively and a plurality of bit lines BL located in a way to correspond to the columns. In write operation, current Im is supplied to selected digit lines DL to activate the memory cells corresponding to the digit lines DL and write current Iw whose direction depends on the logic level of a data signal is supplied to selected bit lines BL. Consequently the data signal is written in the memory cells MC located at the intersections between the selected digit lines DL and bit lines BL.

In order to reduce noise caused by voltage fluctuations in power wiring and grounding wiring, some MRAMs include a capacitor coupled between power wiring and grounding wiring (for example, see Japanese Unexamined Publication No. 2005-303156 and Japanese Unexamined Patent Publication No. 2011-3768).

SUMMARY

However, these existing semiconductor devices have a problem that the chip area must be larger due to the existence of a capacitor.

The above and further objects and novel features of the invention will more fully appear from the following detailed description in this specification and the accompanying drawings.

According to an aspect of the present invention, a capacitor is formed in the dummy memory array of a memory mat around the memory array of the mat.

According to another aspect of the present invention, noise can be reduced without an increase in chip area.

BRIEF DESCRIPTION OF THE DRAWINGS

FIGS. 11A and 11B are sectional views of the memory array and dummy memory array shown in FIG. 10, in which FIG. 11A shows the memory array and FIG. 11B shows the dummy memory array;

FIGS. 12A and 12B are plan views of key parts of the memory array and dummy memory array according to the first embodiment;

FIGS. 13A and 13B are sectional views of the memory array and dummy memory array shown in FIGS. 12A and 12B, in which FIG. 13A shows the memory array and FIG. 13B shows the dummy memory array;

FIGS. 14A and 14B are plan views of a first variation of the first embodiment, in which FIG. 14A shows the memory array and FIG. 14B shows the dummy memory array;

FIGS. 15A and 15B are sectional views of the memory array and dummy memory array shown in FIGS. 14A and 14B, in which FIG. 15A shows the memory array and FIG. 15B shows the dummy memory array;

FIGS. 16A and 16B are plan views of a second variation of the first embodiment, in which FIG. 16A shows the memory array and FIG. 16B shows the dummy memory array;

FIGS. 17A and 17B are sectional views of the memory array and dummy memory array shown in FIGS. 16A and 16B, in which FIG. 17A shows the memory array and FIG. 17B shows the dummy memory array;

FIGS. 18A and 18B are plan views of a third variation of the first embodiment, in which FIG. 18A shows the memory array and FIG. 18B shows the dummy memory array;

FIGS. 19A and 19B are sectional views of the memory array and dummy memory array shown in FIGS. 18A and 18B, in which FIG. 19A shows the memory array and FIG. 19B shows the dummy memory array;

FIGS. 20A and 20B are plan views of a fourth variation of the first embodiment, in which FIG. 20A shows the memory array and FIG. 20B shows the dummy memory array;

FIGS. 21A and 21B are sectional views of the memory array and dummy memory array shown in FIGS. 20A and 20B, in which FIG. 21A shows the memory array and FIG. 21B shows the dummy memory array;

FIGS. 22A and 22B are plan views of a fifth variation of the first embodiment, in which FIG. 22A shows the memory array and FIG. 22B shows the dummy memory array;

FIGS. 23A and 23B are sectional views of the memory array and dummy memory array shown in FIGS. 22A and 22B, in which FIG. 23A shows the memory array and FIG. 23B shows the dummy memory array;

FIGS. 24A and 24B are plan views of a sixth variation of the first embodiment, in which FIG. 24A shows the memory array and FIG. 24B shows the dummy memory array;

FIGS. 25A and 25B are sectional views of the memory array and dummy memory array shown in FIGS. 24A and 24B, in which FIG. 25A shows the memory array and FIG. 25B shows the dummy memory array;

FIGS. 26A and 26B are sectional views of a seventh variation of the first embodiment, in which FIG. 26A shows the memory array and FIG. 26B shows the dummy memory array;

FIGS. 27A and 27B are sectional views of an eighth variation of the first embodiment, in which FIG. 27A shows the memory array and FIG. 27B shows the dummy memory array;

FIGS. 28A and 28B are plan views of key parts of the memory array and dummy memory array according to a second embodiment of the present invention, in which FIG. 28A shows the memory array and FIG. 28B shows the dummy memory array;

FIGS. 29A and 29B are sectional views of the memory array and dummy memory array shown in FIGS. 28A and 28B, in which FIG. 29A shows the memory array and FIG. 29B shows the dummy memory array;

FIGS. 30A and 30B are plan views of a first variation of the second embodiment, in which FIG. 30A shows the memory array and FIG. 30B shows the dummy memory array;

FIGS. 31A and 31B are sectional views of the memory array and dummy memory array shown in FIGS. 30A and 30B, in which FIG. 31A shows the memory array and FIG. 31B shows the dummy memory array;

FIGS. 32A and 32B are plan views of a second variation of the second embodiment, in which FIG. 32A shows the memory array and FIG. 32B shows the dummy memory array;

FIGS. 33A and 33B are sectional views of the memory array and dummy memory array shown in FIGS. 32A and 32B, in which FIG. 33A shows the memory array and FIG. 33B shows the dummy memory array;

FIGS. 34A and 34B are plan views of a third variation of the second embodiment, in which FIG. 34A shows the memory array and FIG. 34B shows the dummy memory array;

FIGS. 35A and 35B are sectional views of the memory array and dummy memory array shown in FIGS. 34A and 34B, in which FIG. 35A shows the memory array and FIG. 35B shows the dummy memory array;

FIGS. 36A and 36B are plan views of a fourth variation of the second embodiment, in which FIG. 36A shows the memory array and FIG. 36B shows the dummy memory array;

FIGS. 37A and 37B are sectional views of the memory array and dummy memory array shown in FIGS. 36A and 36B, in which FIG. 37A shows the memory array and FIG. 37B shows the dummy memory array;

FIGS. 38A and 38B are plan views of a fifth variation of the second embodiment, in which FIG. 38A shows the memory array and FIG. 38B shows the dummy memory array;

FIGS. 39A and 39B are sectional views of the memory array and dummy memory array shown in FIGS. 38A and 38B, in which FIG. 39A shows the memory array and FIG. 39B shows the dummy memory array;

FIGS. 40A and 40B are plan views of a sixth variation of the second embodiment, in which FIG. 40A shows the memory array and FIG. 40B shows the dummy memory array;

FIGS. 41A and 41B are sectional views of the memory array and dummy memory array shown in FIGS. 40A and 40B, in which FIG. 41A shows the memory array and FIG. 41B shows the dummy memory array;

FIGS. 42A, 42B, and 42C show a variation of the first and second embodiments, in which FIG. 42A is a sectional view taken in a direction parallel to bit lines, FIG. 42B is a sectional view taken in a direction parallel to digit lines, and FIG. 42C is a plan view;

FIGS. 43A, 43B, and 43C show another variation of the first and second embodiments, in which FIG. 43A is a sectional view taken in a direction parallel to bit lines, FIG. 43B is a sectional view taken in a direction parallel to digit lines, and FIG. 43C is a plan view;

FIGS. 44A, 44B, and 44C show a further variation of the first and second embodiments, in which FIG. 44A is a sectional view taken in a direction parallel to bit lines, FIG. 44B is a sectional view taken in a direction parallel to digit lines, and FIG. 44C is a plan view;

FIGS. 45A, 45B, and 45C show a further variation of the first and second embodiments, in which FIG. 45A is a sectional view taken in a direction parallel to bit lines, FIG. 45B is a sectional view taken in a direction parallel to digit lines, and FIG. 45C is a plan view;

FIGS. 46A, 46B, and 46C show a further variation of the first and second embodiments, in which FIG. 46A is a sectional view taken in a direction parallel to bit lines, FIG. 46B is a sectional view taken in a direction parallel to digit lines, and FIG. 46C is a plan view;

FIGS. 47A, 47B, and 47C show a further variation of the first and second embodiments, in which FIG. 47A is a sectional view taken in a direction parallel to bit lines, FIG. 47B is a sectional view taken in a direction parallel to digit lines, and FIG. 47C is a plan view;

FIGS. 50A, 50B, and 50C show simulation test results of the MRAM shown in FIG. 49, in which FIG. 50A shows results at 50 MHz, FIG. 50B shows results at 80 MHz, and FIG. 50C shows results at 100 MHz.

DETAILED DESCRIPTION

First Embodiment

Figure 1:
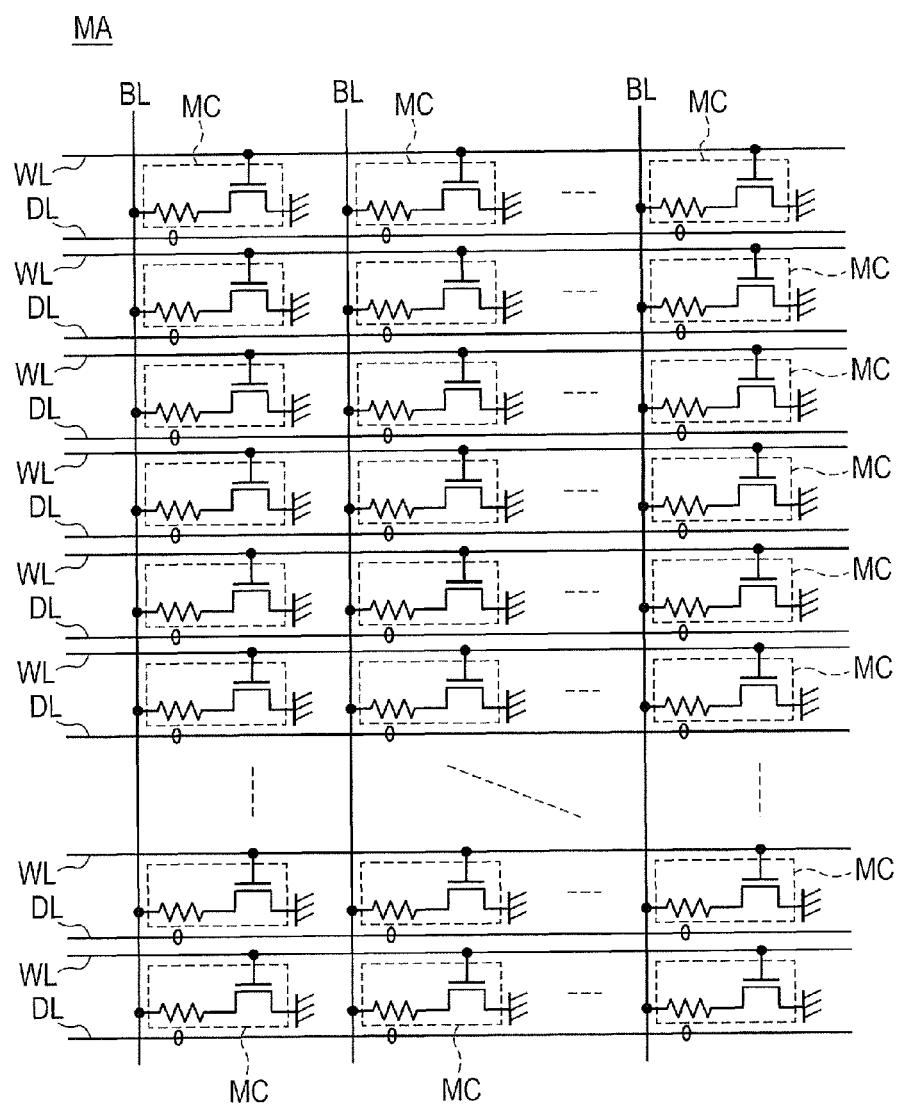
FIG. 1 is a circuit diagram showing the structure of the memory array of an MRAM according to a first embodiment of the present invention.

As shown in FIG. 1, the memory array MA of an MRAM according to the first embodiment includes a plurality of memory cells MC, a plurality of word lines WL, a plurality of digit lines DL, and a plurality of bit lines BL. The memory cells MC are disposed in a plurality of rows and a plurality of columns (for example, 256 rows, 256 columns). The word lines WL are located in a way to correspond to the rows respectively. The digit lines DL are located in away to correspond to the rows respectively. The bit lines BL are located in a way to correspond to the columns respectively.

Figure 2:
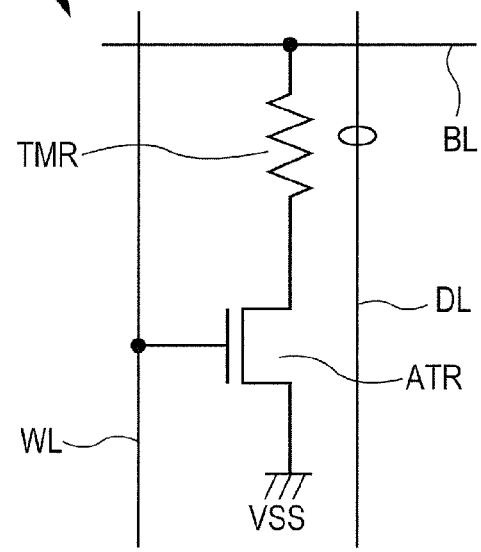
FIG. 2 is a circuit diagram showing the structure of a memory cell shown in FIG. 1.

As shown in FIG. 2, each memory cell MC includes a tunnel magnetoresistance element TMR and an access transistor (N channel MOS transistor) ATR. The tunnel magnetoresistance element TMR and access transistor ATR are coupled in series between the corresponding bit line BL and grounding voltage VSS and the gate of the access transistor ATR is coupled to the corresponding word line WL. The tunnel magnetoresistance element TMR is an element whose electric resistance value changes according to the logic of stored data.

Figure 3:
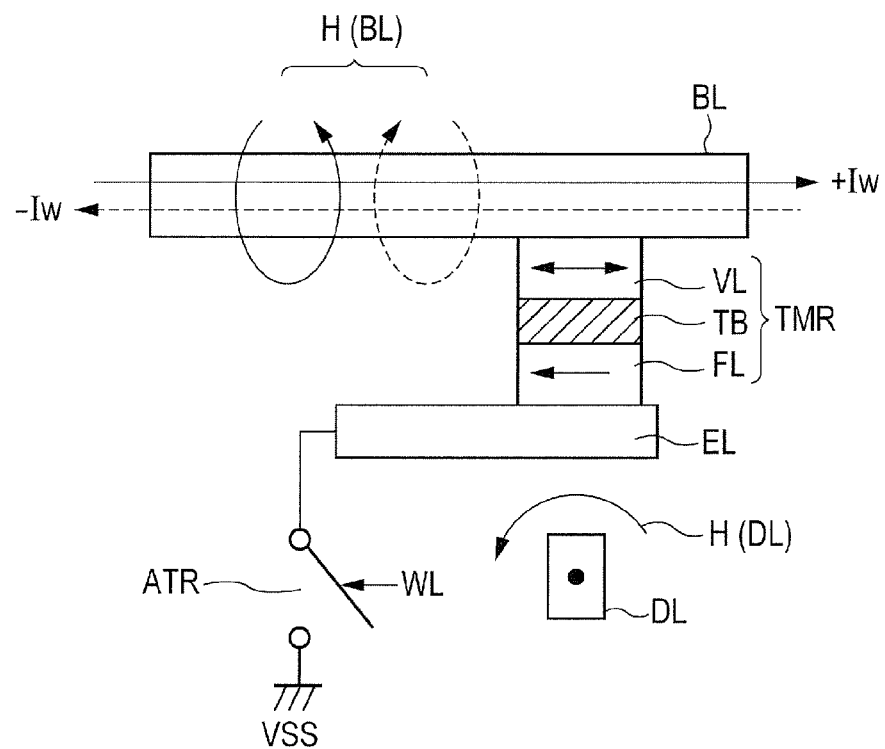
FIG. 3 is a diagram illustrating how data is written in the memory cell shown in FIG. 2.

As shown in FIG. 3, the tunnel magnetoresistance element TMR includes a fixed magnetization film FL, tunnel insulating film TB and free magnetization film VL which are stacked between an electrode EL and the bit line BL. The fixed magnetization film FL and free magnetization film VL are each ferromagnetic film. The direction of magnetization of the fixed magnetization film is fixed to one direction. Regarding the direction of magnetization of the free magnetization film VL, writing is done in one direction or the other direction. If the direction of magnetization of the fixed magnetization film FL is the same as that of the free magnetization film VL, the resistance value of the tunnel magnetoresistance element TMR is relatively small and if their directions of magnetization are opposite to each other, the electric resistance value of the tunnel magnetoresistance element TMR is relatively large. The two resistance values of the tunnel magnetoresistance element TMR correspond to, for example, data signals 0 and 1 respectively.

For data writing, as shown in FIG. 3, the word line WL is set to a non-selected level "L" to make the access transistor ATR nonconductive and supply current Im to the digit line DL and supply write current Iw to the bit line BL. The direction of magnetization of the free magnetization film VL depends on the combination of the directions of current Im ad write current Iw.

Figure 4:
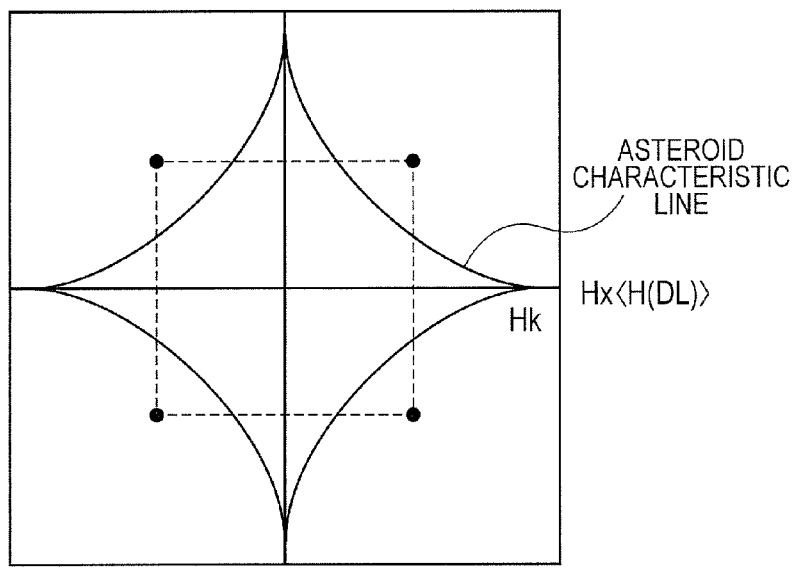
FIG. 4 is another diagram illustrating how data is written in the memory cell shown in FIG. 2.

FIG. 4 is a diagram showing the relation between the directions of current Im and write current Iw and the direction of magnetization for data writing. Referring to FIG. 4, magnetic field Hx on the horizontal axis denotes magnetic field H (DL) generated by current Im flowing in the digit line DL. On the other hand, magnetic field Hy on the vertical axis denotes magnetic field H (BL) generated by write current Iw flowing in the bit line BL.

As for the magnetization direction stored in the free magnetization film VL, writing is newly done only when the sum of magnetic fields H(DL) and H(BL) is in a zone outside the asteroid characteristic line shown in the figure. In other words, when a magnetic field corresponding to the zone inside the asteroid characteristic line is applied, the magnetization direction stored in the free magnetization film VL is not updated. Therefore, in order to update the stored data in the tunnel magnetoresistance element TMR by write operation, it is necessary to supply current to both the digit line DL and bit line BL. It is assumed here that current Im flowing in one direction is supplied to the digit line DL and write current Iw whose direction depends on the logic (0 or 1) of the data signal is supplied to the bit line BL. The magnetization direction once stored in the tunnel magnetoresistance element TMR or stored data is held in a nonvolatile manner until new data is written.

Figure 5:
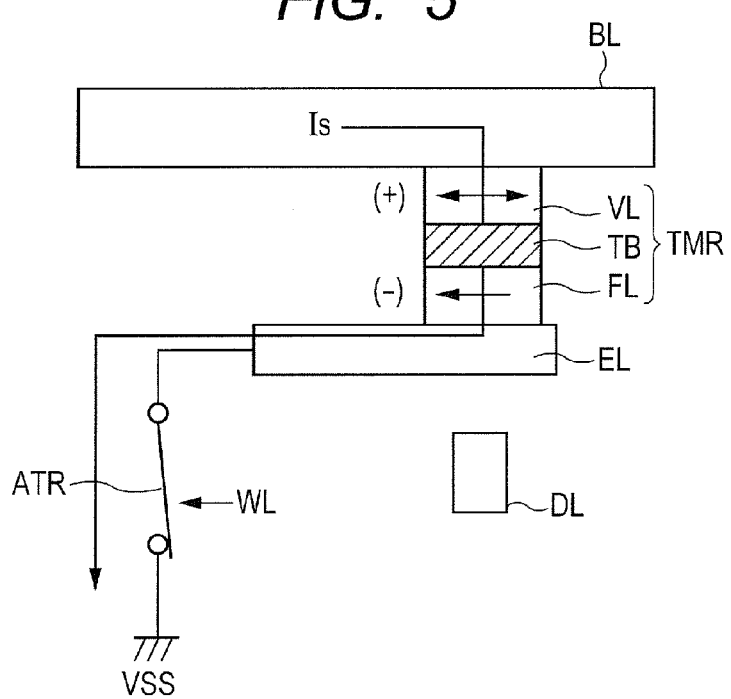
FIG. 5 is a diagram illustrating how data is read from the memory cell shown in FIG. 2.

For data reading, as shown in FIG. 5, the word line is set to the selected level H so that the access transistor ATR becomes conductive and current Is flows from the bit line BL to the grounding voltage VSS line through the tunnel magnetoresistance element TMR and access transistor ATR. The value of the current Is varies according to the resistance value of the tunnel magnetoresistance element TMR. Therefore, the stored data in the tunnel magnetoresistance element TMR is read by detection of the current Is value.

Figure 6:
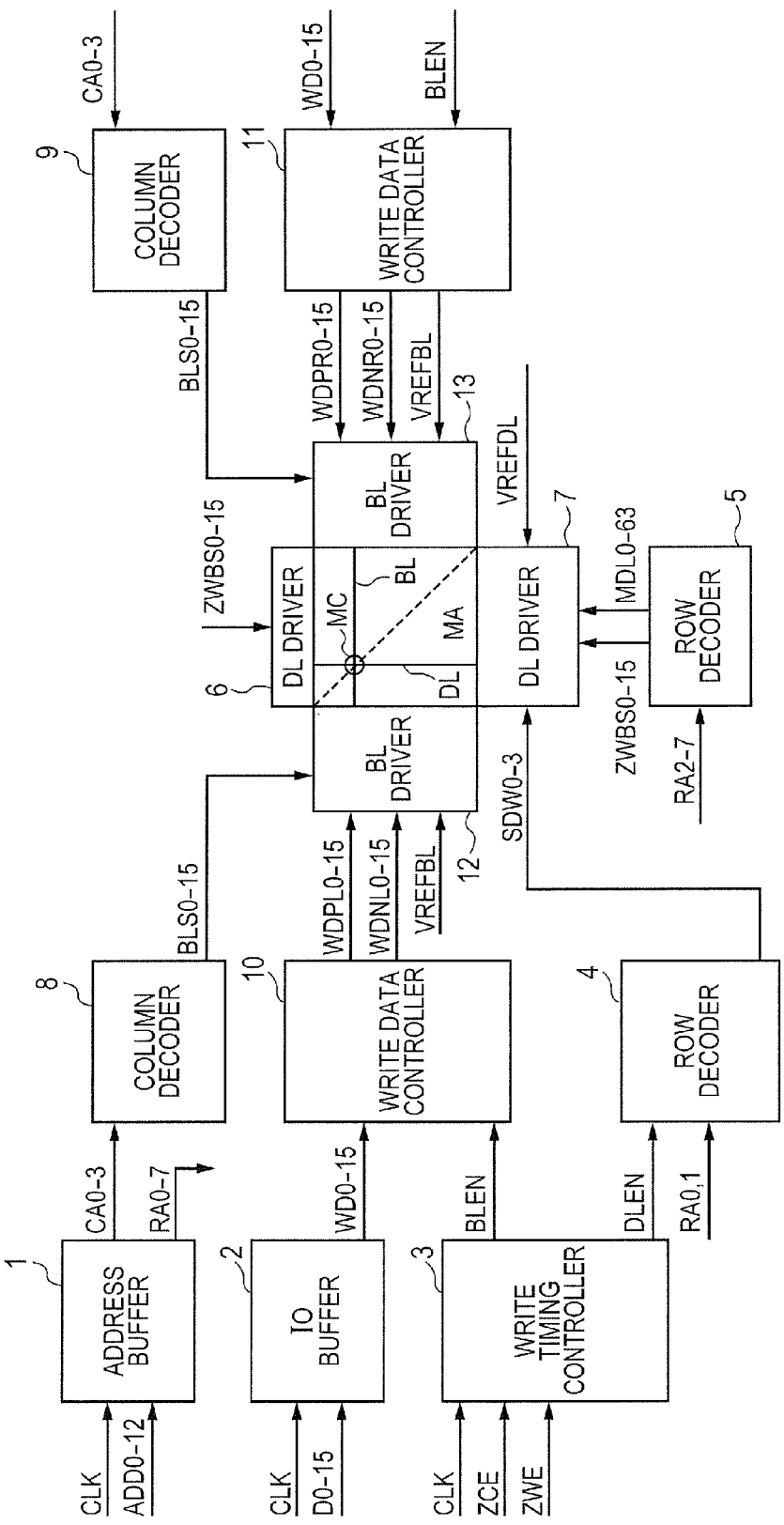
FIG. 6 is a block diagram showing the sections of the MRAM shown in FIGS. 1 to 5 which are related to data writing.

FIG. 6 is a block diagram showing the sections of the MRAM related to data writing. Referring to FIG. 6, in addition to the memory array MA, the MRAM includes an address buffer 1, IO buffer 2, write timing controller 3, row decoders 4, 5, DL drivers 7, 7, column decoders 8, 9, write data controllers 10, 11, and BL drivers 12, 13.

The address buffer 1 receives external address signals ADD0 to ADD12 synchronously with the rising edge of a clock signal CLK and generates row address signals RA0 to RA7 and column address signals CA0 to CA12. The IO buffer 2 receives write data signals D0 to D15 synchronously with the rising edge of the clock signal CLK and generates internal data signals WD0 to WD15.

The write timing controller 3 generates digit line enable signal DLEN and bit line enable signal BLEN when chip enable signal ZCE and write enable signal ZWE are both set to the L level as an active level at the rising edge of the clock signal CLK.

The row decoder 4 generates internal address signals SDW0 to SDW3 according to digit line enable signal DLEN and row address signals RA0 and RA1. The row decoder 5 generates internal address signals ZWBS0 to ZWBS15 and MDL0 to MDL63 according to row address signals RA2 to RA7. The 256 digit lines DL of the memory array MA are divided into groups each having sixteen digit lines.

The DL driver 6 selects one of the sixteen digit line groups according to the internal address signals ZWBS0 to ZWBS15 and applies the supply voltage VDD to one end of each of the sixteen digit lines of the selected digit line group.

The DL driver 7 selects one digit line DL of the 256 digit lines DL according to the internal address signals SDW0 to SDW3 and MDL0 to MDL63 and supplies current Im whose value depends on reference voltage VREFDL, from the other end of the selected digit line DL to the grounding voltage VSS line.

The row decoders 8 and 9 each generate bit line select signals BLS0 to BLS15 according to column address signals CA0 to CA3. The write data controller 10 generates write control signals WDPL0 to WDPL15 and WDNL0 to WDNL15 according to the internal data signals WD0 to WD15 and bit line enable signal BLEN. The write data controller 11 generates write control signals WDPR0 to WDPR15 and WDNR0 to WDNR15 according to the internal data signals WD0 to WD15 and bit line enable signal BLEN. The 256 bit lines BL of the memory array MA are divided into groups each having sixteen bit lines.

The BL drivers 12 and 13 each select one bit line BL of the sixteen bit lines BL of each of the sixteen bit line groups according to bit line select signals BLS0 to BLS15 to select a total of sixteen bit lines BL. The BL driver 12 operates according to the write control signals WDPL0 to WDPL15 and WDNL0 to WDNL15 and applies the supply voltage VDD or grounding voltage VSS to one end of each of the selected sixteen bit lines BL. The BL driver 13 operates according to the write control signals WDPR0 to WDPR15 and WDNR0 to WDNR15 and applies the grounding voltage VSS or supply voltage VDD to one end of each of the selected sixteen bit lines BL.

Thus the BL drivers 12 and 13 supply write current Iw whose direction (polarity) depends on the logic level of write data signals D0 to D15, to the selected sixteen bit lines BL respectively. The value of write current Iw is set according to the reference voltage VREFBL.

Figure 7:
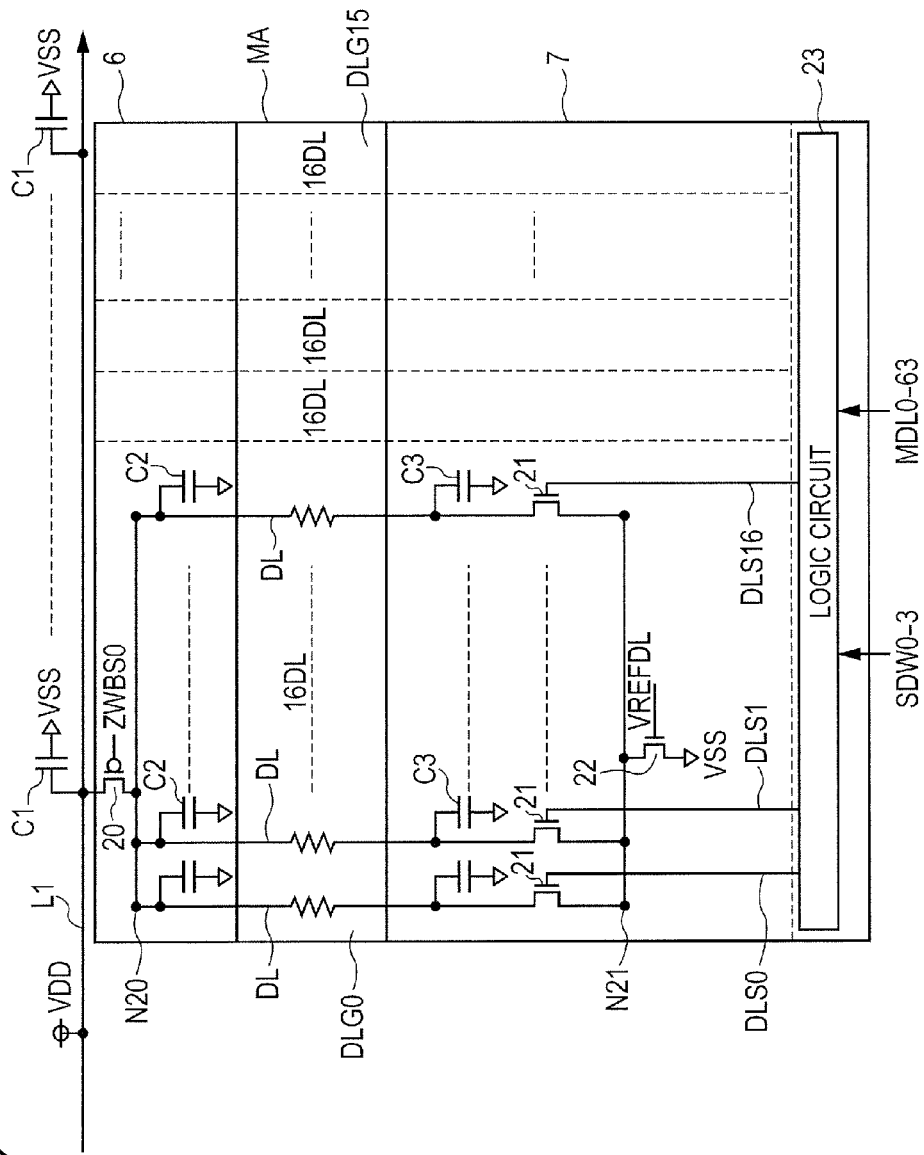
FIG. 7 is a block diagram showing the structure of a DL driver shown in FIG. 6.

FIG. 7 is a circuit diagram showing the structure of the DL drivers 6 and 7. Referring to FIG. 7, the 256 digit lines DL of the memory array MA are divided into sixteen digit line groups DLG0 to DLG15 each having sixteen digit lines. One end of each of the sixteen digit lines DL of each digit line group DLG is commonly coupled to node N20. Each digit line DL has parasitic resistance.

The DL driver 6 includes sixteen P-channel MOS transistors 20 corresponding to the sixteen digit line groups DLG0 to DLG15. The source of each P-channel MOS transistor 20 receives the supply voltage VDD and its drain is coupled to the node N20 of the corresponding digit line group DLG. The gates of the sixteen P-channel MOS transistors 20 corresponding to the sixteen digit line groups DLG0 to DLG15 receive the internal address signals ZWBS0 to ZWBS15 respectively.

Line L1 of supply voltage VDD is provided along the sources of the sixteen P-channel MOS transistors 20 of the DL driver 6. A plurality of capacitors C1 are disposed along the supply voltage VDD line L1 and each capacitor C1 is coupled between the supply voltage VDD line and the grounding voltage VSS line. The capacitors C1 are intended to stabilize the supply voltage VDD supplied to the DL driver 6 and decrease the peak value of output current (current flowing in the supply voltage VDD line L1) of the external power source of the MRAM to suppress noise.

The DL driver 6 also includes a capacitor C2 located in a way to correspond to each digit line DL. Each capacitor C2 is coupled between the corresponding digit line DL and grounding voltage VSS line in order to decrease the peak value of current Im flowing in the corresponding digit line DL.

The DL driver 7 includes capacitors C3 and N-channel MOS transistors 21 corresponding to the digit lines DL. The DL driver 7 includes sixteen N-channel MOS transistors 22 corresponding to the sixteen digit line groups DLG0 to DLG15 and a logic circuit 23. Each capacitor C3 is coupled between the corresponding digit line D1 and grounding voltage VSS line in order to decrease the peak value of current Im flowing in the corresponding digit line DL.

The gates of the 256 N-channel MOS transistors 21 receive digit line select signals DLS0 to DLS255 respectively. Each N-channel MOS transistor 21 is coupled between the other end of the corresponding digit line DL and the drain (node N21) of the corresponding N-channel MOS transistor 22. Each N-channel MOS transistor 21 is conductive when the corresponding digit line select signal DLS is set to the active level "H" level, and it is nonconductive when the corresponding digit line select signal DLS is set to the non-active level "L" level.

An N-channel MOS transistor 22 is coupled between the node N21 and grounding voltage VSS line and its gate receives the reference voltage VREFDL. The N-channel MOS transistor 22 constitutes a constant current element which supplies a current with a value depending on the reference voltage VREFDL, from the node N21 to the grounding voltage VSS line.

The logic circuit 23 selects one of the 256 digit line select signals DLS0 to DLS255 according to the internal address signals SDW0 to SWD3 and MDL0 to MDL63 and sets the selected digit line select signal DLS to the active level "H" level.

Next, how the DL drivers 6 and 7 operate will be described. It is assumed here that the second digit line DL from left among the sixteen digit lines DL of the digit line group DLG0 is specified by the internal address signals SDW0 to SDW3 and MDL0 to MDL63.

First, the internal address signal ZWBS0 falls to the active level "L" level and the P-channel MOS transistor 20 corresponding to the digit line group DLG0 becomes conductive. Then, the digit line select signal DLS1 rises to the active level "H" level and the N-channel MOS transistor 21 becomes conductive and current Im flows in the digit line DL. Due to the existence of the capacitor C1, the peak value of supply current flowing from the external power source to the MRAM (namely current flowing in the supply voltage VDD line L1) is held low. Also, due to the existence of the capacitors C2 and C3, the peak value of current Im is held low.

Then, the digit line select signal DLS1 falls to the non-active level L level and the N-channel MOS transistor 21 becomes nonconductive and current Im is shut off. Also, the internal address signal ZWBS0 rises to the non-active level "H" level and the P-channel MOS transistor 20 corresponding to the digit line group DLG0 becomes nonconductive.

If the capacitors C1 to C3 do not exist, when the N-channel MOS transistors 20 and 21 are conductive, the peak value of the supply current flowing from the external power source to the MRAM would be high, generating noise. Also, the peak value of current Im would be high, which would excessively disturb the memory cells MC corresponding to the selected digit line DL and reduce the write noise margin. For this reason, the related art has a problem that the probability of writing errors is high. By contrast, in the first embodiment, an overshoot of current Im is small and the write noise margin can be held high so that the probability of writing errors is low.

Figure 8:
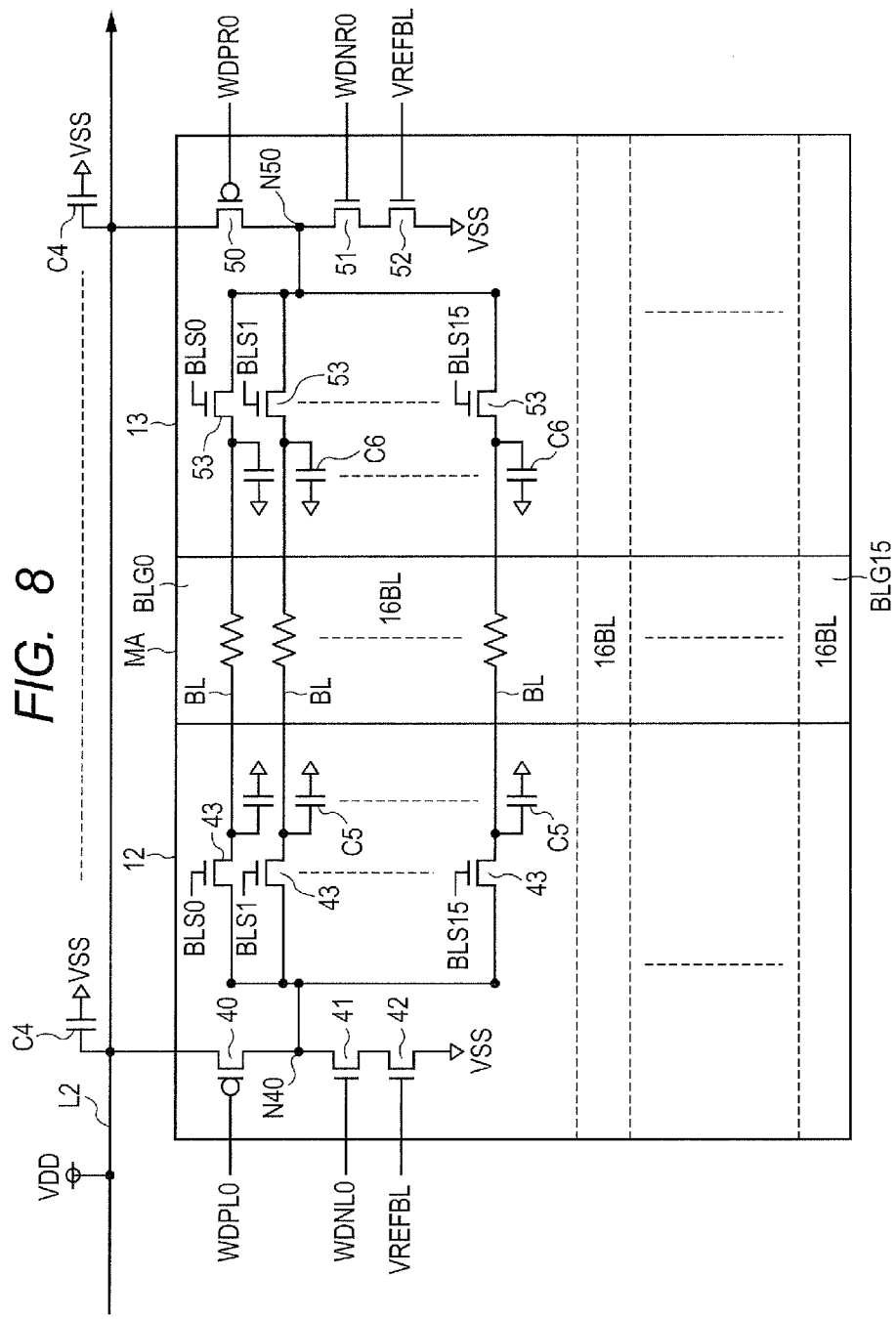
FIG. 8 is a block diagram showing the structure of a BL driver shown in FIG. 6.

FIG. 8 is a circuit diagram showing the structure of the BL drivers 12 and 13. Referring to FIG. 8, the 256 bit lines BL of the memory array MA are divided into sixteen bit line groups BLG0 to BLG15 each having sixteen bit lines. Each bit line BL has parasitic resistance.

The BL driver 12 includes a P-channel MOS transistor 40 and N-channel MOS transistors 41 and 42 which correspond to each bit line group BLG. Supply voltage VDD line L2 is provided along the sources of the sixteen P-channel MOS transistors 40 of the BL driver 12. A plurality of capacitors C4 are disposed along the supply voltage VDD line L2 and each capacitor C4 is coupled between the supply voltage VDD line L2 and grounding voltage VSS line. The capacitors C4 are intended to stabilize the supply voltage VDD, decrease the peak value of output current (namely current flowing in the supply voltage VDD line L2) of the external power source of the MRAM and suppress noise.

The P-channel MOS transistor 40 is coupled between the supply voltage VDD line L2 and node N40 and its gate receives write control signal WDPL0. The drain of the N-channel MOS transistor 41 is coupled to the node N40 and its gate receives write control signal WDNL0. The N-channel MOS transistor 42 is coupled between the source of the N-channel MOS transistor 41 and the grounding voltage VSS line and its gate receives the reference voltage VREFBL. The N-channel MOS transistor 42 constitutes a constant current element which supplies a current with a value depending on the reference voltage VREFBL.

The BL driver 12 also includes an N-channel MOS transistor 43 and a capacitor C5 which correspond to each bit line BL. The gates of the 256 N-channel MOS transistors 43 receive bit line select signals BLS0 to BLS255 respectively. Each N-channel MOS transistor 43 is coupled between one end of the corresponding bit line BL and the corresponding node N40. Each N-channel MOS transistor 43 is conductive when the corresponding bit line select signal BLS is set to the active level "H" level, and it is nonconductive when the corresponding bit line select signal BLS is set to the non-active level "L" level. Bit line select signals BLS0 to BLS255 are generated from the column address signals CA0 to CA3. Each capacitor C5 is coupled between the corresponding bit line BL and the grounding voltage VSS line in order to decrease the peak value of write current Iw flowing in the corresponding bit line BL.

The BL driver 13 includes a P-channel MOS transistor 50 and N-channel MOS transistors 51 and 52 which correspond to each bit line group BLG. The P-channel MOS transistor 50 is coupled between the supply voltage VDD line L2 and node N50 and its gate receives write control signal WDPR0. The drain of the N-channel MOS transistor 51 is coupled to the node N50 and its gate receives write control signal WDNR0. The N-channel MOS transistor 52 is coupled between the source of the N-channel MOS transistor 51 and the grounding voltage VSS line and its gate receives the reference voltage VREFBL. The N-channel MOS transistor 52 constitutes a constant current element which supplies a current with a value depending on the reference voltage VREFBL.

The BL driver 13 also includes an N-channel MOS transistor 53 and a capacitor C6 which correspond to each bit line BL. The gates of the 256 N-channel MOS transistors 53 receive bit line select signals BLS0 to BLS255 respectively. Each N-channel MOS transistor 53 is coupled between the other end of the corresponding bit line BL and the corresponding node N50. Each N-channel MOS transistor 53 is conductive when the corresponding bit line select signal BLS is set to the active level "H" level, and it is nonconductive when the corresponding bit line select signal BLS is set to the non-active level "L" level. Each capacitor C6 is coupled between the corresponding bit line BL and the grounding voltage VSS line in order to decrease the peak value of write current Iw flowing in the corresponding bit line BL.

Next, how the BL drivers 12 and 13 operate will be described. It is assumed here that the second bit line BL from top among the sixteen bit lines BL of the bit line group BLG0 as seen in FIG. 8 is selected. It is also assumed that according to write control signals WDPL0, WDNL0, WDPR0, and WDNR0, write current Iw flows in the bit line BL from right to left as seen in FIG. 8. In the initial state, the transistors 40, 41, 43, 50, 51, and 53 are nonconductive.

First, the write control signal WDNL0 rises to the active level "H" level and the write control signal WDPR0 falls to the active level "L" level and the transistors 41 and 50 become conductive. Then, the bit line select signal BLS1 is set to the active level "H" level and the transistors 43 and 53 corresponding to the bit line select signal BLS1 become conductive.

Consequently, write current Iw flows from the supply voltage VDD line through the transistors 50 and 53, bit line BL, and transistors 43, 41, and 42 to the grounding voltage VSS line. Due to the existence of the capacitor C4, the peak value of the supply current flowing from the external power source to the MRAM (namely current flowing in the supply voltage VDD line L2) is held low. Also, due to the existence of the capacitors C5 and C6, the peak value of write current Iw is held low. After a given time has elapsed, the transistors 41, 43, 50, and 53 become nonconductive and write current Iw is shut off.

As write current Iw flows in the bit line BL from right to left as seen in FIG. 8, for example, data "1" is written in the memory cell MC at the intersection between the selected bit line BL and digit line DL. In order to write data "0" in that memory cell MC, the transistors 40 and 51 should be made conductive instead of the transistors 41 and 50 and write current Iw should flow in the bit line BL from left to right as seen in FIG. 8.

If the capacitors C4 to C6 do not exist, when the transistors 40, 43, 53, 51 and 52 are conductive, the peak value of the supply current flowing from the external power source to the MRAM would be high, generating noise. Also, the peak value of write current Iw would be high, which would excessively disturb the memory cells MC corresponding to the selected bit line BL and reduce the write noise margin. For this reason, the related art has a problem that the probability of writing errors is high. By contrast, in the first embodiment, an overshoot of write current Iw is small and the write noise margin can be held high so that the probability of writing errors is low.

Figure 9:
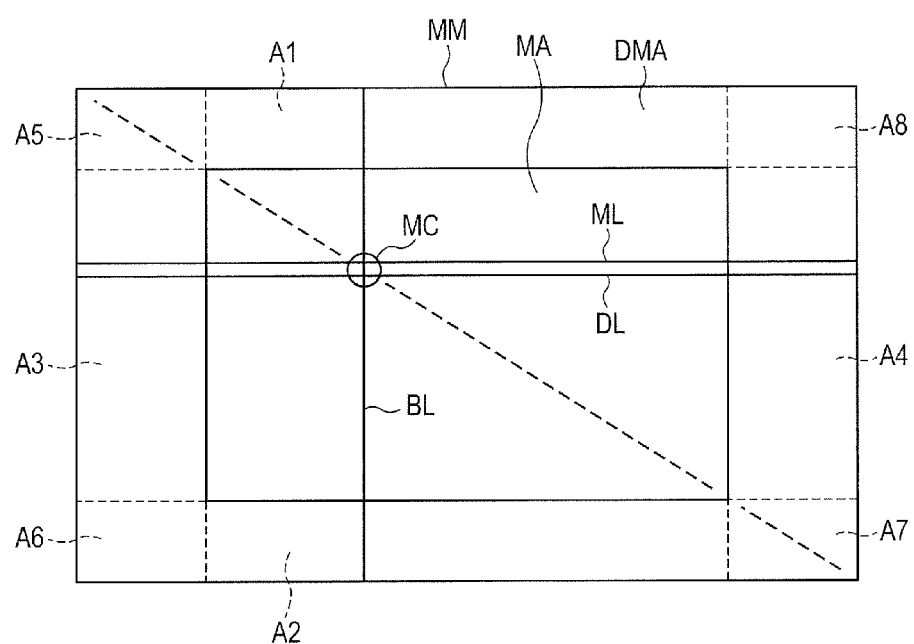
FIG. 9 is a diagram illustrating how the memory array shown in FIG. 1 is formed.

As mentioned above, the first embodiment includes many capacitors (C1 to C6). Next, a method for making capacitors C1 to C6 without an increase in chip area will be described. Generally in an MRAM, a memory mat MM larger than the memory array MA is formed as shown in FIG. 9. Like the memory array MA, the memory mat MM includes a plurality of memory cells MC, a plurality of word lines WL, a plurality of digit lines DL, and a plurality of bit lines BL.

Only the central area of the memory mat MM is used as a memory array MA in which tunnel magnetoresistance elements TMR (memory cells) for storing data are disposed. The area of the memory mat M which surrounds the memory array is used for a dummy memory array DMA which is not used to store data. In the dummy memory array DMA, dummy memory cells, etc. which are not used to store data are disposed. The dummy memory array DMA, located outside the memory array MA, is intended to equalize the film thickness of the tunnel magnetoresistance elements TMR in the memory array MA at the step of planarization using a CMP (Chemical Mechanical Polishing) process used at the step of making tunnel magnetoresistance elements TMR. A difference in meal density causes a difference in the polishing rate in the CMP process, leading to deterioration in flatness. For this reason, the dummy memory array DMA in which dummy memory cells, etc. are disposed so as to equalize the metal density is located around the memory array MA. In the CMP process, the film of tunnel magnetoresistance elements TMR is inevitably thin (or thick) in the peripheral area of the memory mat MM. For this reason, only its central area, in which the film thickness of tunnel magnetoresistance elements TMR can be uniform, is used as a memory array MA.

In the first embodiment, the capacitors C1 to C6 are formed in the dummy memory array DMA. In the first embodiment, since the capacitors C1 to C6 are located in the dummy memory array DMA in which dummy memory cells, etc. are disposed, an increase in chip size due to the existence of the capacitors is avoided. The dummy memory array DMA is divided into eight areas A1 to A8. The area A1 is an area in which one end (upper end as seen in FIG. 9) of a bit line BL passing through the memory array MA is formed. The area A2 is an area in which the other end (lower end as seen in FIG. 9) of the bit line BL passing through the memory array MA is formed. The capacitors C5 and C6 are formed in the areas A1 and A2 respectively.

The area A3 is an area in which one end (left end as seen in FIG. 9) of a digit line DL passing through the memory array MA is formed. The area A4 is an area in which the other end (right end as seen in FIG. 9) of the digit line DL passing through the memory array MA is formed. The capacitors C2 and C3 are formed in the areas A3 and A4 respectively. The areas A5 to A8 are the four corner areas of the dummy memory array DMA in which the bit line BL and digit line DL passing through the memory array MA do not exist. The capacitors C1 and C4 are formed in the areas A5 to A8.

Figure 10:
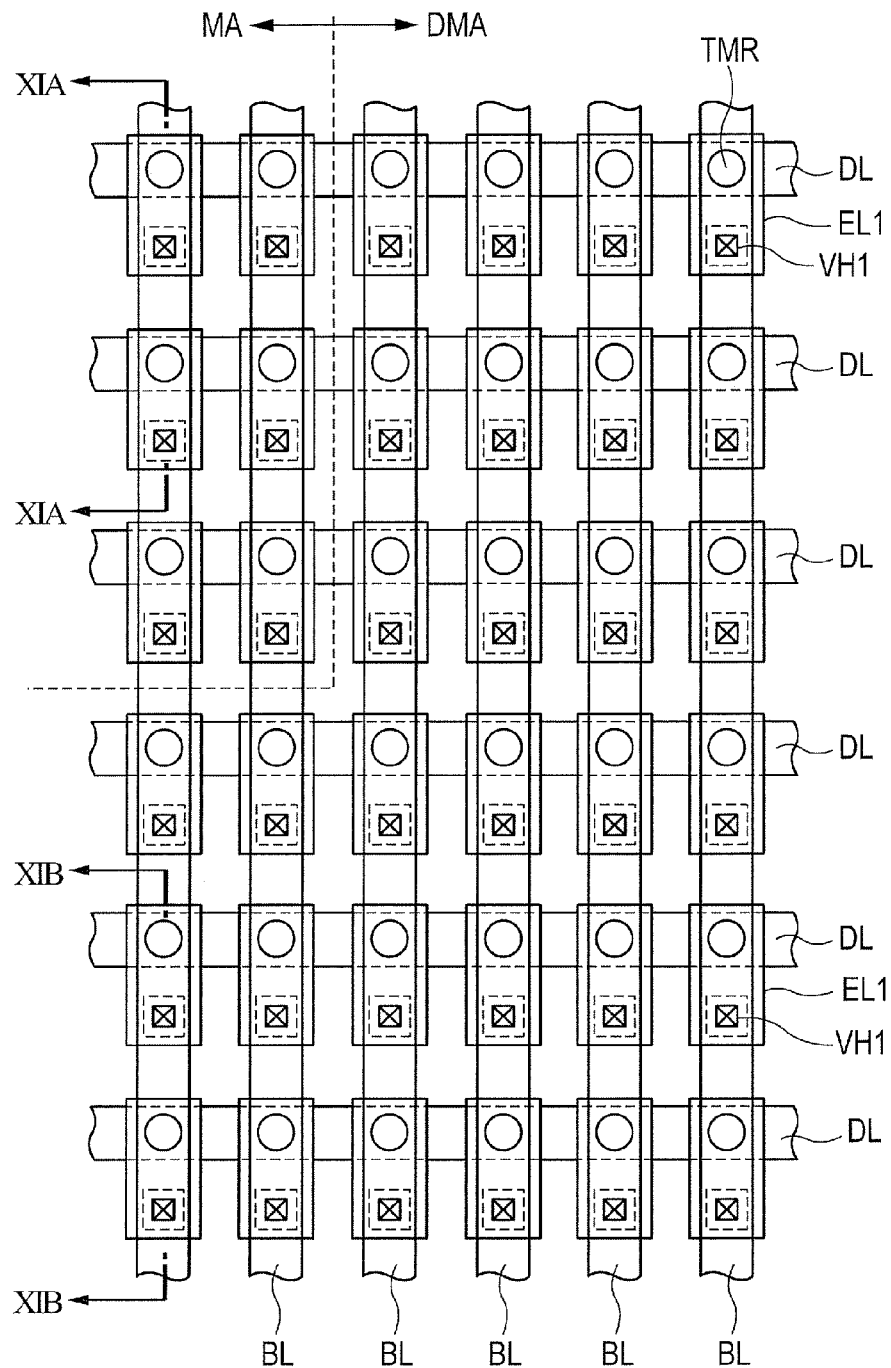
FIG. 10 is a plan view of key parts of the memory array and dummy memory array shown in FIG. 9.

For easy understanding of the first embodiment, an explanation is given below of comparison between the first embodiment and the related art. First, the configuration of the memory mat MM of a related art MRAM is described below. FIG. 10 is a plan view of a key part of the related art memory mat MM. FIG. 11A is a sectional view taken along the line XIA-XIA of FIG. 10 and FIG. 11B is a sectional view taken along the line XIB-XIB of FIG. 10. As shown in FIGS. 10, 11A, and 11B, in the related art memory mat MM, the dummy memory array DMA is structurally the same as the memory array MA. A plurality of bit lines BL are arranged in parallel at regular intervals and a plurality of digit lines DL are arranged in parallel under the bit lines at regular intervals. When seen from above, the bit lines BL and digit lines DL are orthogonal to each other.

A rectangular lower electrode EL1 is formed between the bit line BL and digit line DL at each of the intersections between the bit line BL and digit line DL and a tunnel magnetoresistance element TMR is formed between one end of the upper face of the lower electrode EL1 and the bit line BL. The other end of the lower face of the lower electrode EL1 is coupled through a via hole VH1, read line RL including a through hole (hereinafter simply referred to as read line RL), through hole TH, and contact hole CH to the drain D of an access transistor ATR located under it. The access transistor ATR is formed on the surface of a silicon substrate SB. The gate of the access transistor ATR constitutes a word line WL. The source S of the access transistor ATR is coupled to the grounding voltage VSS line (not shown).

Next, the structure of the memory mat MM of the MRAM according to the first embodiment will be described. FIG. 12A is a plan view of a key part of the memory array MA and FIG. 12B is a plan view of a key part of the dummy memory array DMA. FIGS. 12A and 12B each show a unit memory cell area of the memory array MA and dummy memory array DMA (area corresponding to one memory cell MC) respectively. A digit line DL extends in a vertical direction as seen in the figures and a bit line BL extends in a horizontal (left-right) direction as seen in the figures. FIG. 13A is a sectional view taken along the line XIIIA-XIIIA of FIG. 12A, showing part A of FIG. 11A. FIG. 13B is a sectional view taken along the line XIIIB-XIIIB of FIG. 12B, showing part B of FIG. 11A.

Referring to FIGS. 12A and 12B and FIGS. 13A and 13B, in the memory array MA and dummy memory array DMA, a digit line layer 61 as a metal wiring layer is formed over a silicon substrate SB and the digit line layer 61 is patterned so as to form a group of digit lines DL and a group of reading lines RL. In the dummy memory array DMA, the reading lines RL are always grounded. A method for grounding a reading line RL in the dummy memory array DMA may be to make the access transistor ATR of the dummy memory array DMA always conductive or to provide another wiring to give grounding voltage VSS to the reading line RL.

An oxide film 62 is formed in the gap between each digit line DL of the digit line group and each reading line RL of the reading line group and a P(plasma)-SiN film 63 as an insulating film is formed so as to cover them. An oxide film 64 as an insulating film is formed over the P-SiN film 63 and a lower electrode layer 65 as a metal wiring layer is formed over the surface of the oxide film 64. The lower electrode layer 65 is made of Ta, TaN, Ti, or TiN. A via hole VH1 is formed between the upper face of each reading line RL and the lower face of the lower electrode layer 65. The via hole VH1 includes a buried tungsten layer in the center area and a barrier metal layer in the surface area.

A tunnel magnetoresistance element layer 66 and an upper electrode layer 67 as a metal wiring layer are stacked over the lower electrode layer 65. In the memory array MA, the tunnel magnetoresistance element layer 66 and upper electrode layer are patterned so as to form a group of tunnel magnetoresistance elements TMR and a group of upper electrodes EL2 and in the dummy memory array DMA, the tunnel magnetoresistance element layer 66 and upper electrode layer 67 are not patterned.

Next, an LT (Low Temperature)-SiN film 68 as an insulating film is formed in the memory array MA and dummy memory array DMA. In the memory array MA, the lower electrode layer 65 and LT-SiN film 68 are patterned so as to form a lower electrode EL1 and in the dummy memory array DMA, they are not patterned.

Next, in the memory array MA and dummy memory array DMA, an oxide film 69 as an insulating film is formed. A bit line layer 70 as a metal wiring layer is formed over the oxide film 69 and the bit line layer 70 is patterned so as to form a group of bit lines BL. In the memory array MA, a via hole VH2 is formed between the upper face of each upper electrode EL2 and the lower face of the bit line BL and in the dummy memory array DMA, a via hole VH2 is not formed. The distance between the upper electrode layer 67 and the bit line layer 70 is, for example, 50 nm. The distance between the lower electrode layer 65 and the bit line layer 70 is, for example, 130 nm. An LT-SiN film 71 as an insulating film and an oxide film 72 as an insulating film are stacked over the group of bit lines BL.

In other words, in the MRAM according to the first embodiment, the structure of the memory array MA is the same as that in the related art but the structure of the dummy memory array DMA is different from that in the related art. In the memory array MA, the lower electrode layer 65, tunnel magnetoresistance element layer 66 and upper electrode layer 67 are patterned and each upper electrode EL2 is coupled to a bit line BL thorough a via hole VH2. On the other hand, in the dummy memory array DMA, the lower electrode layer 65, tunnel magnetoresistance element layer 66 and upper electrode layer 67 are not patterned and a via hole VH2 is not formed between the upper electrode layer 67 and bit line BL and the reading lines RL are grounded. Therefore, in the dummy memory array DMA, a capacitor is formed between each digit line DL and the lower electrode layer 65 and reading line RL and a capacitor is formed between each bit line BL and the upper electrode layer 67 is formed. In the dummy memory array DMA, the tunnel magnetoresistance element layer 66 is used as a conductive layer with a prescribed resistance value.

Referring to FIGS. 7 to 9, in the area A1 of the dummy memory array DMA, a capacitor C5 is formed between each bit line BL and the upper electrode layer 67. In the area A2 of the dummy memory array DMA, a capacitor C6 is formed between each bit line BL and the upper electrode layer 67. In the area A3 of the dummy memory array DMA, a capacitor C2 is formed between each digit line DL and the lower electrode layer 65 and reading line RL. In the area A4 of the dummy memory array DMA, a capacitor C3 is formed between each digit line DL and the lower electrode layer 65 and reading line RL.

In the areas A1, A2, and A5 to A8 of the dummy memory array DMA, the digit lines DL (dummy digit lines) are coupled to the supply voltage VDD line L1 or L2 and a capacitor C1 or C4 is formed between each digit line and the lower electrode layer 65 and reading line RL. In the areas A3, A4, and A5 to A8 of the dummy memory array DMA, the bit lines DL (dummy bit lines) are coupled to the supply voltage VDD line L1 or L2 and a capacitor C1 or C4 is formed between each bit line and the upper electrode layer 67.

As mentioned above, in the first embodiment, since capacitors C1 to C6 are formed in the dummy memory array DMA around the memory array MA in order to decrease the peak value of current, noise can be reduced without the need for an increase in chip area.

When the oxide films 62, 64, 69, and 72 are made of a material with a high dielectric constant, the capacitances of the capacitors C1 to C6 can be increased to enhance the noise reduction effect.

Variations of the First Embodiment

Figure 15B:
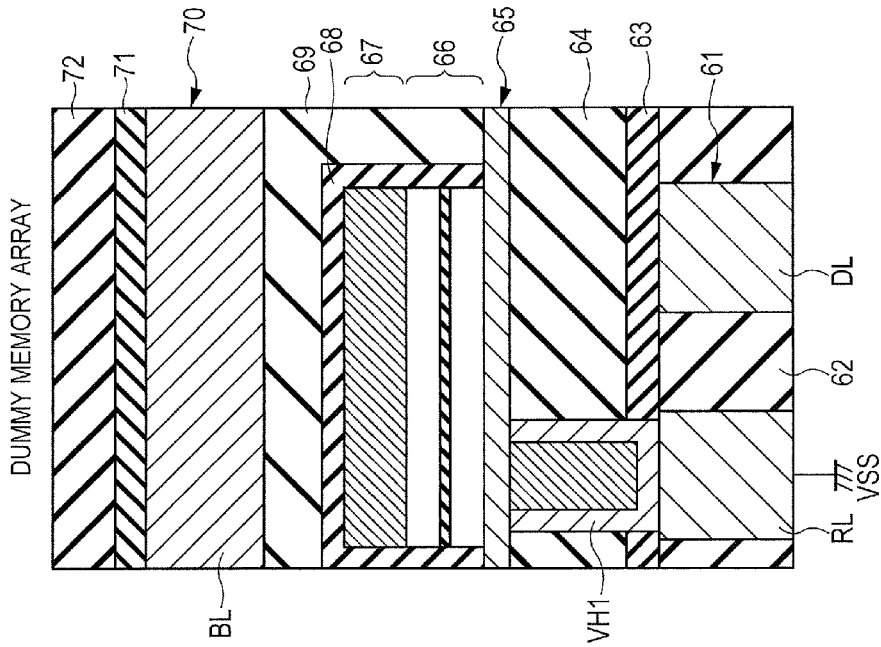
Figure 15A:
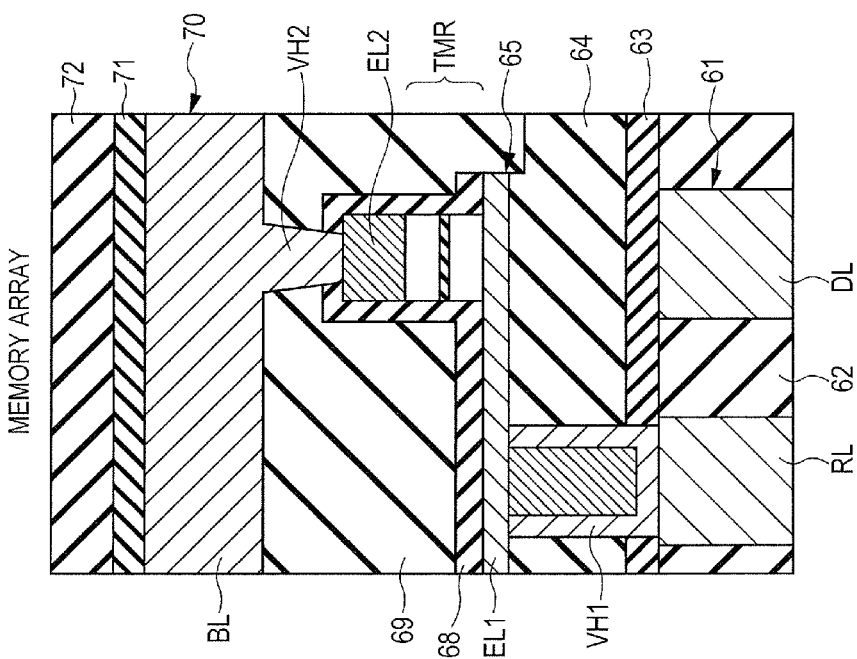

Next, various variations of the first embodiment will be described. FIGS. 14A and 14B are plan views of a first variation of the first embodiment which are compared to FIGS. 12A and 12B respectively. FIG. 15A is a sectional view taken along the line XVA-XVA of FIG. 14A and FIG. 15B is a sectional view taken along the line XVB-XVB of FIG. 14B. As shown in FIGS. 14A and 14B and FIGS. 15A and 15B, in each unit memory cell area of the dummy memory array DMA (area corresponding to one memory cell MC), the tunnel magnetoresistance element layer 66 and upper electrode layer 67 may be patterned so that their sizes are almost equal to that of the lower electrode EL1.

Figure 16B:
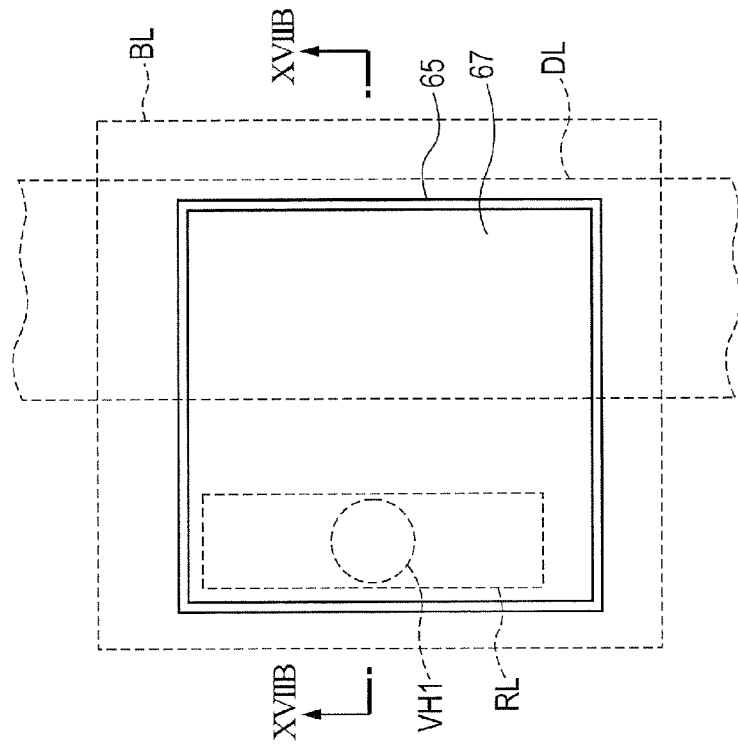
Figure 16A:
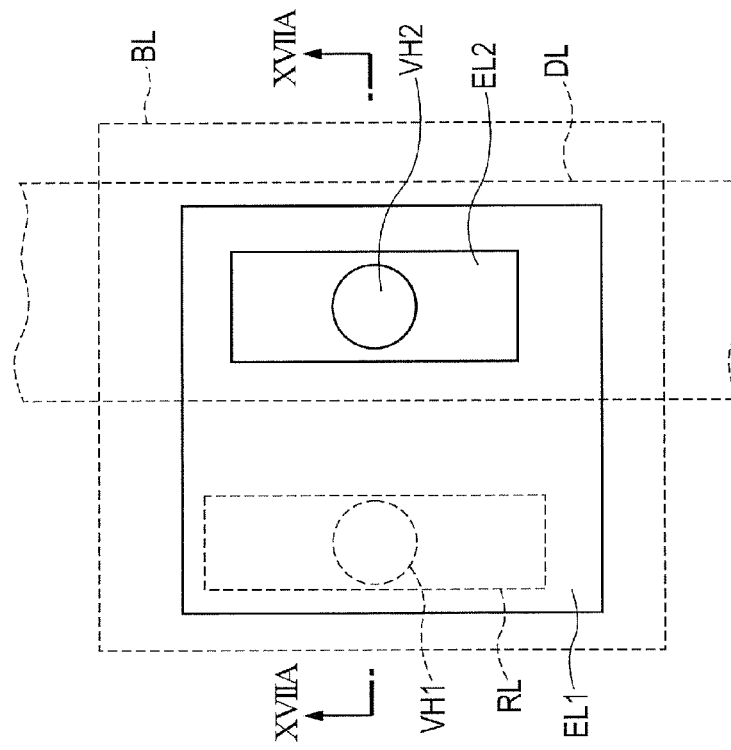

FIGS. 16A and 16B are plan views of a second variation of the first embodiment which are compared to FIGS. 12A and 12B respectively. FIG. 17A is a sectional view taken along the line XVIIA-XVIIA of FIG. 16A and FIG. 17B is a sectional view taken along the line XVIIB-XVIIB of FIG. 16B. As shown in FIGS. 16A and 16B and FIGS. 17A and 17B, in each unit memory cell area of the dummy memory array DMA, the lower electrode layer 65, tunnel magnetoresistance element layer 66 and upper electrode layer 67 may be patterned so that their sizes are almost equal to that of the lower electrode EL1.

FIGS. 18A and 18B are plan views of a third variation of the first embodiment which are compared to FIGS. 12A and 12B respectively. FIG. 19A is a sectional view taken along the line XIXA-XIXA of FIG. 18A and FIG. 19B is a sectional view taken along the line XIXB-XIXB of FIG. 18B. As shown in FIGS. 18A and 18B and FIGS. 19A and 19B, in each unit memory cell area of the dummy memory array DMA, the tunnel magnetoresistance element layer 66 and upper electrode layer 67 may be patterned so that their sizes are almost equal to that of the tunnel magnetoresistance element TMR. In this variation, a capacitor is formed between the bit line layer 70 and upper electrode layer 67 and also a capacitor is formed between the bit lie layer 70 and lower electrode layer 65.

Figure 20B:
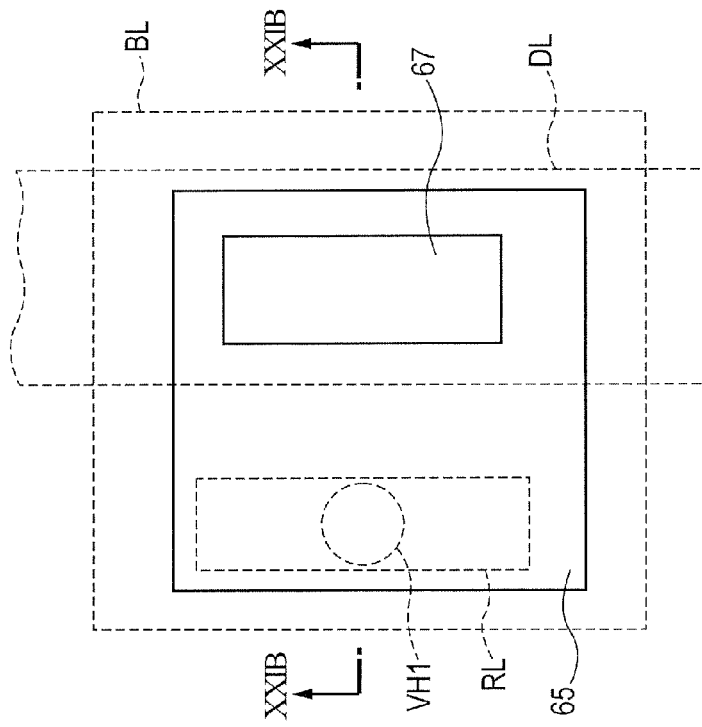
Figure 20A:
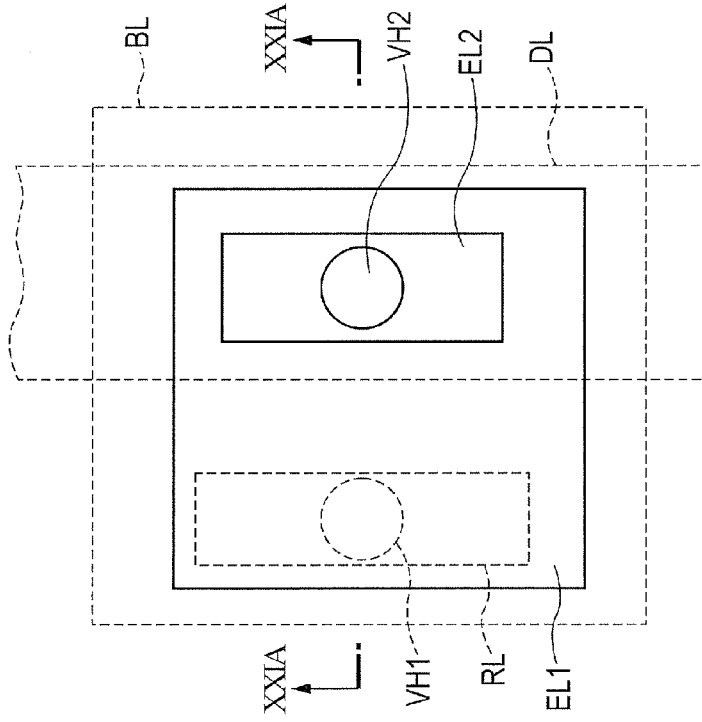
Figure 21A:
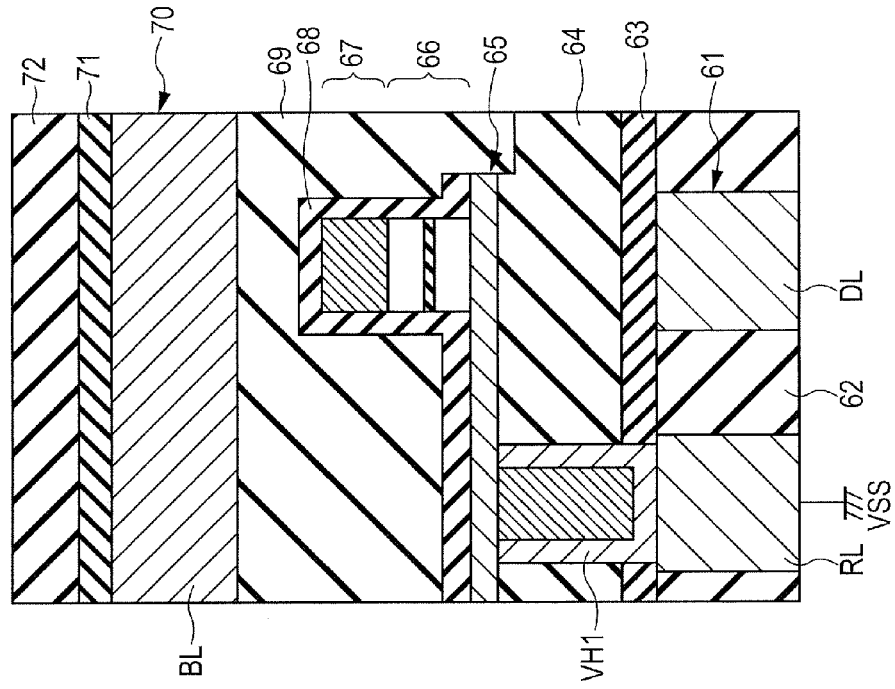
Figure 21B:
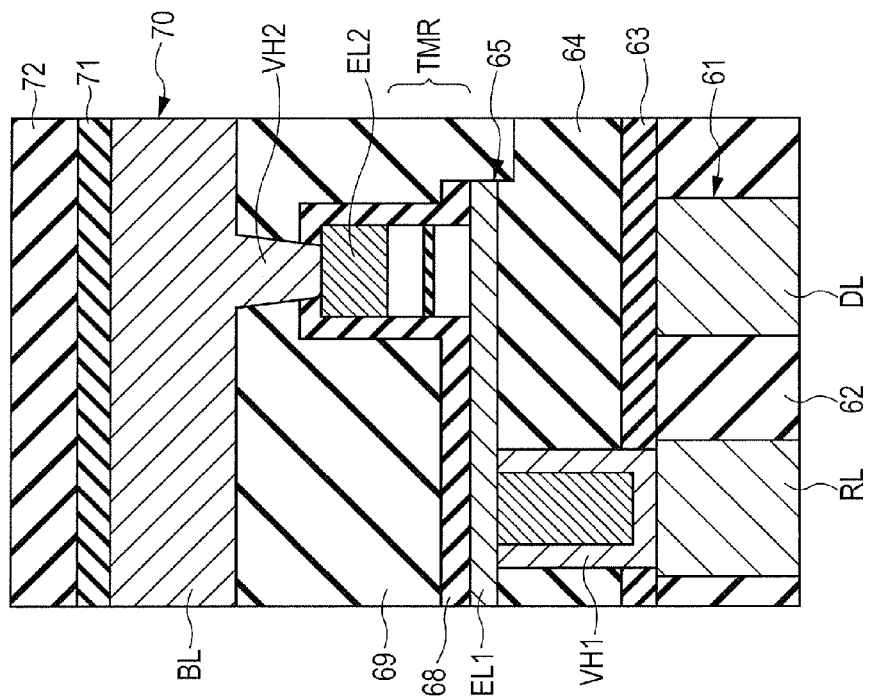

FIGS. 20A and 18B are plan views of a fourth variation of the first embodiment which are compared to FIGS. 18A and 18B respectively. FIG. 21A is a sectional view taken along the line XXIA-XXIA of FIG. 20A and FIG. 21B is a sectional view taken along the line XXIB-XXIB of FIG. 20B. As shown in FIGS. 20A and 20B and FIGS. 21A and 21B, in each unit memory cell area of the dummy memory array DMA, the lower electrode layer 65 may be patterned so that its size is almost equal to that of the lower electrode EL1. The tunnel magnetoresistance element layer 66 and upper electrode layer 67 are patterned so that their sizes are almost equal to the tunnel magnetoresistance element TMR.

Figure 22B:
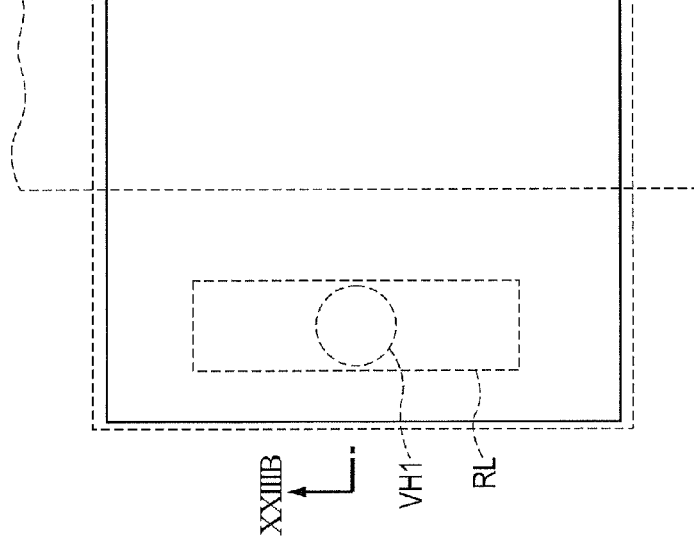
Figure 22A:
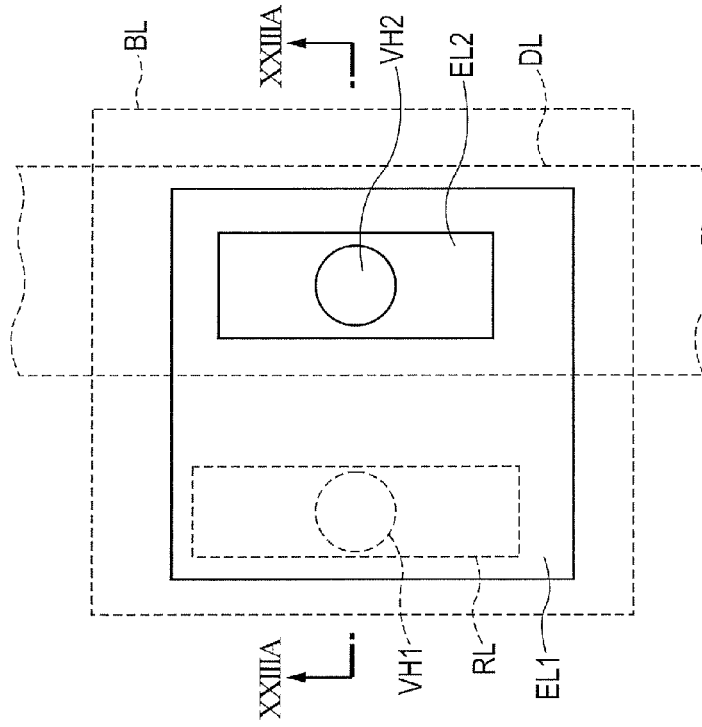
Figure 23B:
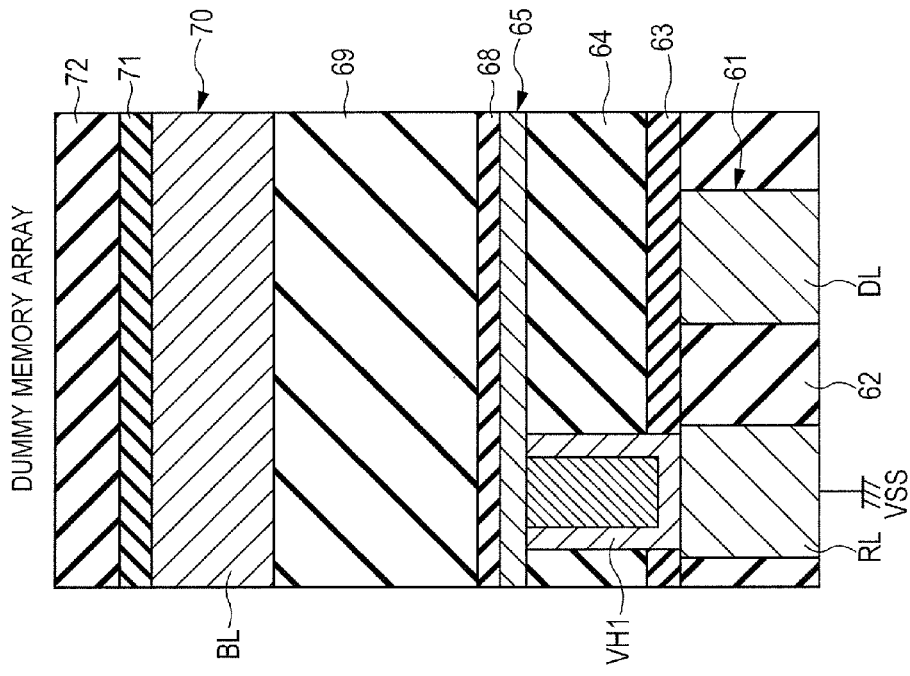
Figure 23A:
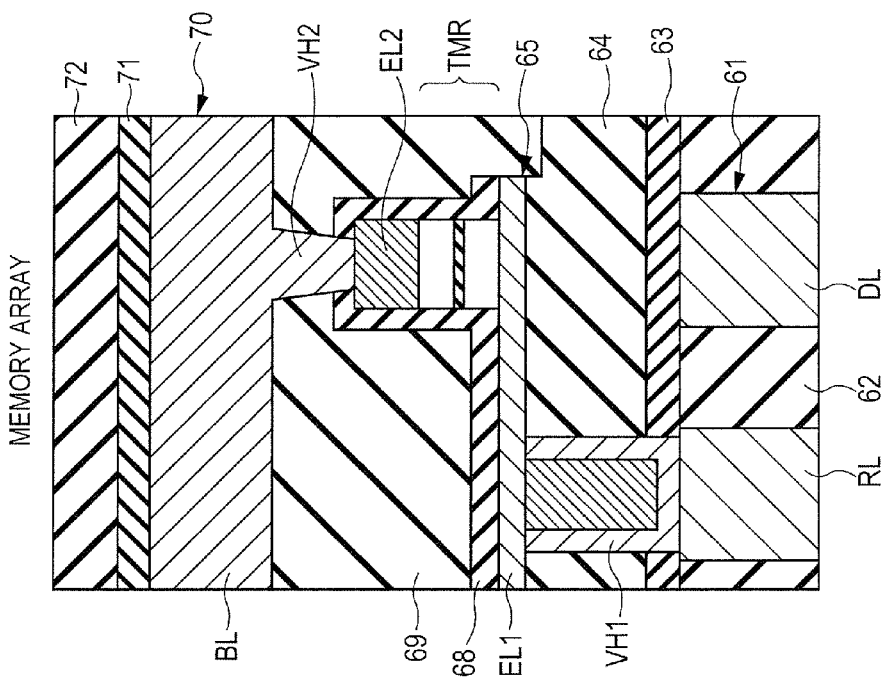

FIGS. 22A and 22B are plan views of a fifth variation of the first embodiment which are compared to FIGS. 12A and 12B respectively. FIG. 23A is a sectional view taken along the line XXIIIA-XXIIIA of FIG. 22A and FIG. 23B is a sectional view taken along the line XXIIIB-XXIIIB of FIG. 22B. As shown in FIGS. 22A and 22B and FIGS. 23A and 23B, in the entire dummy memory array DMA, the tunnel magnetoresistance element layer 66 and upper electrode layer 67 may be omitted. In this variation, a capacitor is formed between the bit line layer 70 and lower electrode layer 65.

Figure 24A:
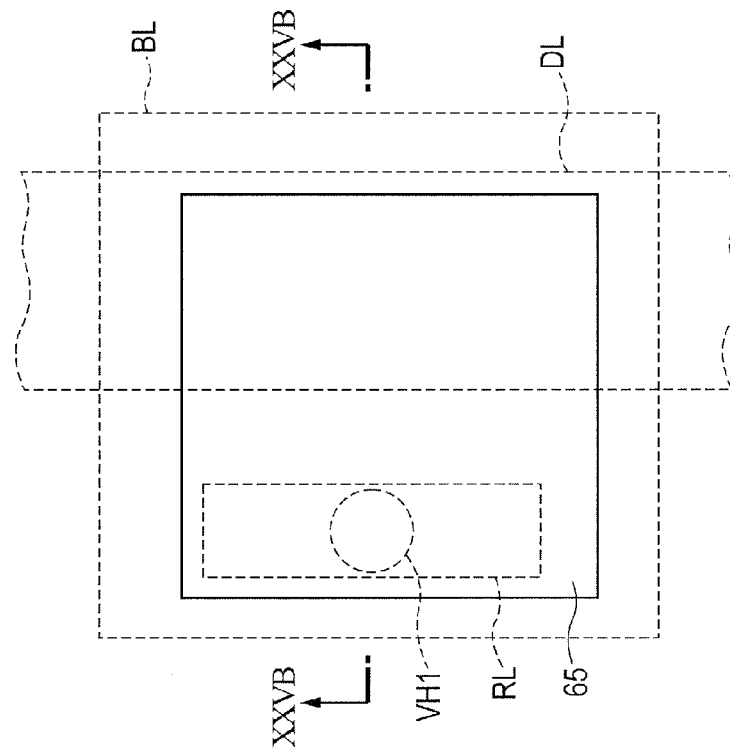
Figure 24B:
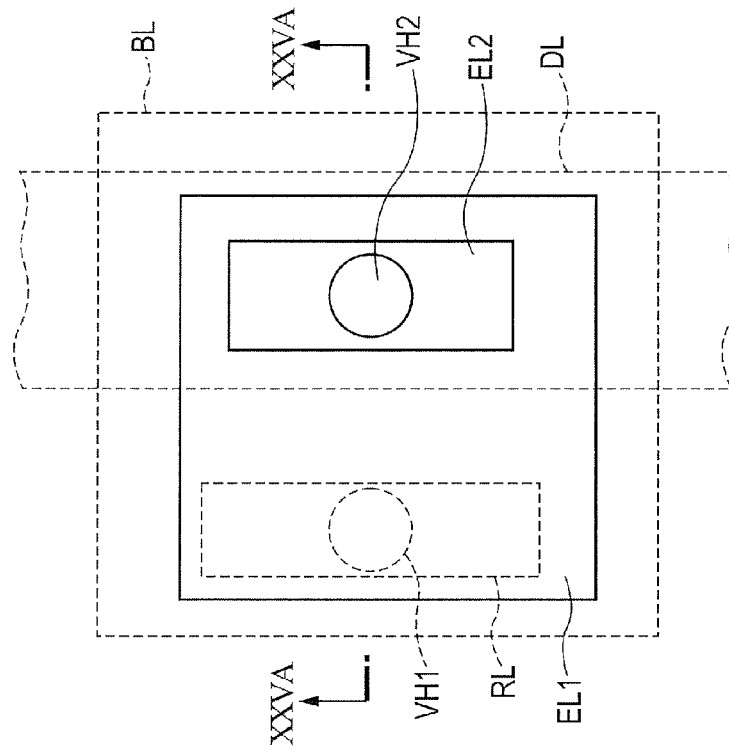

FIGS. 24A and 24B are plan views of a sixth variation of the first embodiment which are compared to FIGS. 22A and 22B respectively. FIG. 25A is a sectional view taken along the line XXVA-XXVA of FIG. 24A and FIG. 25B is a sectional view taken along the line XXVB-XXVB of FIG. 24B. As shown in FIGS. 24A and 24B and FIGS. 25A and 25B, in each unit memory cell area of the dummy memory array DMA, the tunnel magnetoresistance element layer 66 and upper electrode layer 67 may be omitted and the lower electrode layer 65 may be patterned so that its size is almost equal to that of the lower electrode EL1.

Figure 26B:
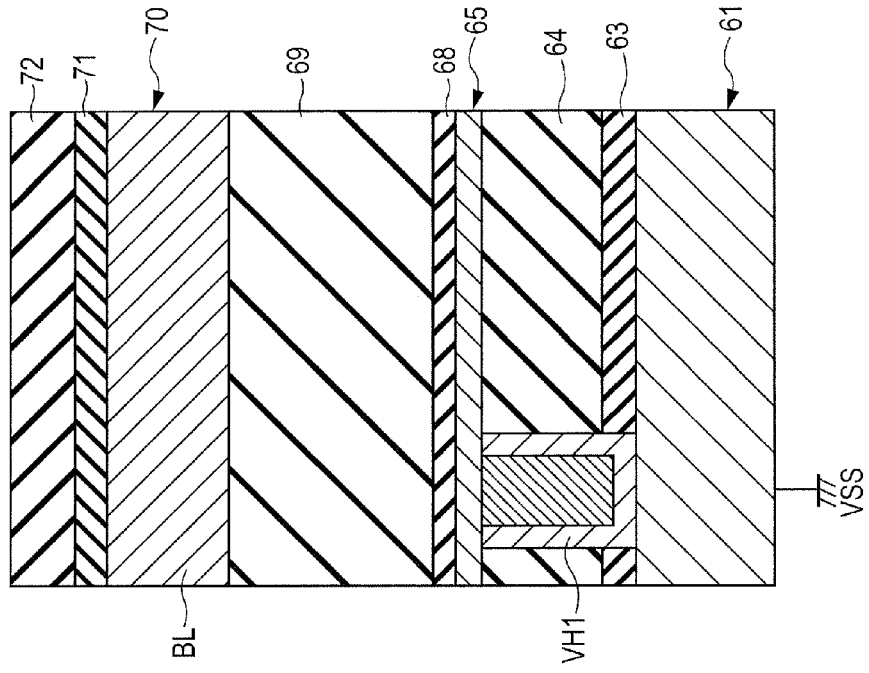
Figure 26A:
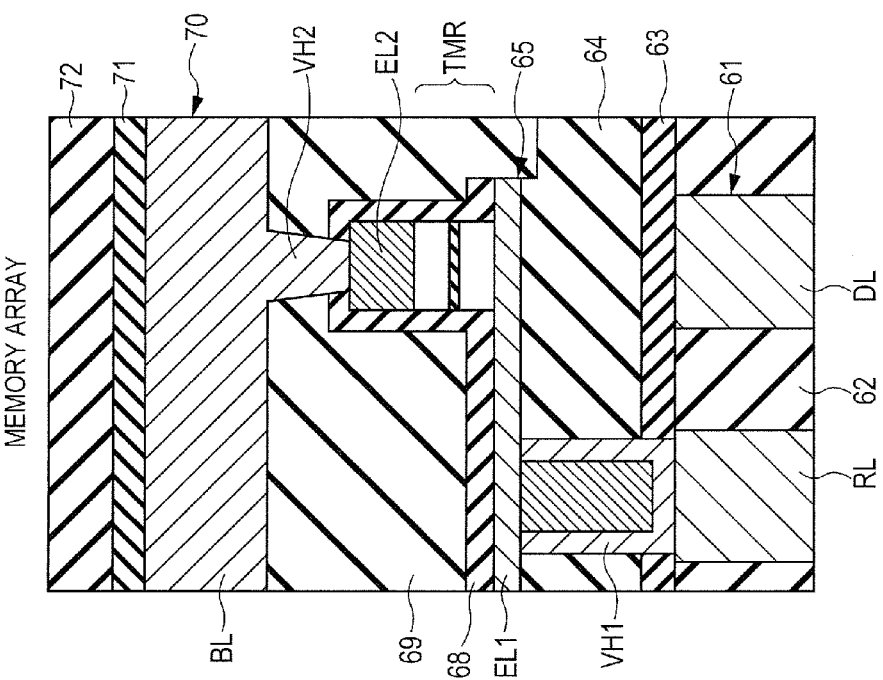

FIGS. 26A and 26B are plan views of a seventh variation of the first embodiment which are compared to FIGS. 23A and 23B respectively. As shown in FIGS. 26A and 26B, in the areas A1, A2, and A5 to A8 of the dummy memory array DMA as shown in FIG. 9, the digit line layer 61 may not be patterned. However, if that is the case, no capacitor is formed between the digit line DL and the lower electrode layer 65 and reading line RL. The capacitor between each bit line BL and the lower electrode layer 65 is not omitted and can be used.

FIGS. 27A and 27B are plan views of an eighth variation of the first embodiment which are compared to FIGS. 26A and 26B respectively. As shown in FIGS. 27A and 27B, in each unit memory cell area of the dummy memory array DMA of the variation shown in FIGS. 26A and 26B, the lower electrode layer 65 may be patterned so that its size is almost equal to that of the lower electrode EL1.

Second Embodiment

Figure 28B:
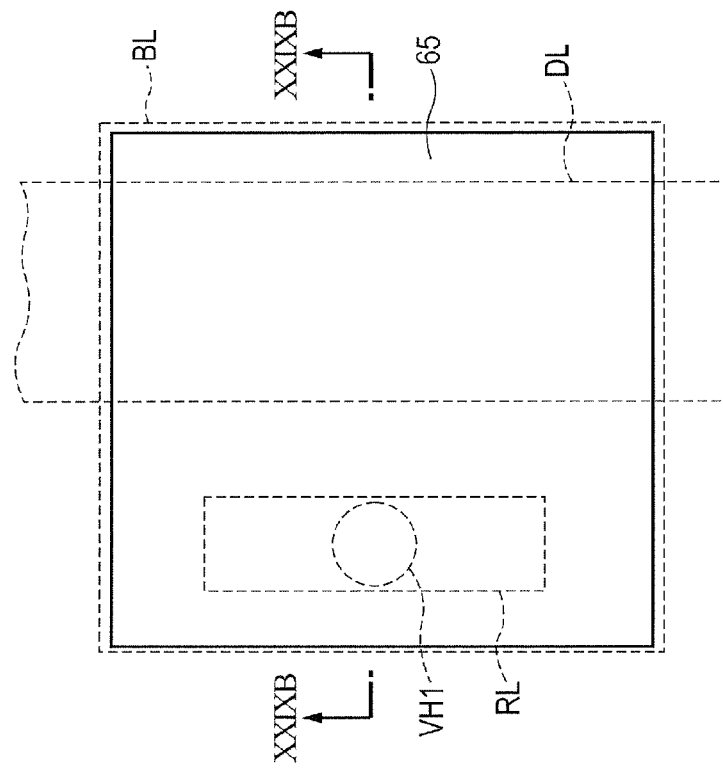
Figure 28A:
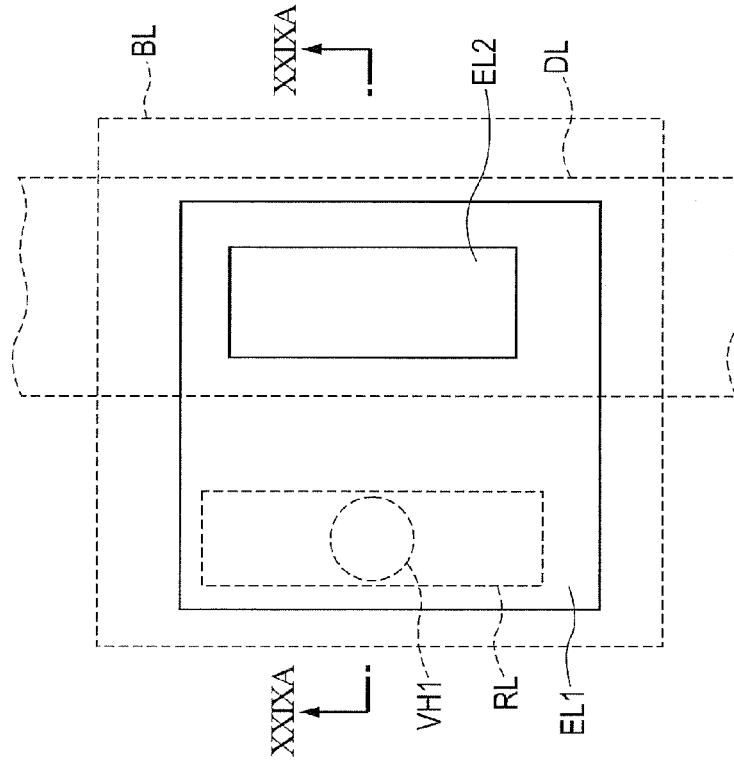
Figure 29B:
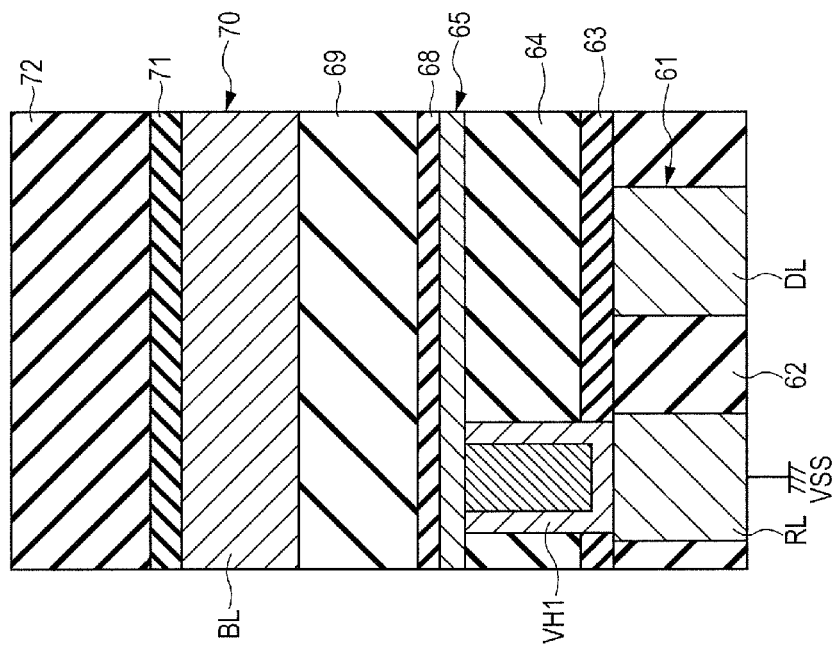
Figure 29A:
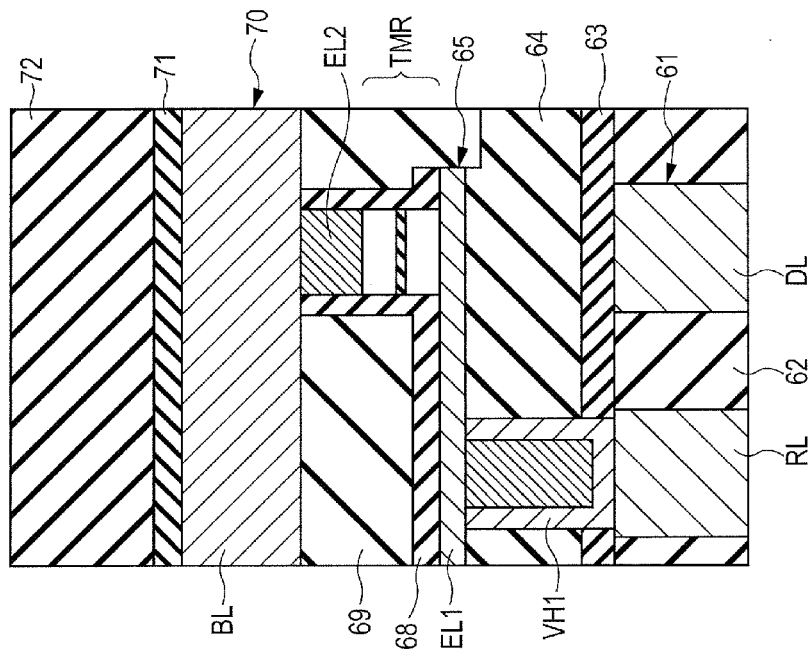

FIGS. 28A and 28B are plan views of the second embodiment of the present invention which are compared to FIGS. 22A and 22B respectively. FIG. 29A is a sectional view taken along the line XXIXA-XXIXA of FIG. 28A and FIG. 29B is a sectional view taken along the line XXIXB-XXIXB of FIG. 28B.

In the second embodiment, as shown in FIGS. 28A and 28B and FIGS. 29A and 29B, in each unit memory cell area of the memory array MA, a via hole VH2 is not made and a bit line BL is formed directly over the upper electrode EL2. In the dummy memory array DMA, a tunnel magnetoresistance element layer 66 is not formed. In the dummy memory array DMA, the distance between the lower electrode layer 65 and bit line BL is, for example, 80 nm, so the capacitance of the capacitor between the bit line BL and lower electrode layer 65 can be larger than in the first embodiment, permitting effective removal of noise.

Variations of the Second Embodiment

Figure 30A:
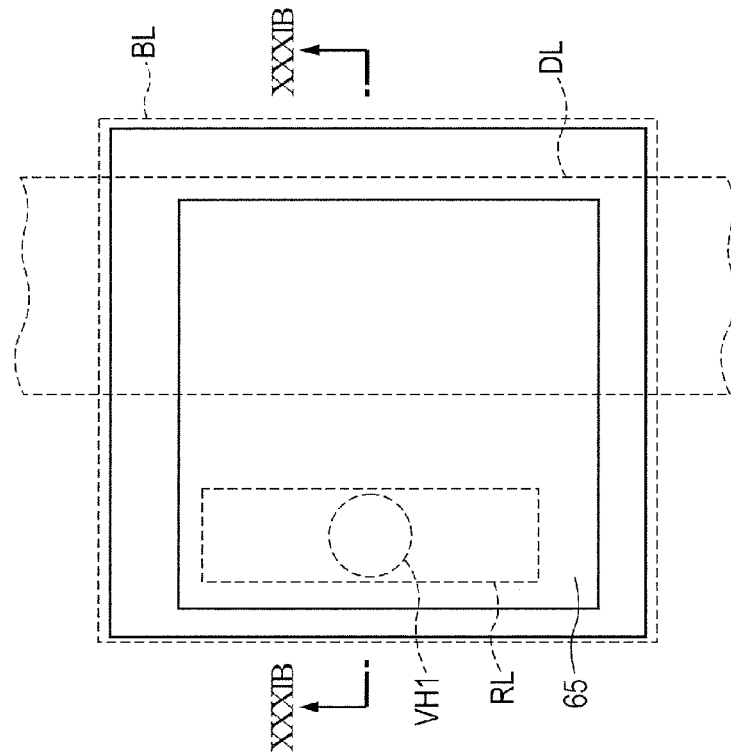
Figure 30B:
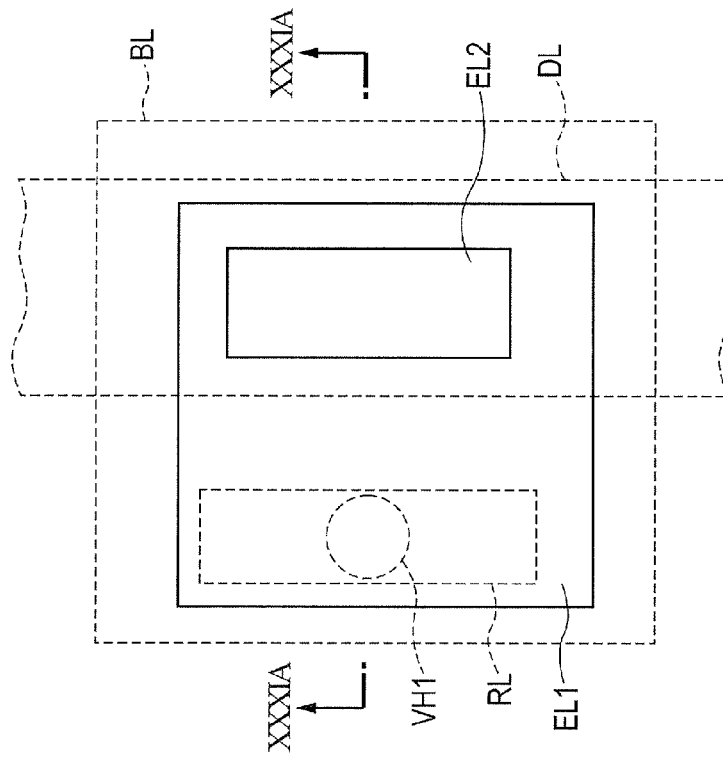

Next, various variations of the second embodiment will be described. FIGS. 30A and 30B are plan views of a first variation of the second embodiment which are compared to FIGS. 28A and 28B respectively. FIG. 31A is a sectional view taken along the line XXXIA-XXXIA of FIG. 30A and FIG. 31B is a sectional view taken along the line XXXIB-XXXIB of FIG. 30B. As shown in FIGS. 30A and 30B and FIGS. 31A and 31B, in each unit memory cell area of the dummy memory array DMA (area corresponding to one memory cell MC), the lower electrode layer 65 and LT-SiN film 68 may be patterned so that their sizes are almost equal to that of the lower electrode EL1.

Figure 32B:
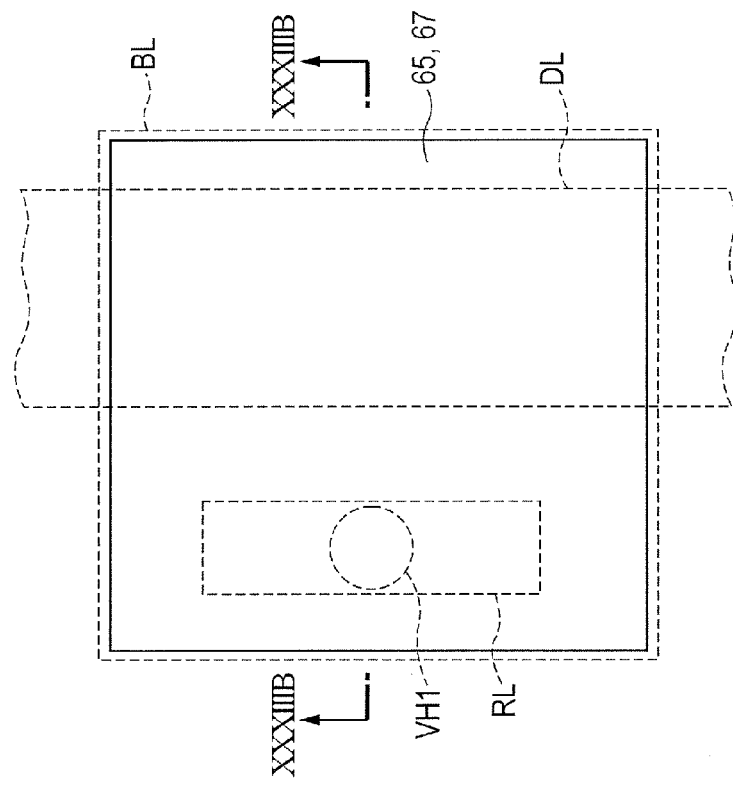
Figure 32A:
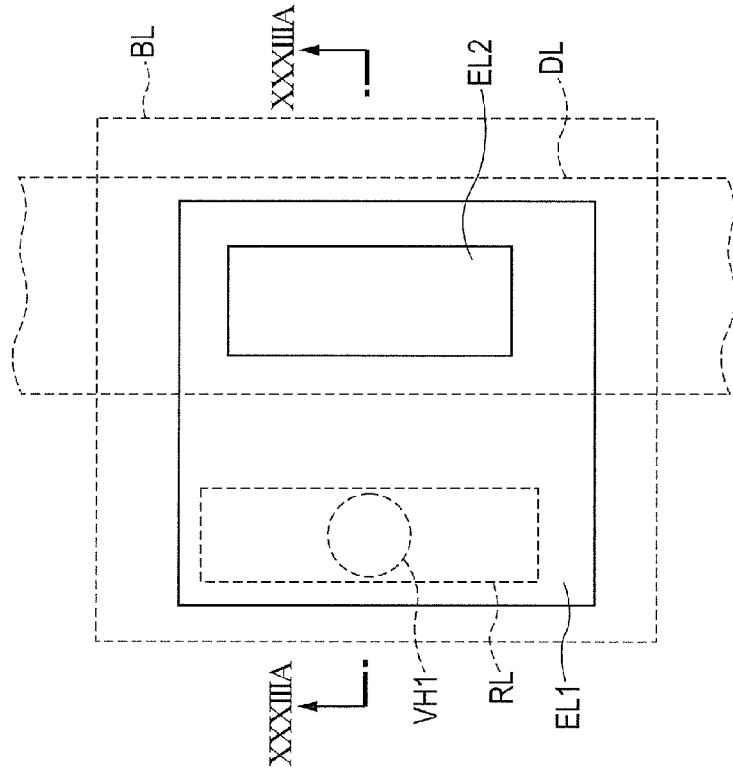

FIGS. 32A and 32B are plan views of a second variation of the second embodiment which are compared to FIGS. 29A and 29B respectively. FIG. 33A is a sectional view taken along the line XXXIIIA-XXXIIIA of FIG. 32A and FIG. 33B is a sectional view taken along the line XXXIIIB-XXXIIIB of FIG. 32B. As shown in FIGS. 32A and 32B and FIGS. 33A and 33B, in the areas A3 to A8 of the dummy memory array DMA as shown in FIG. 9, the tunnel magnetoresistance element layer 66 and upper electrode layer 67 may not be patterned. However, if that is the case, no capacitor is formed between the bit line BL and the upper electrode layer 67. The capacitor between each digit line DL and the reading line RL is not omitted and can be used.

Figure 34A:
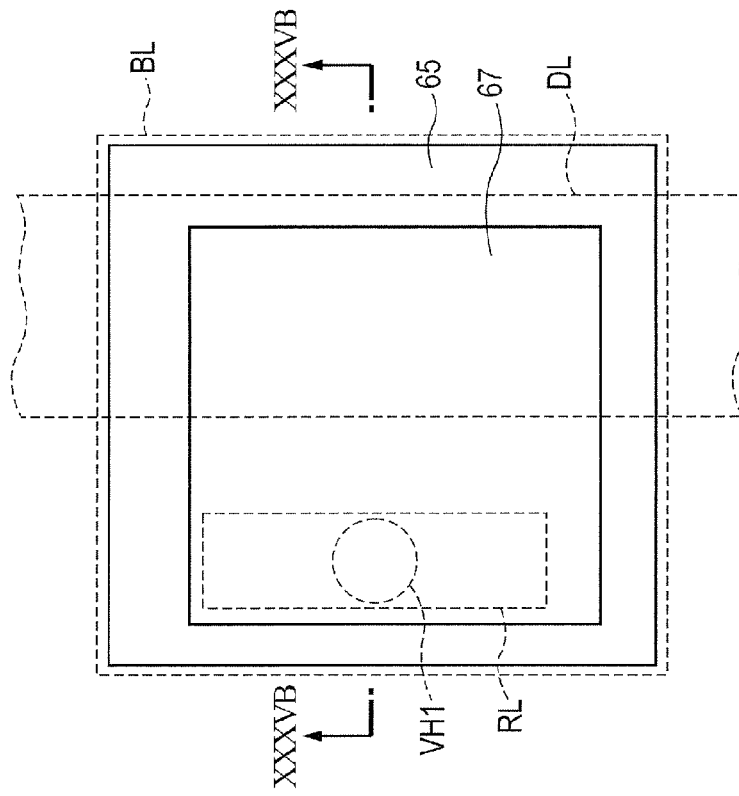
Figure 34B:
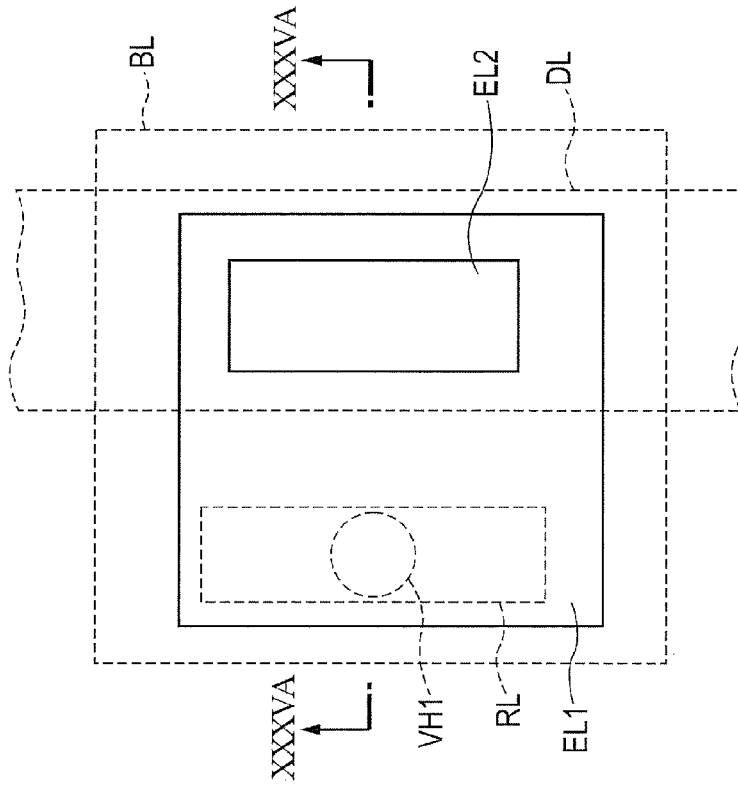

FIGS. 34A and 34B are plan views of a third variation of the second embodiment which are compared to FIGS. 32A and 32B respectively. FIG. 35A is a sectional view taken along the line XXXVA-XXXVA of FIG. 34A and FIG. 35B is a sectional view taken along the line XXXVB-XXXVB of FIG. 34B. As shown in FIGS. 34A and 34B and FIGS. 35A and 35B, in each unit memory cell area of the dummy memory array DMA, the tunnel magnetoresistance element layer 66 and upper electrode layer 67 may be patterned so that their sizes are almost equal to that of the lower electrode EL1.

Figure 36A:
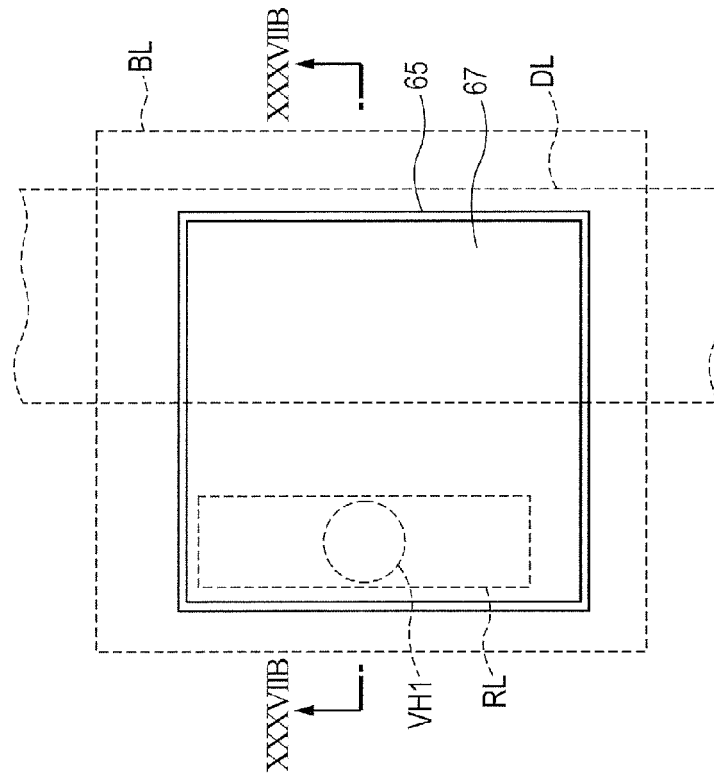
Figure 36B:
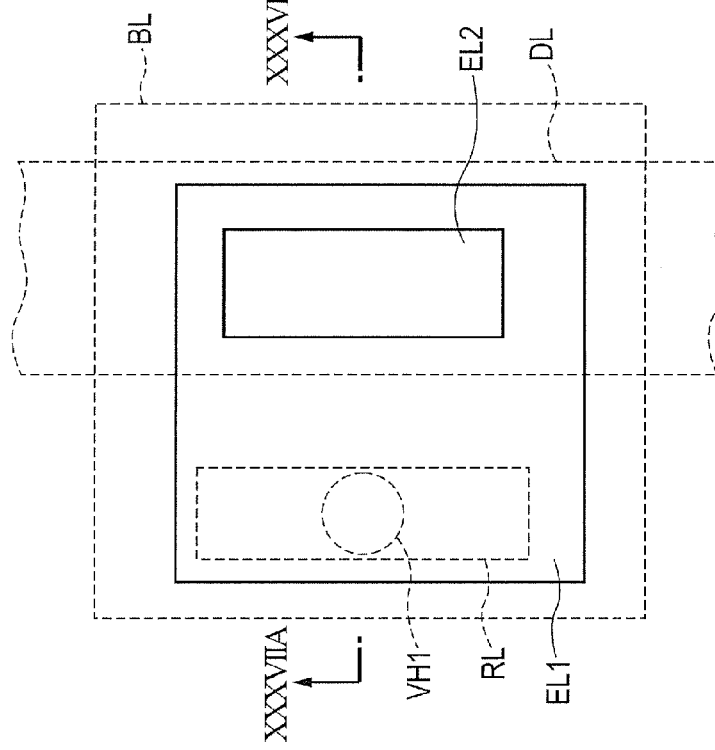

FIGS. 36A and 36B are plan views of a fourth variation of the second embodiment which are compared to FIGS. 34A and 34B respectively. FIG. 37A is a sectional view taken along the line XXXVIIA-XXXVIIA of FIG. 36A and FIG. 37B is a sectional view taken along the line XXXVIIB-XXX-VIIB of FIG. 36B. As shown in FIGS. 36A and 36B and FIGS. 37A and 37B, in each unit memory cell area of the dummy memory array DMA, the lower electrode layer 65, tunnel magnetoresistance element layer 66 and upper electrode layer 67 may be patterned so that their sizes are almost equal to that of the lower electrode EL1.

FIGS. 38A and 38B are plan views of a fifth variation of the second embodiment which are compared to FIGS. 33A and 33B respectively. FIG. 39A is a sectional view taken along the line XXXIXA-XXXIXA of FIG. 38A and FIG. 39B is a sectional view taken along the line XXXIXB-XXXIXB of FIG. 38B. As shown in FIGS. 38A and 38B and FIGS. 39A and 39B, in each unit memory cell area of the dummy memory array DMA, the tunnel magnetoresistance element layer 66 and upper electrode layer 67 may be patterned so that their sizes are almost equal to that of the tunnel magnetoresistance element TMR.

Figure 40A:
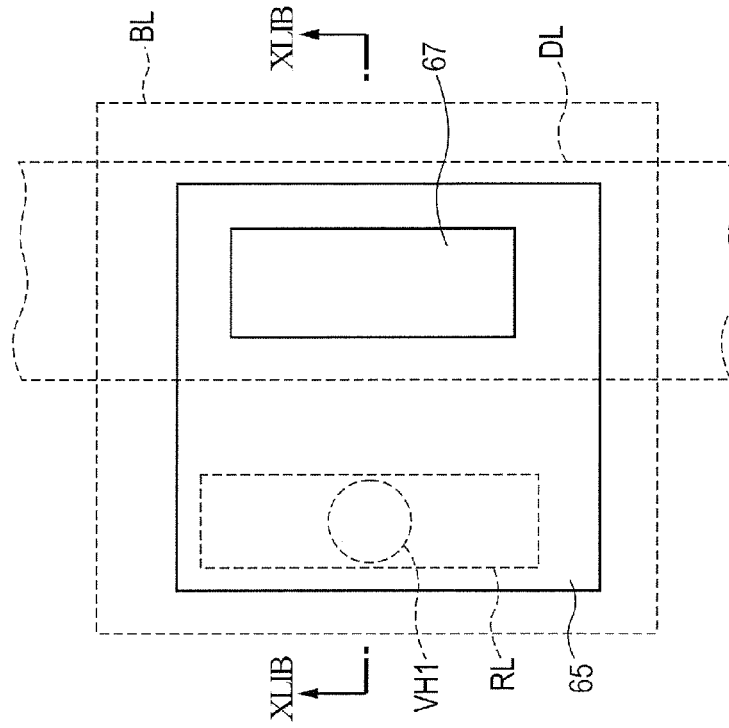
Figure 40B:
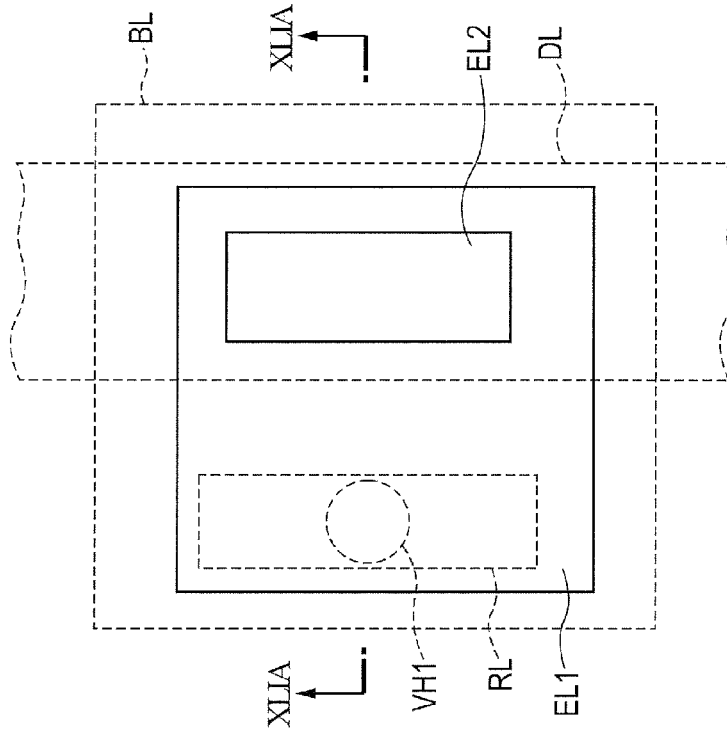
Figure 41A:
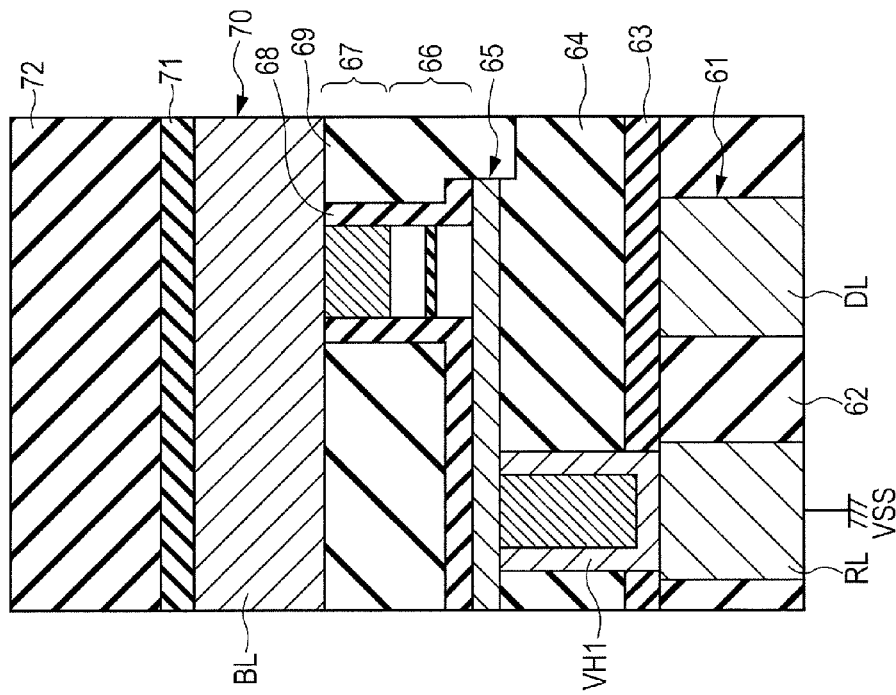
Figure 41B:
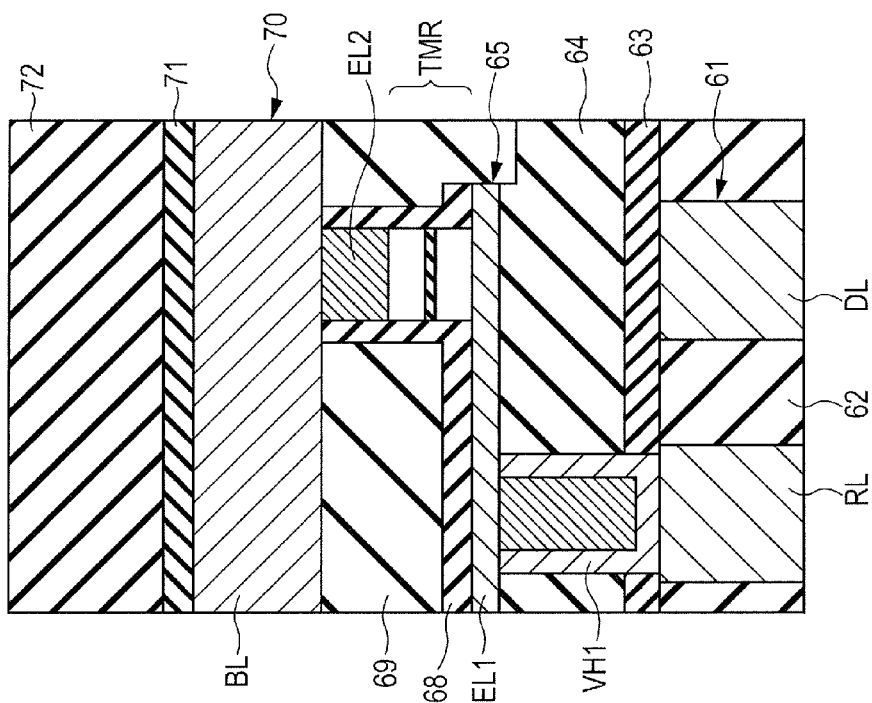

FIGS. 40A and 40B are plan views of a sixth variation of the second embodiment which are compared to FIGS. 38A and 38B respectively. FIG. 41A is a sectional view taken along the line XLIA-XLIA of FIG. 40A and FIG. 41B is a sectional view taken along the line XLIB-XLIB of FIG. 40B. As shown in FIGS. 40A and 40B and FIGS. 41A and 41B, in each unit memory cell area of the dummy memory array DMA, the tunnel magnetoresistance element layer 66 and upper electrode layer 67 may be patterned so that their sizes are almost equal to that of the tunnel magnetoresistance element TMR and the lower electrode layer 65 may be patterned so that its size is almost equal to that of the lower electrode EL1.

Variations of the First and Second Embodiments

Next, various variations of the first and second embodiments will be described. In the variation shown in FIGS. 24A and 24B and FIGS. 25A and 25B and the variation shown in FIGS. 30A and 30B and FIGS. 31A and 31B, in the dummy memory array DMA, the tunnel magnetoresistance element layer 66 and upper electrode layer 67 are omitted. Consequently a capacitor is formed between each bit line BL and each lower electrode EL1 and also a capacitor is formed between each digit line DL and the lower electrode EL1. Depending on the areas A1 to A8 of the dummy memory array DMA (FIG. 9), at least one layer of the bit line layer 70, lower electrode layer 65, and digit line layer 61 may not be patterned. Next, further variations of the variation shown in FIGS. 24A and 24B and FIGS. 25A and 25B and further variations of the variation shown in FIGS. 30A and 30B and FIGS. 31A and 31B will be described.

Figure 42A:
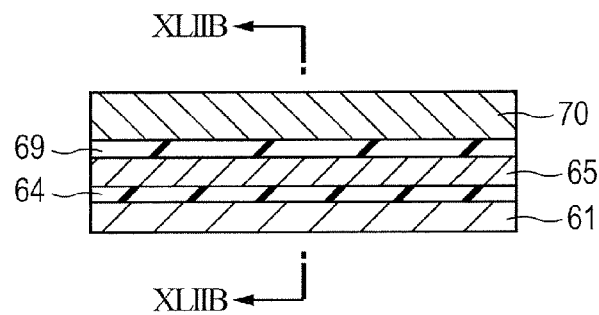
Figure 42B:
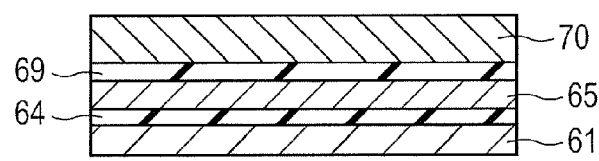
Figure 42C:
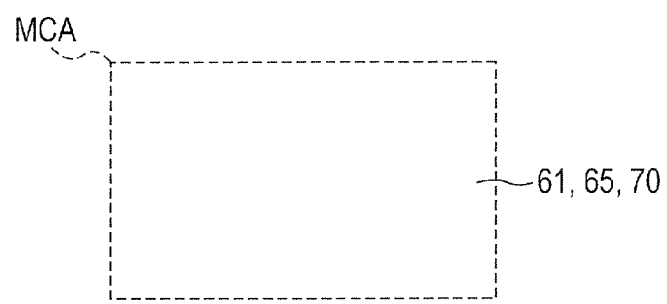

FIG. 42A is a sectional view of a variation of the first and second embodiments, showing the areas A5 to A8 of the dummy memory array DMA, which is taken in a direction parallel to the bit line BL. FIG. 42B is a sectional view taken along the XLIIB-XLIIB line of FIG. 42A, showing the areas A5 to A8 of the dummy memory array DMA, which is taken in a direction parallel to the digit line DL. FIG. 42C is a plan view showing the structure of each unit memory cell area MCA (area corresponding to one memory cell MC) of the areas A5 to A8 of the dummy memory array DMA. In this variation, as shown in FIGS. 42A to 42C, the tunnel magnetoresistance element layer 66 and upper electrode layer 67 are omitted in the dummy memory array DMA.

In the areas A5 to A8 of the dummy memory array DMA, the bit line layer 70, lower electrode layer 65, and digit line layer 61 are not patterned. The lower electrode layer 65 and digit line layer 61 are coupled to each other through a via hole VH1 (not shown) and the digit line layer 61 is grounded. The oxide films 64 and 69 are made of material with a high dielectric constant. In this variation, the bit line layer 70 is coupled to the supply voltage VDD line L1 (FIG. 7) or supply voltage VDD line L2 (FIG. 8). The capacitor between the bit line layer 70 and lower electrode layer 65 is capacitor C1 (FIG. 7) or capacitor C4 (FIG. 8).

Figure 43A:
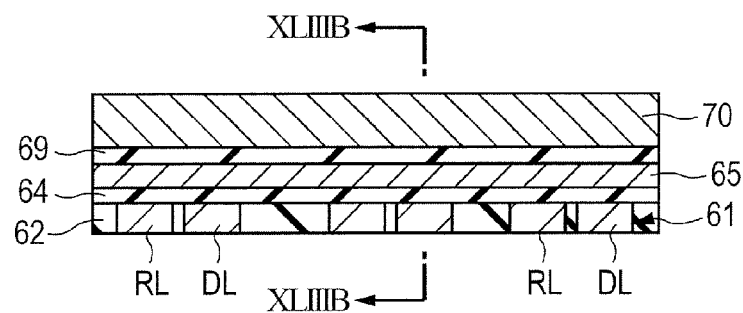
Figure 43B:
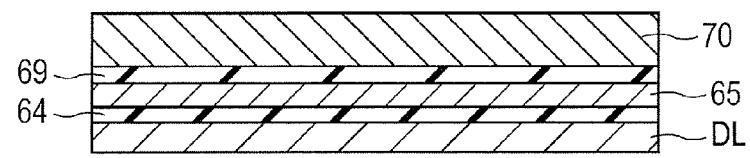
Figure 43C:
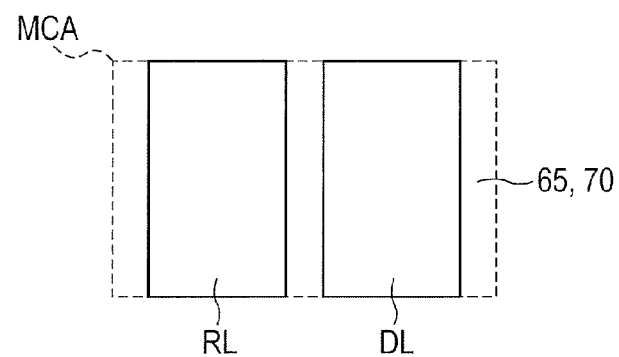

FIG. 43A is a sectional view of another variation of the first and second embodiments, showing the areas A3 to A8 of the dummy memory array DMA, which is taken in a direction parallel to the bit line BL. FIG. 43B is a sectional view taken along the XLIIIB-XLIIIB line of FIG. 43A, showing the areas A3 to A8 of the dummy memory array DMA, which is taken in a direction parallel to the digit line DL. FIG. 43C is a plan view showing the structure of each unit memory cell area MCA of the areas A3 to A8 of the dummy memory array DMA. In this variation, as shown in FIGS. 43A to 43C, the tunnel magnetoresistance element layer 66 and upper electrode layer 67 are omitted in the dummy memory area DMA.

In the areas A3 to A8 of the dummy memory array DMA, the bit line layer 70 and lower electrode layer 65 are not patterned, and only the digit line layer 61 is patterned. The digit line layer 61 is used to form plural groups of digit lines DL and reading lines RL. The lower electrode layer 65 and reading lines RL are coupled to each other through via holes VH1 (not shown) and the reading lines RL are grounded. The oxide films 62, 64 and 69 are made of material with a high dielectric constant.

In this variation, the bit line layer 70 in the areas A3 to A8 is coupled to the supply voltage VDD line L1 (FIG. 7) or supply voltage VDD line L2 (FIG. 8). The capacitor between the bit line layer 70 and lower electrode layer 65 is capacitor C1 (FIG. 7) or capacitor C4 (FIG. 8). The digit line DL is used in the same way as in the first embodiment.

Figure 44A:
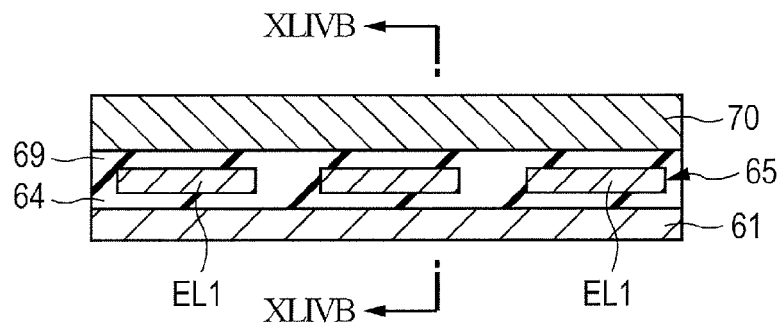
Figure 44B:
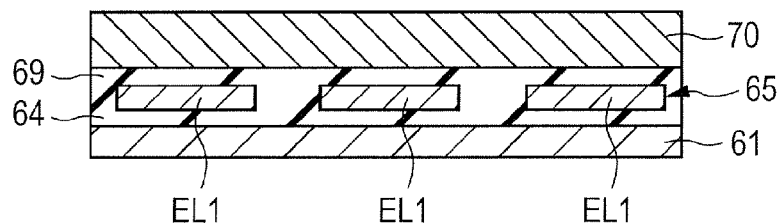
Figure 44C:
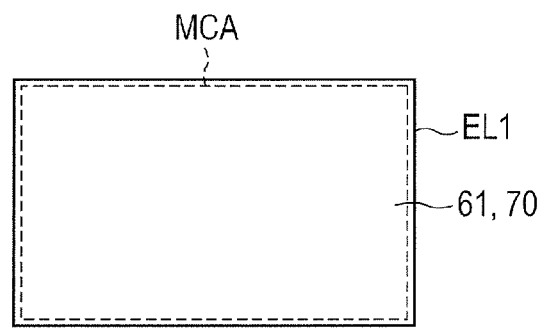

FIG. 44A is a sectional view of a further variation of the first and second embodiments, showing the areas A5 to A8 of the dummy memory array DMA, which is taken in a direction parallel to the bit line BL. FIG. 44B is a sectional view taken along the XLIVB-XLIVB line of FIG. 44A, showing the areas A5 to A8 of the dummy memory array DMA, which is taken in a direction parallel to the digit line DL. FIG. 44C is a plan view showing the structure of each unit memory cell area MCA of the areas A5 to A8 of the dummy memory array DMA. In this variation, as shown in FIGS. 44A to 44C, the tunnel magnetoresistance element layer 66 and upper electrode layer 67 are omitted in the dummy memory area DMA.

In the areas A5 to A8 of the dummy memory array DMA, the bit line layer 70 and digit line layer 61 are not patterned and only the lower electrode layer 65 is patterned. The lower electrode layer 65 is used to form a plurality of lower electrodes EL1. Each lower electrode EL1 and the digit line layer 61 are coupled to each other through a via hole VH1 (not shown) and the digit line layer 61 is grounded. The oxide films 64 and 69 are made of material with a high dielectric constant. In this variation, the bit line layer 70 is coupled to the supply voltage VDD line L1 (FIG. 7) or supply voltage VDD line L2 (FIG. 8). The capacitor between the bit line layer 70 and lower electrode layer 65 is capacitor C1 (FIG. 7) or capacitor C4 (FIG. 8).

Figure 45A:
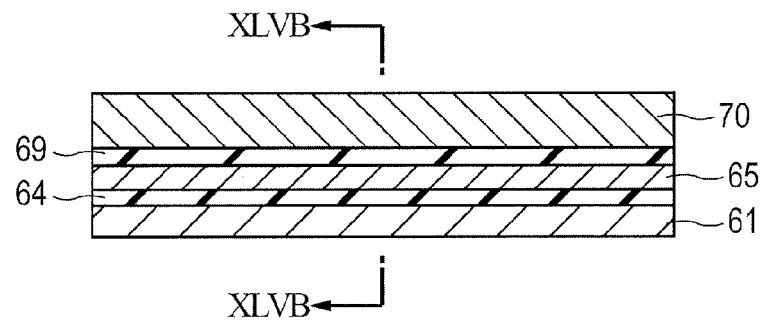
Figure 45B:
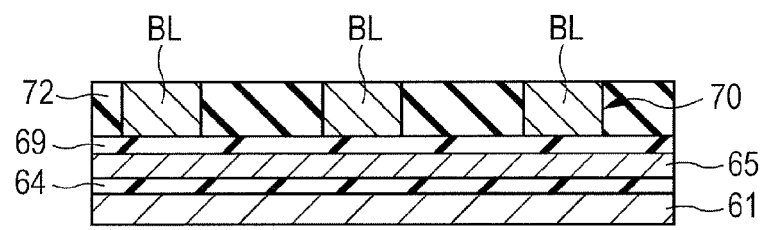
Figure 45C:
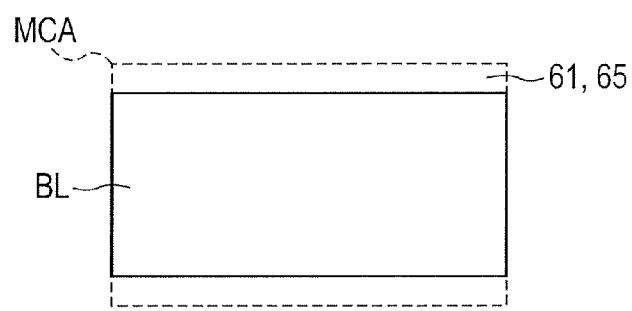

FIG. 45A is a sectional view of a further variation of the first and second embodiments, showing the areas A1, A2, and A5 to A8 of the dummy memory array DMA, which is taken in a direction parallel to the bit line BL. FIG. 45B is a sectional view taken along the XLVB-XLVB line of FIG. 45A, showing the areas A1, A2, and A5 to A8 of the dummy memory array DMA, which is taken in a direction parallel to the digit line DL. FIG. 45C is a plan view showing the structure of each unit memory cell area MCA of the areas A1, A2, and A5 to A8 of the dummy memory array DMA. In this variation, as shown in FIGS. 45A to 45C, the tunnel magnetoresistance element layer 66 and upper electrode layer 67 are omitted in the dummy memory array DMA.

In the areas A1, A2, and A5 to A8 of the dummy memory array DMA, the lower electrode layer 65 and digit line layer 61 are not patterned and only the bit line layer 70 is patterned. The bit line layer 70 is used to form a plurality of bit lines BL. The lower electrode layer 65 and digit line layer 61 are coupled to each other through a plurality of via holes VH1 (not shown) and the digit line layer 61 is grounded. The oxide films 64, 69, and 72 are made of material with a high dielectric constant.

In this variation, the bit lines BL in the areas A5 to A8 are coupled to the supply voltage VDD line L1 (FIG. 7) or supply voltage VDD line L2 (FIG. 8). The capacitor between the bit line layer 70 and lower electrode layer 65 is capacitor C1 (FIG. 7) or capacitor C4 (FIG. 8). The bit lines BL in the areas A1 and A2 are used in the same way as in the first embodiment.

Figure 46A:
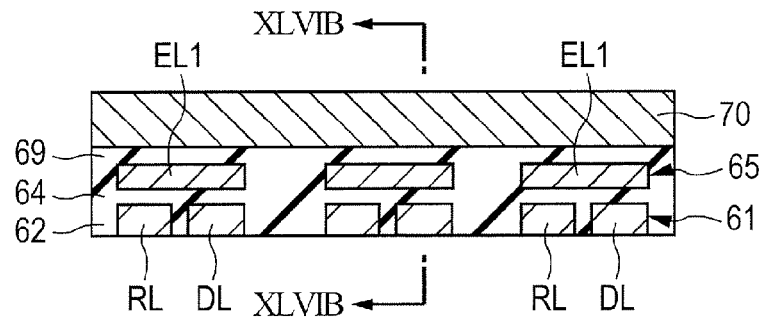
Figure 46B:
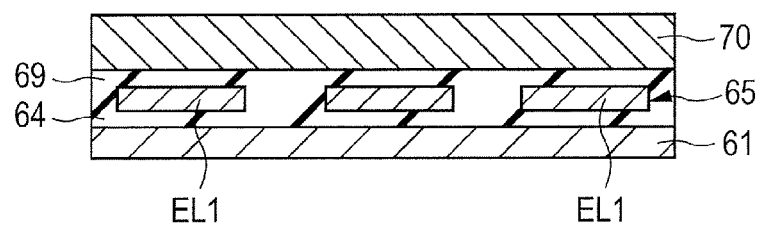
Figure 46C:
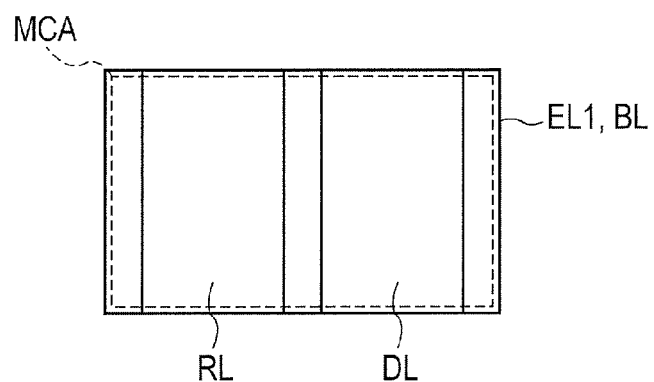

FIG. 46A is a sectional view of a further variation of the first and second embodiments, showing the areas A3 to A8 of the dummy memory array DMA, which is taken in a direction parallel to the bit line BL. FIG. 46B is a sectional view taken along the XLVIB-XLVIB line of FIG. 46A, showing the areas A3 to A8 of the dummy memory array DMA, which is taken in a direction parallel to the digit line DL. FIG. 46C is a plan view showing the structure of each unit memory cell area MCA of the areas A3 to A8 of the dummy memory array DMA. In this variation, as shown in FIGS. 46A to 46C, the tunnel magnetoresistance element layer 66 and upper electrode layer 67 are omitted in the dummy memory area DMA.

In the areas A3 to A8 of the dummy memory array DMA, the bit line layer 70 is not patterned and the lower electrode layer 65 and digit line layer 61 are patterned. The lower electrode layer 65 is used to form a plurality of lower electrodes EL1 and the digit line layer 61 is used to form a plurality of pairs of digit lines DL and reading lines RL. The lower electrode layer 65 and reading lines RL are coupled to each other through via holes VH1 (not shown) and the reading lines RL are grounded. The oxide films 62, 64, and 69 are made of material with a high dielectric constant.

In this variation, the bit line layer 70 in the areas A3 to A8 is coupled to the supply voltage VDD line L1 (FIG. 7) or supply voltage VDD line L2 (FIG. 8). The capacitor between the bit line layer 70 and lower electrode layer 65 is capacitor C1 (FIG. 7) or capacitor C4 (FIG. 8). The digit lines DL are used in the same way as in the first embodiment.

Figure 47A:
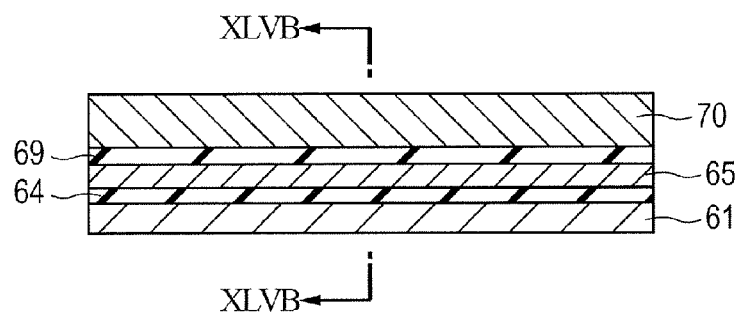
Figure 47B:
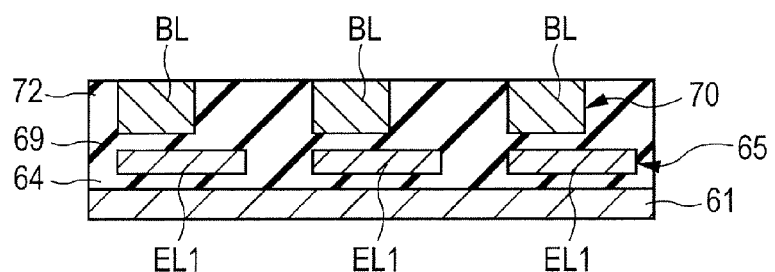
Figure 47C:
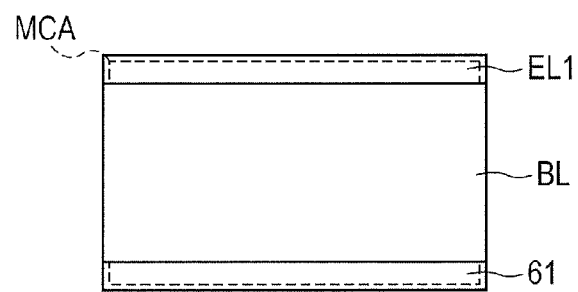

FIG. 47A is a sectional view of a further variation of the first and second embodiments, showing the areas A1, A2, and A5 to A8 of the dummy memory array DMA, which is taken in a direction parallel to the bit line BL. FIG. 47B is a sectional view taken along the XLVB-XLVB line of FIG. 47A, showing the areas A1, A2, and A5 to A8 of the dummy memory array DMA, which is taken in a direction parallel to the digit line DL. FIG. 47C is a plan view showing the structure of each unit memory cell area MCA of the areas A1, A2, and A5 to A8 of the dummy memory array DMA. In this variation, as shown in FIGS. 47A to 47C, the tunnel magnetoresistance element layer 66 and upper electrode layer 67 are omitted in the dummy memory array DMA.

In the areas A1, A2, and A5 to A8 of the dummy memory array DMA, the digit line layer 61 is not patterned and the bit line layer 70 and lower electrode layer 65 are patterned. The bit line layer 70 is used to form a plurality of bit lines BL and the lower electrode layer 65 is used to form a plurality of lower electrodes EL1. The lower electrode layer 65 and digit line layer 61 are coupled to each other through via holes VH1 (not shown) and the digit line layer 61 is grounded. The oxide films 64, 69, and 72 are made of material with a high dielectric constant.

In this variation, the bit lines BL in the areas A5 to A8 are coupled to the supply voltage VDD line L1 (FIG. 7) or supply voltage VDD line L2 (FIG. 8). The capacitor between the bit line layer 70 and lower electrode layer 65 is capacitor C1 (FIG. 7) or capacitor C4 (FIG. 8). The bit lines BL in the areas A1 and A2 are used in the same way as in the first embodiment.

Third Embodiment

Figure 48:
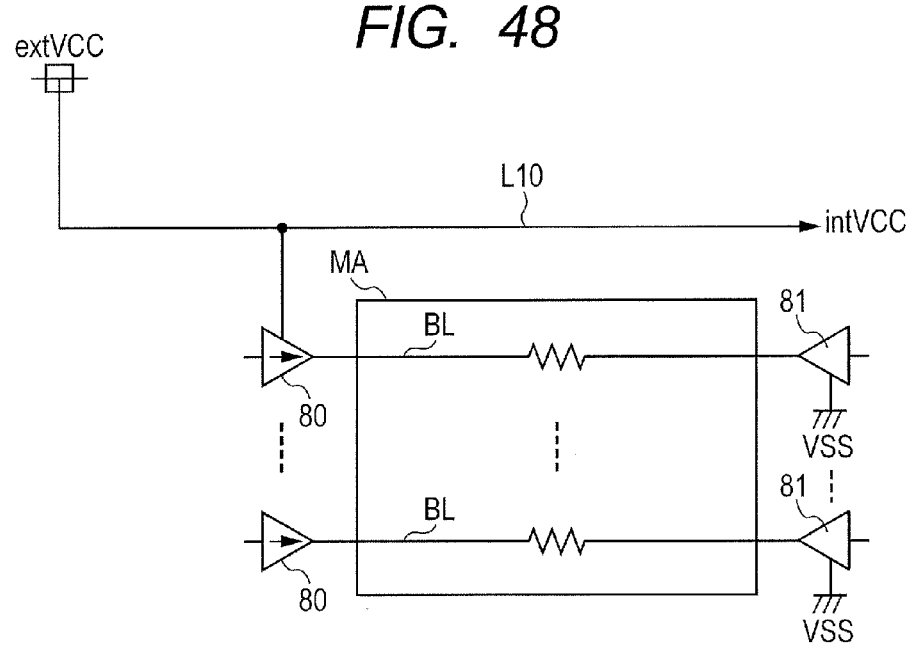
FIG. 48 is a circuit diagram illustrating the problem of an MRAM in the related art.

FIG. 48 is a circuit diagram which illustrates the problem of an MRAM in the related art. Referring to FIG. 48, the MRAM has a memory array MA which includes a plurality of bit lines BL. The bit lines BL are divided into a plurality of (32 in this case) bit line groups each having a prescribed number of bit lines and drivers 80 and 81 are provided for each bit line group. In write operation, one bit line BL is selected from each bit line group and that bit line BL is coupled between the corresponding drivers 80 and 81. FIG. 48 shows that 32 bit lines BL are selected and the selected bit lines BL are coupled between the corresponding drivers 80 and 81 respectively. In each selected bit line BL, current flows in a direction which depends on the logic level of the write data signal. FIG. 48 shows that currents flow in the same direction in the 32 selected bit lines BL.

Each driver 80 receives internal supply voltage intVCC from an internal supply voltage intVCC line L10. The internal supply voltage intVCC line L10 is coupled to an external supply voltage extVCC line (3.3 V). Each driver 81 receives grounding voltage VSS. In write operation, 4.0 mA current flows in each bit line BL and the peak output current of the external power source (not shown) is 128.0 mA (=32×4.0 mA). The problem here is that such current may cause noise.

Figure 49:
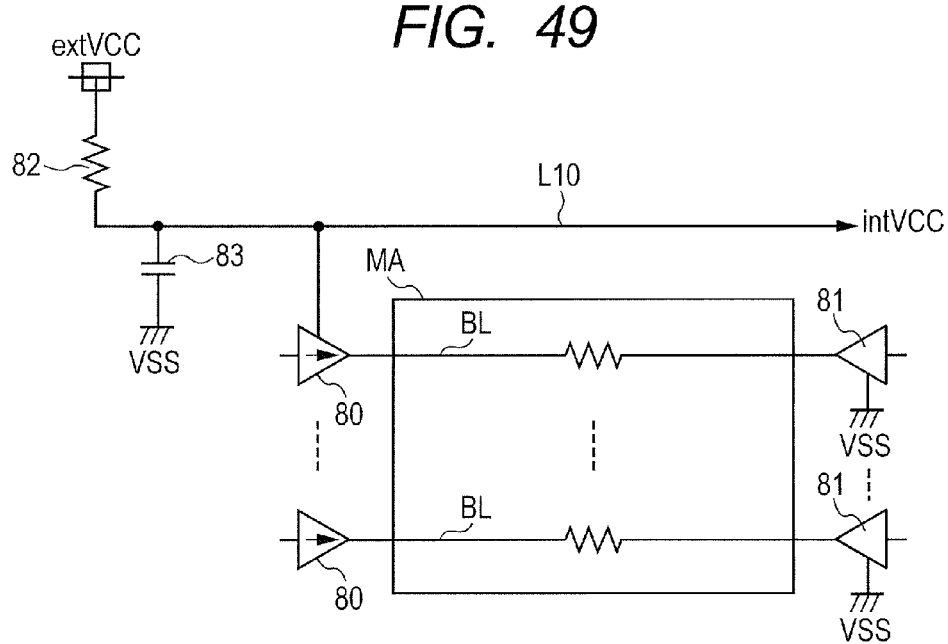
FIG. 49 is a circuit diagram of a key part of an MRAM according to a third embodiment of the present invention.

FIG. 49 is a circuit diagram showing the structure of the MRAM according to the third embodiment which is compared to FIG. 48. In this MRAM, a resistance element 82 is coupled between the external supply voltage extVCC line and the internal supply voltage intVCC line L10 and a capacitor 83 is coupled between the internal supply voltage intVCC line L10 and the grounding voltage VSS line.

As for the MRAM shown in FIG. 49 according to the third embodiment, a simulation was conducted to find the relation among operation speed, capacitance value C (nF) of the capacitor 83, resistance value (Ω) of the resistance element 82, peak current (mA), internal supply voltage intVCC, and peak reduction ratio (5). FIGS. 50A to 50C show the results of the simulation. The simulation was conducted at the following three different operation speeds: 50 MHz (20 ns), 80 MHz (12.5 ns), and 100 MHz (10 ns). For the capacitance value C(nF) of the capacitor 83, three different values, 1, 1.5, and 2, were used. When the capacitance value C(nF) of the capacitor 83 was 1, 1.5, and 2, the area of the capacitor 83 was 0.444, 0.666, and 0.888 (mm$^2$) respectively. For the resistance value (Ω) of the resistance element 82, three different values, 3.5, 5, and 10, were used.

As shown in FIGS. 50A to 50C, when the capacitance value C(µF) of the capacitor 83 is larger, the peak current (mA) is smaller, resulting in a higher peak reduction ratio (%). In order to increase the capacitance value C(nF) of the capacitor 83, the area of the capacitor 83 must be larger. In the present invention, the capacitor 83 is located in the dummy memory array DMA, so the capacitance value of the capacitor 83 can be increased without an increase in chip area.

Also, when the resistance value (Q) of the resistance element 82 is larger, the peak current (mA) is smaller, resulting in a higher peak reduction ratio (%). However, when the resistance value (Q) of the resistance element 82 is larger, the internal supply voltage intVCC is lower. Alternatively, instead of using the resistance element 82, the cross-sectional area of the wiring for supplying the internal supply voltage intVCC may be decreased to increase the wiring resistance. When the operating frequency (MHz) is higher, the peak reduction ratio is lower, but the peak reduction ratio is still high even at 100 MHz.

The invention made by the present inventors has been so far concretely explained in reference to preferred embodiments thereof. However, the invention is not limited to the above embodiments and it is obvious that these details may be modified in various ways without departing from the spirit and scope of the invention.

What is claimed is:

1. A semiconductor device comprising:
a memory mat formed on a semiconductor substrate surface, a central area of the memory mat being used as a memory array for storing information and a peripheral area of the memory mat around the memory array being used as a dummy memory array,
the memory array comprising:
a plurality of magnetoresistance elements disposed in a plurality of rows and a plurality of columns, each storing a data signal according to level change of a resistance value;
a plurality of digit lines located in a way to correspond to the rows respectively;
a plurality of bit lines located in a way to correspond to the columns respectively; and
a write circuit which is driven by a supply voltage and supplies an activation current to a digit line corresponding to a selected magnetoresistance element among the magnetoresistance elements and supplies a write current to a bit line corresponding to the selected magnetoresistance element to write a data signal in the selected magnetoresistance element, and
the dummy memory array comprising:
a capacitor coupled between each digit line, each bit line or a line of the supply voltage and a reference voltage line, wherein:
the memory mat includes a digit line layer, a lower electrode layer, a magnetoresistance element layer, an upper electrode layer, and a bit line layer which are formed over the semiconductor substrate surface sequentially;
the magnetoresistance elements are formed using the magnetoresistance element layer;
the digit lines are formed using the digit line layer;
the bit lines are formed using the bit line layer;
the memory array further includes a plurality of lower electrodes formed using the lower electrode layer and located in a way to correspond to the magnetoresistance elements respectively and a plurality of upper electrodes formed using the upper electrode layer and located in a way to correspond to the magnetoresistance elements respectively;
each magnetoresistance element is formed between a corresponding upper electrode and a corresponding lower electrode; and
the capacitor is formed using the digit line layer or the bit line layer and at least one layer among the lower electrode layer, the magnetoresistance element layer, and the upper electrode layer.

2. The semiconductor device according to claim 1,
wherein the bit lines extend to the dummy memory array; and
wherein the capacitor is formed between each bit line and at least one of the upper electrode layer and the lower electrode layer.

3. The semiconductor device according to claim 2,
wherein in the dummy memory array the magnetoresistance element layer and the upper electrode layer are not patterned, and
wherein the capacitor is formed between each bit line and the upper electrode layer.

4. The semiconductor device according to claim 2,
wherein in the dummy memory array the magnetoresistance element layer and the upper electrode layer are patterned, and
wherein the capacitor is formed between each bit line and the upper electrode layer and between each bit line and the lower electrode layer.

5. The semiconductor device according to claim 2,
wherein in the dummy memory array the magnetoresistance element layer and the upper electrode layer are omitted, and
wherein the capacitor is formed between each bit line and the lower electrode layer.

6. The semiconductor device according to claim 1,
wherein the dummy memory array includes a dummy bit line formed using the bit line layer and located parallel to the bit lines, and
wherein the capacitor is formed between the dummy bit line and at least one of the upper electrode layer and the lower electrode layer and coupled between the supply voltage line and the reference voltage line.

7. The semiconductor device according to claim 6,
wherein in the dummy memory array the magnetoresistance element layer and the upper electrode layer are not patterned, and
wherein the capacitor is formed between the dummy bit line and the upper electrode layer.

8. The semiconductor device according to claim 6,
wherein in the dummy memory array the magnetoresistance element layer and the upper electrode layer are patterned, and
wherein the capacitor is formed between the dummy bit line and the upper electrode layer and between the dummy bit line and the lower electrode layer.

9. The semiconductor device according to claim 6,
wherein in the dummy memory array the magnetoresistance element layer and the upper electrode layer are omitted, and
wherein the capacitor is formed between the dummy bit line and the lower electrode layer.

10. The semiconductor device according to claim 1,
wherein the digit lines extend to the dummy memory array;
wherein the capacitor is formed between each digit line and the lower electrode layer, and
wherein the lower electrode layer is coupled to the reference voltage line.

11. The semiconductor device according to claim 1,
wherein the dummy memory array includes a dummy digit line formed using the digit line layer and located parallel to the digit lines, and wherein the capacitor is formed between the dummy digit line and the lower electrode layer and coupled between the supply voltage line and the reference voltage line.

12. The semiconductor device according to claim 1, wherein a lower face of the bit line layer and an upper face of the upper electrode layer are in contact with each other, and
wherein the capacitor is formed between the digit line layer and the lower electrode layer.

13. The semiconductor device according to claim 12, wherein the digit lines extend to the dummy memory array;
wherein the capacitor is formed between each digit line and the lower electrode layer, and
wherein the lower electrode layer is coupled to the reference voltage line.

14. The semiconductor device according to claim 12, wherein the dummy memory array includes a dummy digit line formed using the digit line layer and located parallel to the digit lines, and
wherein the capacitor is formed between the dummy digit line and the lower electrode layer and coupled between the supply voltage line and the reference voltage line.

15. The semiconductor device according to claim 1, wherein an oxide film with a high dielectric constant is formed between the bit line layer and at least one of the upper electrode layer and the lower electrode layer.

16. The semiconductor device according to claim 1, wherein an oxide film with a high dielectric constant is formed between the digit line layer and the lower electrode layer.

17. The semiconductor device according to claim 1, wherein the capacitor decreases a peak value of the activation current, the write current, or a current flowing in the supply voltage line.

* * * * *